United States Patent
Thirumalai et al.

(10) Patent No.: US 10,984,859 B2
(45) Date of Patent: Apr. 20, 2021

(54) RESISTIVE MEMORY DEVICES BASED ON METAL COORDINATED REDOX ACTIVE LIGANDS

(71) Applicant: AZOMETRIX, Washington, DC (US)

(72) Inventors: Venkatesan Thirumalai, Singapore (SG); Sreetosh Goswami, Singapore (SG); Abhijeet Patra, Singapore (SG); Sreebrata Goswami, Kolkata (IN)

(73) Assignee: Azometrix, Washington, DC (US)

( * ) Notice: Subject to any disclaimer, the term of this patent is extended or adjusted under 35 U.S.C. 154(b) by 0 days.

(21) Appl. No.: 16/651,660

(22) PCT Filed: Oct. 1, 2018

(86) PCT No.: PCT/SG2018/050497
§ 371 (c)(1),
(2) Date: Mar. 27, 2020

(87) PCT Pub. No.: WO2019/066729
PCT Pub. Date: Apr. 4, 2019

(65) Prior Publication Data
US 2020/0312407 A1    Oct. 1, 2020

(30) Foreign Application Priority Data
Sep. 29, 2017 (IN) .............................. 201711034791

(51) Int. Cl.
*G11C 11/00* (2006.01)
*G11C 13/00* (2006.01)
*C07F 15/00* (2006.01)
*H01L 45/00* (2006.01)
*H01L 51/00* (2006.01)
*H01L 51/05* (2006.01)

(52) U.S. Cl.
CPC ...... *G11C 13/0014* (2013.01); *C07F 15/0053* (2013.01); *G11C 13/0069* (2013.01); *H01L 45/1253* (2013.01); *H01L 45/1608* (2013.01); *H01L 51/0086* (2013.01); *H01L 51/0595* (2013.01); *G11C 2013/0073* (2013.01); *G11C 2213/15* (2013.01)

(58) Field of Classification Search
CPC ............ G11C 13/0014; G11C 13/0069; G11C 2013/0073; G11C 2213/13
See application file for complete search history.

(56) References Cited

U.S. PATENT DOCUMENTS

| | | | |
|---|---|---|---|
| 8,982,604 B2* | 3/2015 | Lee ................... | G11C 13/0004 365/148 |
| 9,240,550 B2* | 1/2016 | Dellmann ............. | H01L 45/145 |
| 2020/0194669 A1* | 6/2020 | Jang ................... | H01L 45/1608 |

* cited by examiner

Primary Examiner — Pho M Luu
(74) Attorney, Agent, or Firm — Rosenberg, Klein & Lee

(57) ABSTRACT

Disclosed herein is a compound of formula (I):

$$[M(L)_n]^{m+}(A^{y-})_z \quad (I)$$

where A, M, L, n, m, y and z are as defined herein, which can be used in the formation of a resistive memory device. Also disclosed herein are methods of manufacturing such devices and their uses.

17 Claims, 22 Drawing Sheets

Planar devices

Au NDs device

RESISTIVE MEMORY DEVICES BASED ON METAL COORDINATED REDOX ACTIVE LIGANDS

FIELD OF INVENTION

This invention relates to resistive memory devices based on the low potential redox-states of metal complex of redox active ligands, such as azo-aromatics. Said devices consume ultra-low energy, are easy-to-fabricate via solution processing and they are robust, durable and are ambient-atmosphere stable.

BACKGROUND

The listing or discussion of a prior-published document in this specification should not necessarily be taken as an acknowledgement that the document is part of the state of the art or is common general knowledge.

Resistive memory devices can be broadly defined as electrical switches that retain a state of internal resistance based on the history of applied voltage. Such devices hold several performance characteristics that can potentially exceed conventional integrated circuit technology and are projected to be the building blocks of the next generation of computing architectures such as neuromorphic computing.

A wide range of materials have been explored as active components of resistive memory devices, including inorganic oxides, 2D materials, polymers, and various molecular systems. Oxide devices are currently the most promising candidates for commercial application, but these devices currently require a high forming voltage/current and large set/reset voltage, which limits their ability to provide high density memory. Organic devices are of interest because of their solution-processability (leading to cheap manufacturing) and chemically tunable functionalities. In fact, some of the organic devices have made inroads into display technologies (OLED based) and a few others seem attractive for emerging applications like flexible electronics. However, when compared to the enormous research effort spent, the overall translation of organic devices in to commercial products has been poor. The problems arise from insufficient reproducibility, endurance, stability, scalability and low switching speed. To address the issue of reproducibility, systematic statistical analysis of device characteristics is essential, but these rare for organic resistive memory devices. Furthermore, most devices show endurances of <$10^3$ cycles and stability of a few hours, which is lower by orders of magnitude than commercial flash memories (endurance ~$10^6$ cycles, stability~years) and as a result are insufficient for any real-world application.

Additionally, because of the inherent structural complexities of the molecules in such systems, the understanding of the switching mechanism tends to be poor, rendering further device optimization difficult. In most devices, switching behaviour is attributed to field-driven polarization, structural changes (e.g. cis-trans isomerisation) or redox transitions, but such assignments lack direct evidence. Singling out the primary driving mechanism from several possibilities is a challenge and requires in-situ molecular characterization which has so far been scant for organic devices. In contrast, such in-situ characterization techniques have been established for a number of oxide systems, which may have enabled their development into commercial products.

SUMMARY OF INVENTION

Aspects and embodiments of the current invention are provided below in the following numbered clauses.

1. A compound of formula (I):

wherein:
M represents Ru, Fe, Co, Rh, Ir, Ni, Os, Cr, Cu, Mn;
A represents an anionic group having a charge y, where y represents from 1 to 4;
m represents from 1 to 4;
n represents from 2 to 6;
z represents from 1 to 4; and
L is a ligand selected from the ligand of formula (II) or one or more of the group consisting of ligands of formula (III) to (VII):

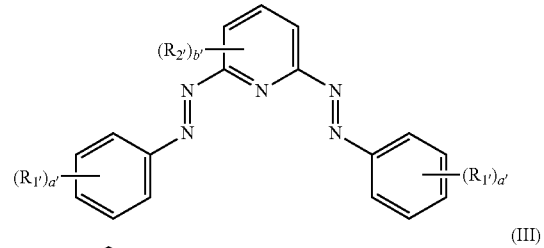

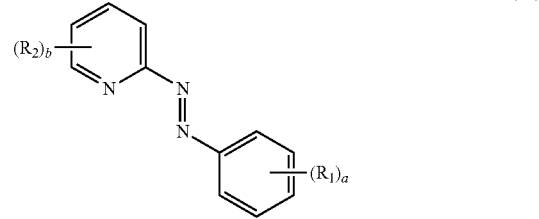

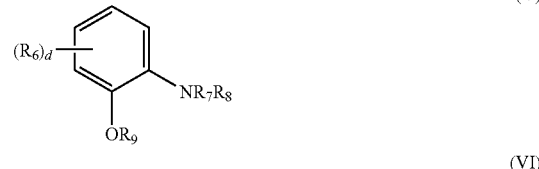

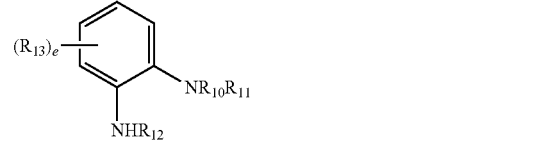

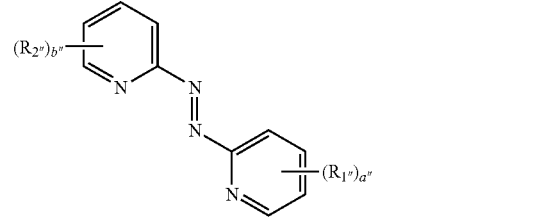

where:
when L is the ligand (II), n is 2 and when L is one or more of the group selected from (III) to (VII), n is 3;

a and a' each independently represent from 0 to 5;

a", b" and b to e each independently represent from 0 to 4;

b' represents from 0 to 3;

$R_1$ to $R_3$, $R_{1'}$, $R_{2'}$, $R_{1''}$, $R_{2''}$, $R_6$ and $R_{13}$ each independently represent, at each occurrence thereof, cycloalkyl, heterocycloalkyl, aryl, heteroaryl, aralkyl, $NR_{14}R_{15}$, $C(O)NR_{16}R_{17}$, $NR_{18}C(O)R_{19}$, $C(O)OR_{20}$, $OR_{21}$, $C(O)OH$, OH, halo, $NO_2$, CN, alkyl, alkenyl, alkynyl (which latter three groups are unsubstituted or substituted by one or more substituents selected from OH, SH, $C(O)OR_{22}$, or $NR_{23}R_{24}$), or, when present, any two instances of $R_1$ to $R_3$, $R_{1'}$, $R_{2'}$, $R_6$ and $R_{13}$ together with the carbon atoms to which they are attached from a 5-12 membered cycloalkyl ring system, a 5-14 membered heterocycloalkyl ring system, a 6-10 membered aryl ring or a 5-14 membered heteroaryl ring system; and $R_4$, $R_5$ and $R_7$ to $R_{12}$ each independently represent, at each occurrence thereof, H, alkyl, alkenyl, alkynyl, cycloalkyl, heterocycloalkyl, aryl, heteroaryl, aralkyl, or $C(O)NR_{25}R_{26}$;

$R_{14}$ to $R_{26}$ each independently represent alkyl, alkenyl, alkynyl, cycloalkyl, aryl, heteroaryl, or aralkyl, provided that when M is Ir, Cr or Rh, L does not represent a ligand of formula (III).

2. The compound of Clause 1, wherein L is the ligand of formula (II) or the ligand of formula (III).

3. The compound of Clause 1 or Clause 2, wherein $R_1$ to $R_3$, $R_{1'}$, $R_{2'}$, $R_{1''}$, $R_{2''}$, $R_6$ and $R_{13}$ each independently represent, at each occurrence thereof, cycloalkyl, heterocycloalkyl, aryl, heteroaryl, aralkyl, $NR_{14}R_{15}$, $C(O)NR_{16}R_{17}$, $NR_{18}C(O)R_{19}$, $C(O)OR_{20}$, $OR_{21}$, $C(O)OH$, OH, halo, $NO_2$, CN, alkyl, alkenyl, alkynyl (which latter three groups are unsubstituted or substituted by one or more substituents selected from OH, SH, $C(O)OR_{22}$, or $NR_{23}R_{24}$), or, when present, any two instances of $R_1$ to $R_3$, $R_{1'}$, $R_{2'}$, $R_{1''}$, $R_{2''}$, $R_6$ and $R_{13}$ together with the carbon atoms to which they are attached from a 5-7 membered cycloalkyl ring system, a 5-6 membered heterocycloalkyl ring system, a 6 membered aryl ring or a 5-6 membered heteroaryl ring system; and 4. The compound of Clause 3, wherein $R_1$, $R_2$, $R_{1'}$, and $R_{2'}$, each independently represent, at each occurrence thereof, alkyl, cycloalkyl, aryl, heteroaryl, $NR_{14}R_{15}$, $OR_{21}$, C(O) OH, OH, halo, $NO_2$, or CN, optionally wherein $R_1$, $R_2$, $R_{1'}$, and $R_{2'}$, each independently represent, at each occurrence thereof, alkyl, halo, $NO_2$, or CN (e.g. alkyl or halo).

5. The compound of any one of the preceding clauses, wherein:

$R_4$, $R_5$ and $R_7$ to $R_{12}$ each independently represent, at each occurrence thereof, H or alkyl; and/or $R_{14}$ to $R_{26}$ each independently represent alkyl.

6. The compound of any one of the preceding clauses, wherein ($A^{y-}$) represents one or more anions selected from the group consisting of $BF_4^-$, $ClO_4^-$, $PF_6^-$, $CF_3SO_3^-$, $BPh_4^-$, $Cl^-$, $Br^-$, and $F^-$.

7. The compound of any one of Clauses 2 to 6, wherein a and a' are 1, and b and b' are 0, optionally wherein $R_1$ and $R_{1'}$ are independently alkyl or halo.

8. The compound of one of the preceding clauses, wherein L is selected from a ligand of formula (II') or formula (III'):

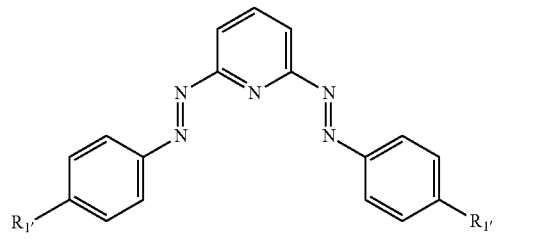

(II')

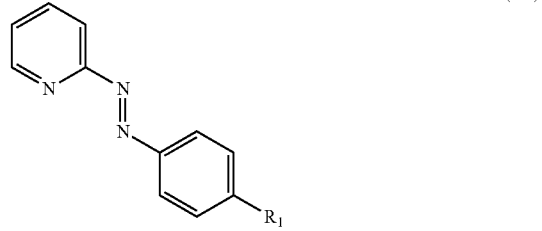

(III')

wherein $R_1$ and $R_{1'}$ are selected from H, alkyl or halo.

9. The compound of one of the preceding clauses, wherein L is selected from the group consisting of:

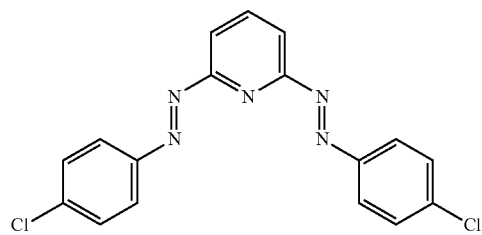

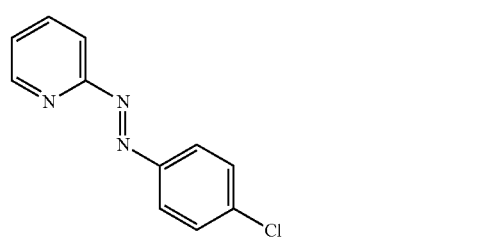

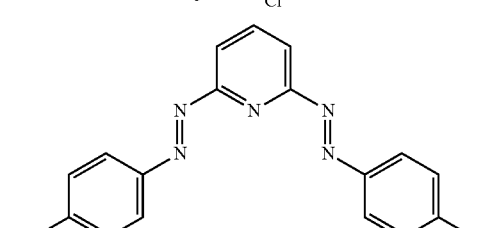

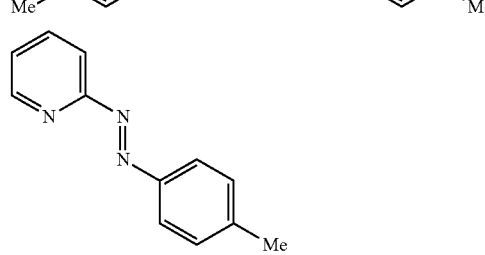

-continued

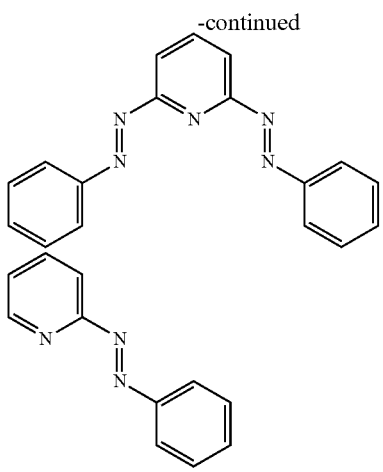

10. The compound of one of the preceding clauses, wherein M represents Ru, Fe, Co, Ni, Os, optionally wherein M represents Ru; and/or ($A^{y-}$) represents ($BF_4^-$) or ($PF_6^-$) (e.g. ($PF_6^-$)).
11. A resistive memory device comprising:
    a substrate material having a surface; and
    a compound of formula (I) as described in any one of Clauses 1 to 10 coated onto the at least a portion of the surface of the substrate material in the form of a film having a first surface and a second surface.
12. The device of Clause 11, wherein the substrate material is YSZ.
13. The device of Clause 11 or Clause 12, wherein the device further comprises a first and second electrode, where the first electrode is sandwiched between the surface of the substrate and the first surface of the film of the compound of formula (I), and the second electrode is in direct contact with the second surface of the film of the compound of formula (I).
14. The device of Clause 13, wherein the first electrode is ITO and/or the second electrode is gold or ITO (e.g. gold).
15. The device of Clause 14, wherein gold nanoparticles are deposited onto one of the first electrode and the film of the compound of formula (I).
16. The device of Clause 14 or Clause 15, wherein gold nanoparticles are deposited onto both of the first electrode and the film of the compound of formula (I), or are deposited therebetween.
17. A method of manufacturing a resistive memory device as described in any one of Clauses 11 to 16, the method comprising the step of spin coating a solution comprising a solvent and a compound of formula (I), as described in any one of Clauses 1 to 10, onto a substrate material.

5V, $V_{read-on/off}$=2V (acronyms: W=Write; R1, R2=Read; and E=Erase); (b) the endurance of Device A over $10^{12}$ cycles probed with the respective pulse pattern shown in (a). Millisecond pulses are used for planar devices and are measured over 230 days; and (c) stability of on and off currents measured on Device A. Twin devices (Device A and B) were fabricated on the same chip, in which one device was put in on-state, with the other one in off-state. Both devices were measured simultaneously with constant application of read voltage (+2V for Device A, +0.2V for Device B) at 350K.

Figure 17:
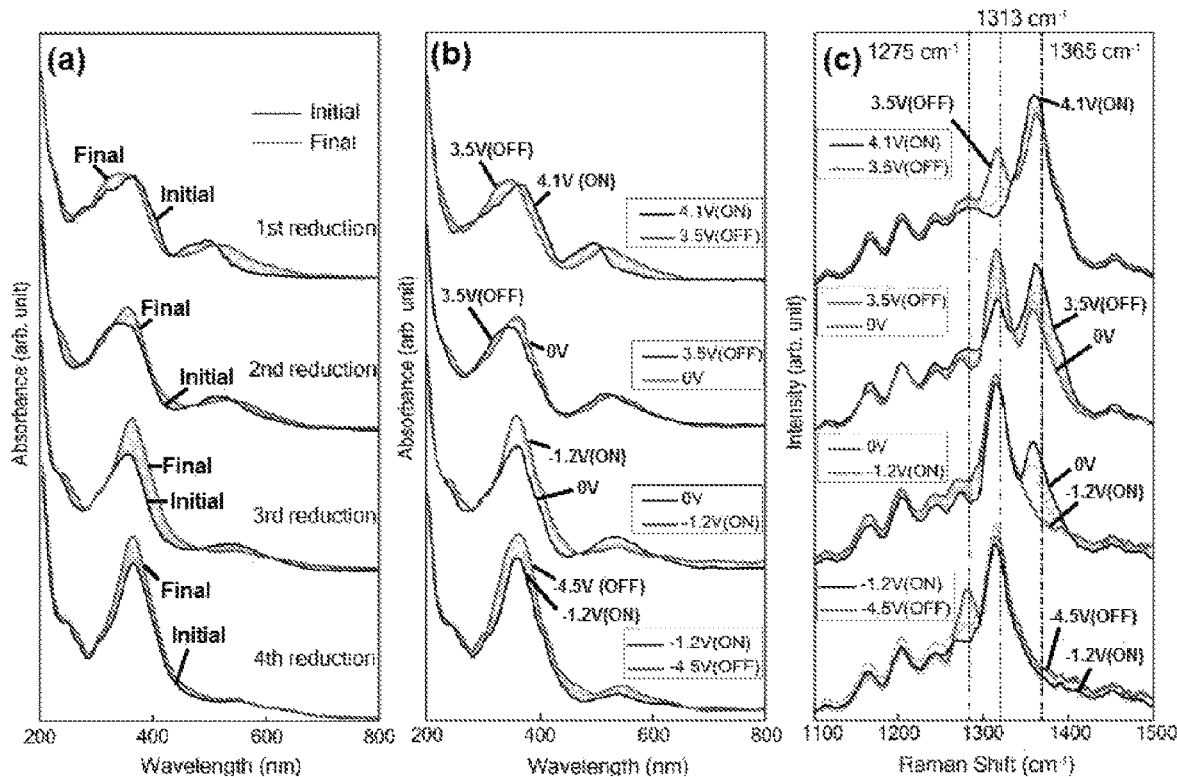

FIG. 17 Depicts the detection of redox states of Device A by in situ spectroscopy: (a) spectroelectrochemical (UV-Vis spectroscopy coupled to CV) data for the first four (4) redox states; (b) UV-Vis spectra measured for thin film devices at indicated values of applied bias. The film spectra are matched with the spectroelectrochemical spectrum with which it best agrees; and (c) Raman spectra measured for thin film devices at indicated values of applied bias (same values as (b)). The spectra were shown for the range of 1100 $cm^{-1}$ to 1500 $cm^{-1}$ since this range includes the region of interest for capturing the dynamics of the peaks at 1365 $cm^{-1}$, 1313 $cm^{-1}$ and 1275 $cm^{-1}$ (representing the azo-vibrational modes in unreduced, singly-reduced and doubly-reduced states respectively). Other peaks show relatively insignificant sensitivity to applied bias.

Figure 18:
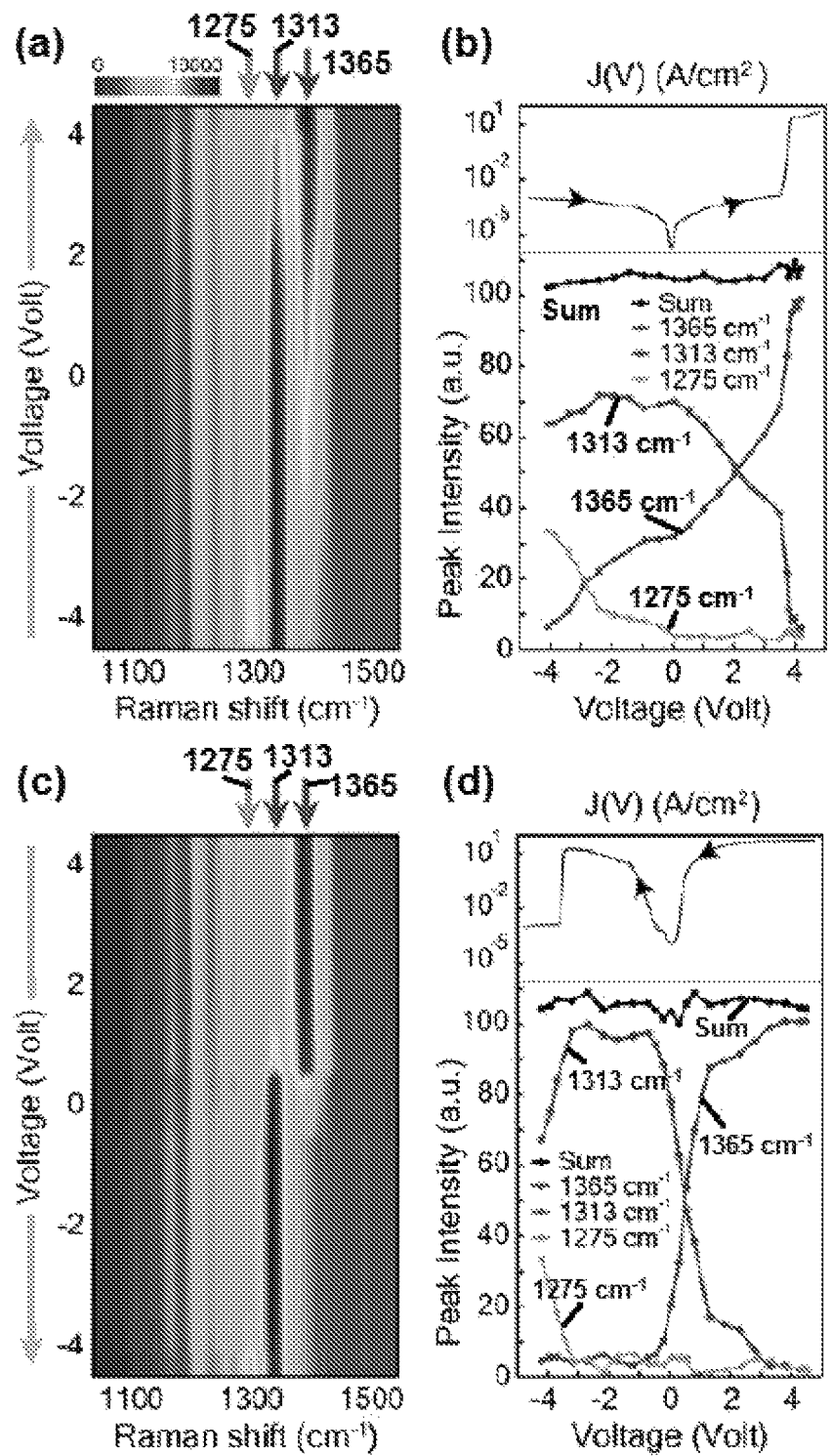

FIG. 18 Depicts the correlation between Raman peaks and film conductance of Device A: (a) pseudo colour plot of voltage-resolved Raman spectra measured for Device A for forward voltage sweep (voltage sweep from −4.2V to +4.2V); (b) the top panel shows the J(V) response for forward voltage sweep, while the bottom panel shows the extracted values of intensity of the Raman peaks at 1365 $cm^{-1}$, 1313 $cm^{-1}$ and 1275 $cm^{-1}$ for individual applied biases during forward voltage sweep; (c) pseudo color plot of voltage-resolved Raman spectra measured for Device A during reverse voltage sweep (voltage sweep from +4.2V to −4.2V); and (d) the top panel shows the J(V) response of Device A for reverse voltage sweep, while the bottom panel shows the extracted values of intensity of the Raman peaks at 1365 $cm^{-1}$, 1313 $cm^{-1}$ and 1275 $cm^{-1}$ for individual applied biases during reverse voltage sweep.

Figure 19:
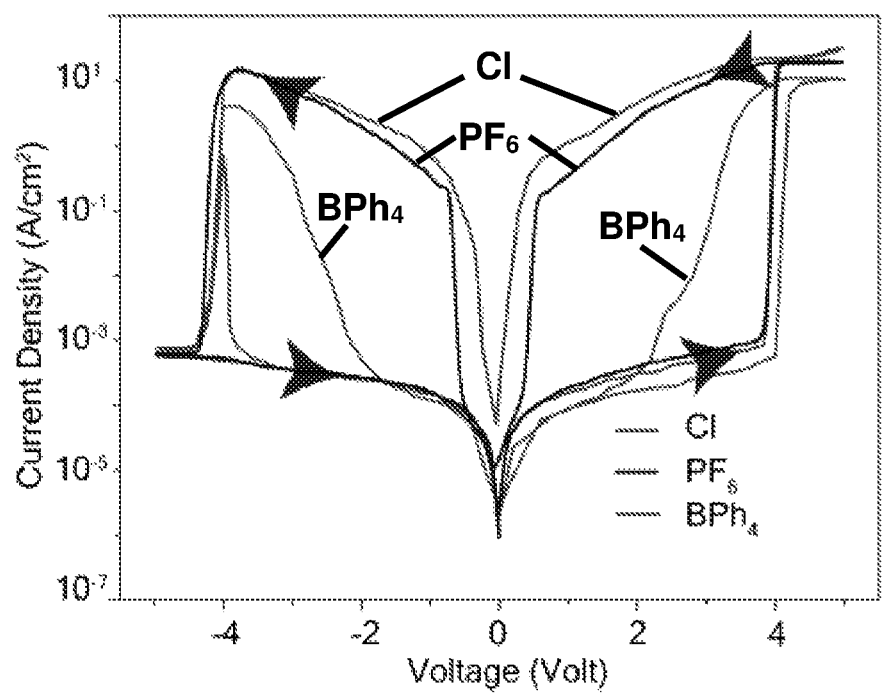

FIG. 19 Depicts the J(V) characteristics of the devices fabricated using different counterions for Device A.

Figure 20:
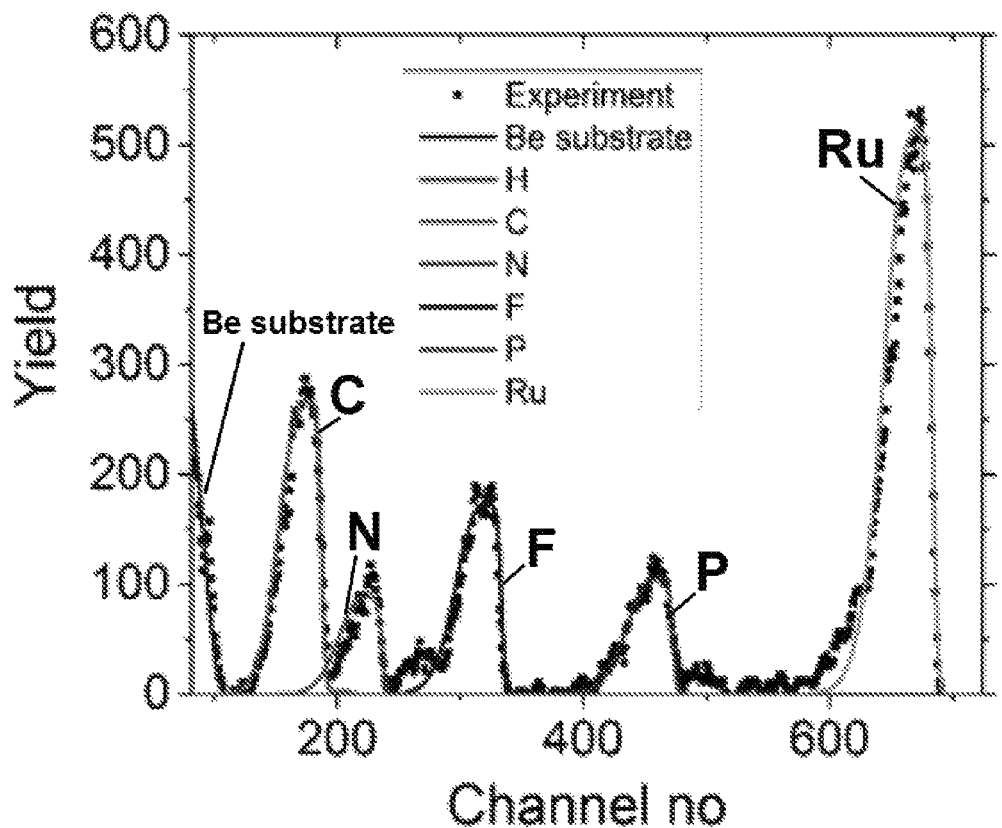

FIG. 20 Depicts the Rutherford Back Scattering (RBS) spectrum of the $[Ru(L^1)_3](PF_6)_2$ film.

Figure 21:
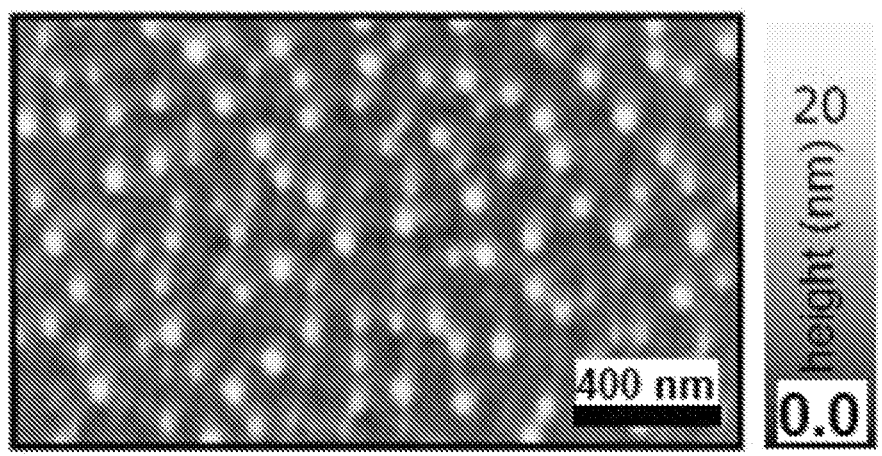

FIG. 21 Depicts the AFM image of the topography of a planar ITO bottom electrode of Device B covered with sputtered gold nanoparticles.

Figure 22:
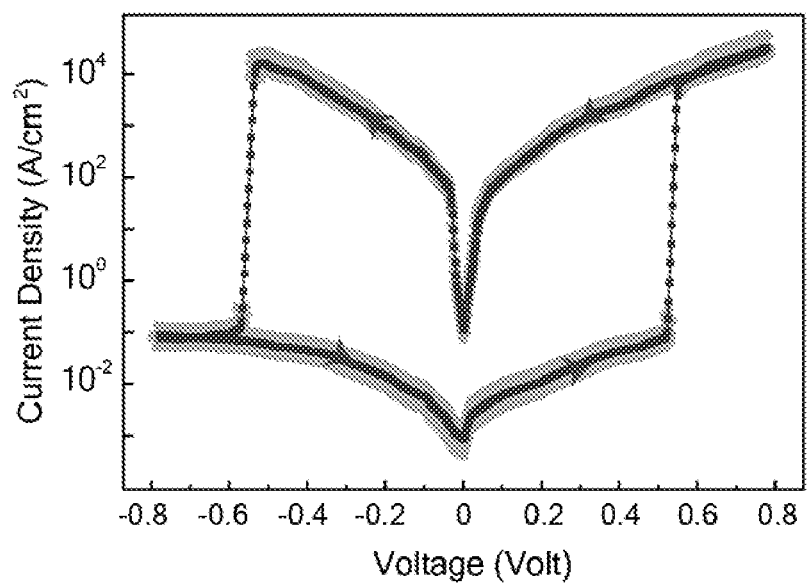

FIG. 22 Depicts the current-voltage characteristics, J(V), for 50 devices (Device B) with gold nanoparticles electrodes. The clouds contain the J values of all devices while the solid lines indicate the mean values of J at each point. There is a low-current plateau near 0 V but the devices remain in the on-state.

Figure 23:
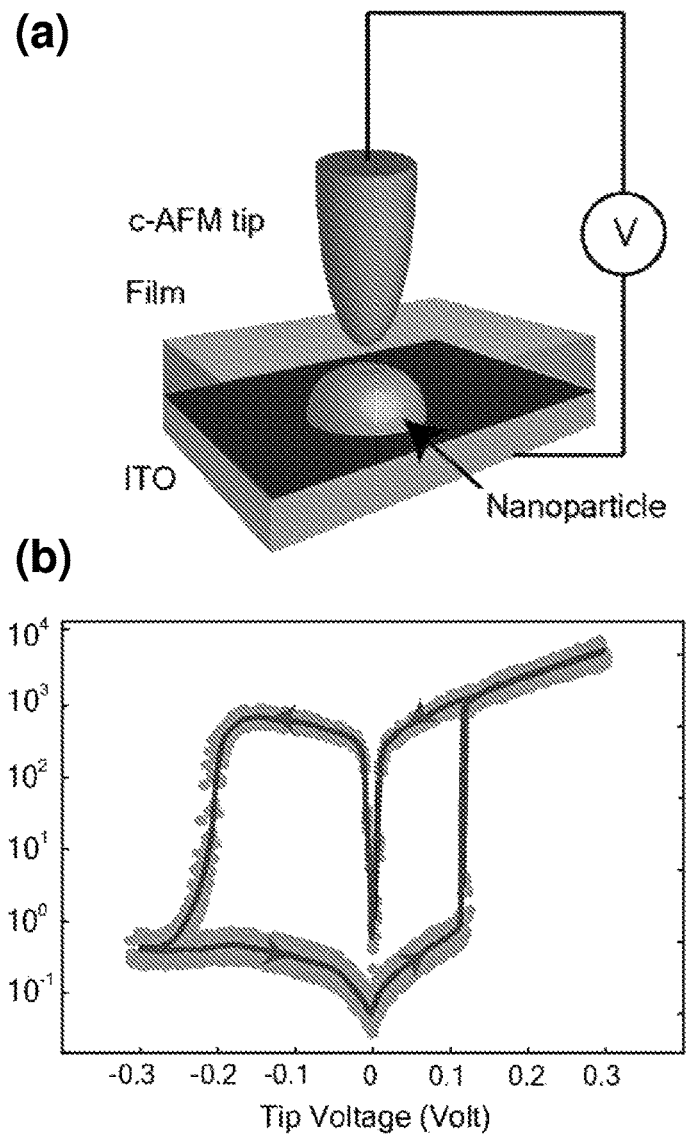

FIG. 23 Depicts (a) the setup of a device structure where a c-AFM tip was used as a top electrode; and (b) the current I and J(V) measured with the device structure in (a). The cloud shows data from 50 different measurements performed at five different locations.

Figure 24:
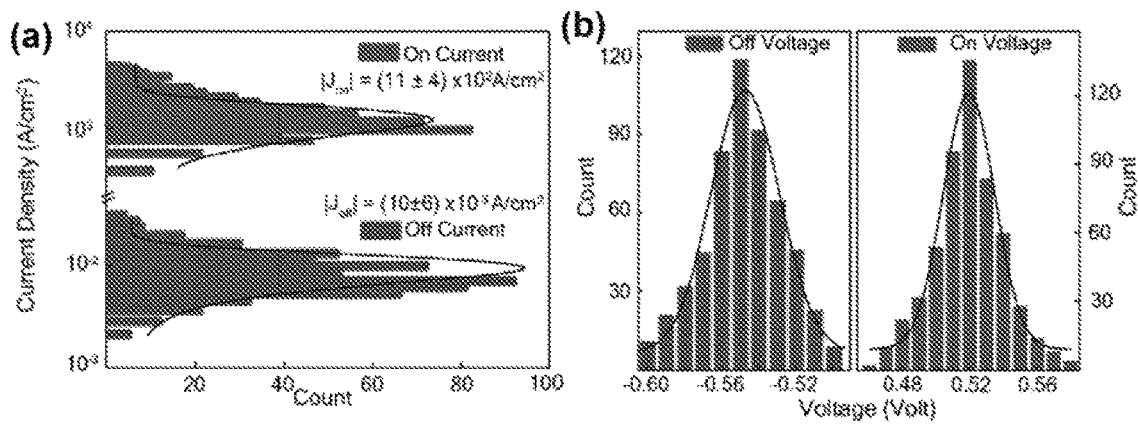

FIG. 24 Depicts the device statistics of Device B: (a) histograms of the current measured at +0.3 V in on and off states for 50 samples of Device B (10 measurements for each sample); and (b) distribution of on and off voltages of Device B. The black lines are Gaussian fits to the histograms.

Figure 25:
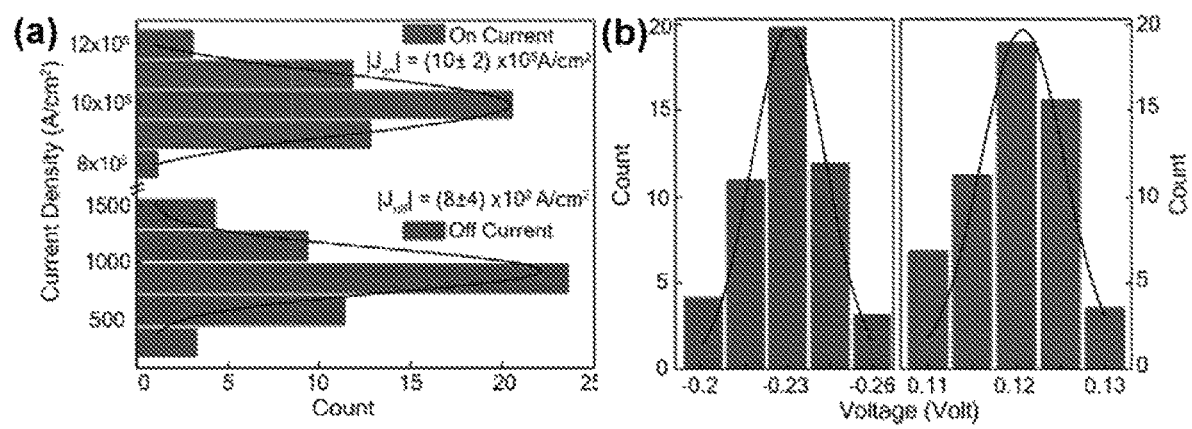

FIG. 25 Depicts the device statistics of the c-AFM device: (a) histograms of the current measured at +0.05 V in on and off states for 50 different J(V) of the c-AFM device (in FIG. 23a); and (b) distribution of on and off voltages of the c-AFM device. The black lines are Gaussian fits to the histograms.

Figure 26:
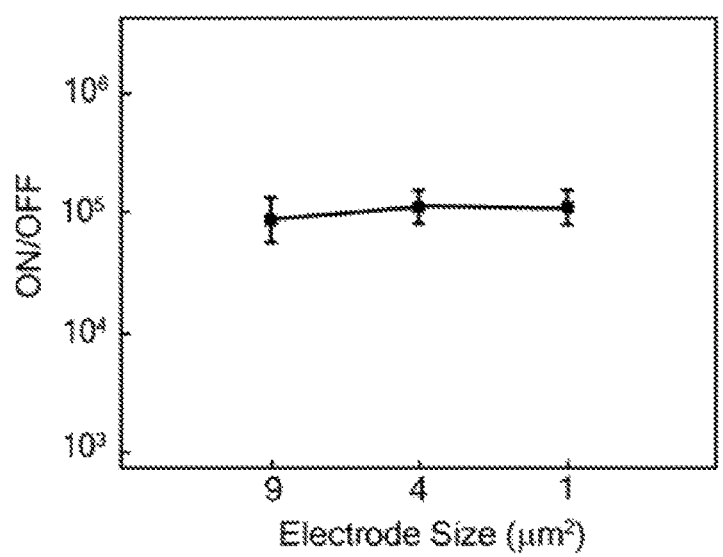

FIG. 26 Depicts the on/off ratio of Device B with different top electrode dimensions. The error bars indicate the standard deviations.

Figure 27:
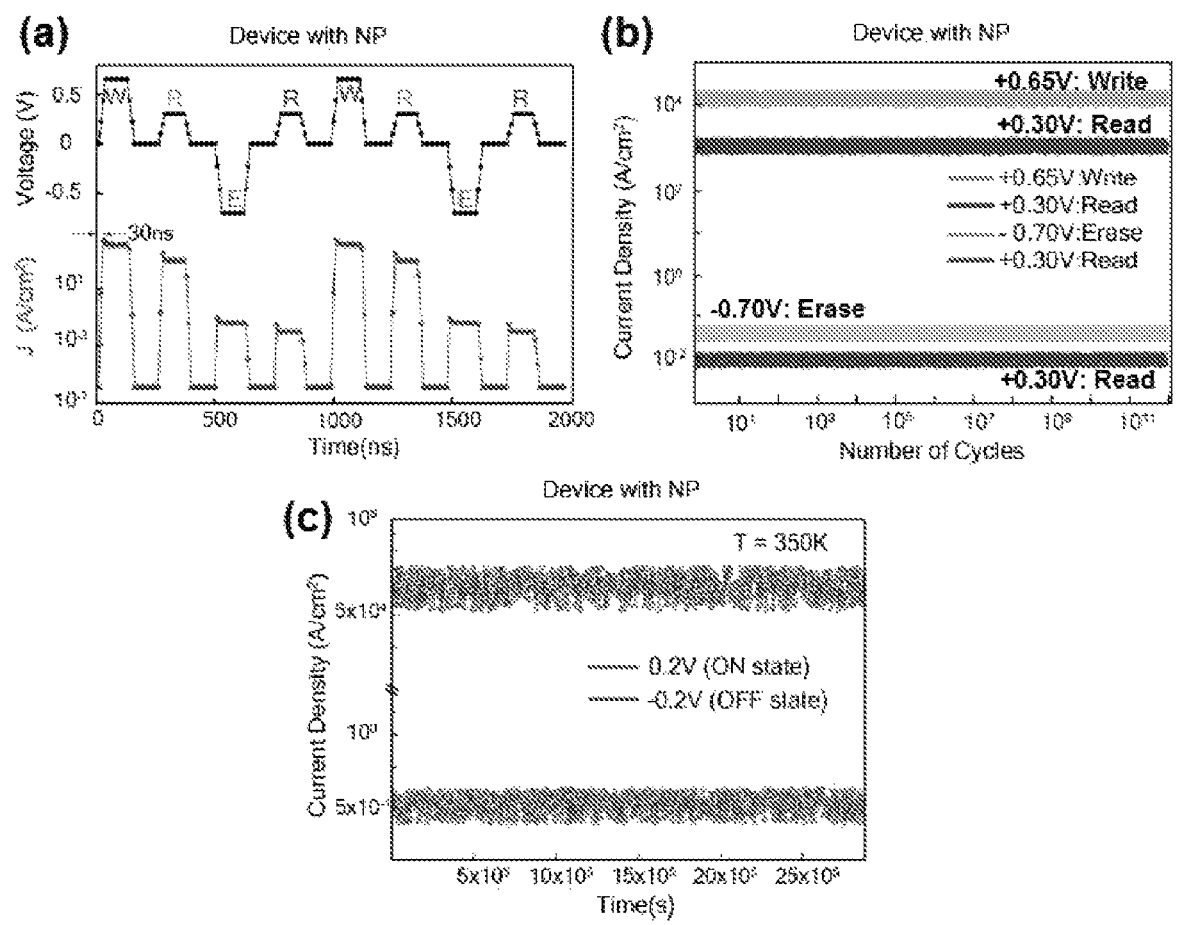

FIG. 27 Depicts the device performance of Device B: (a) read-write pulse sequence for Device B. $V_{write-on}$=0.65 V, $V_{reset-off}$=−0.7 V, $V_{read-on/off}$=0.3 V (acronyms: W=Write; R1, R2=Read; and E=Erase). The switching time was estimated to be less than 30 ns (the size of the device used for this measurement was 3 μm×3 μm for which the off state resistance was about 900 MΩ. This resistance value might look too high for devices where off-state current assists the filament formation but this is irrelevant for the current device. In the current device, the electrostatic conditions drive the switching and despite a high off-state resistance, a switching time as low as 30 ns was observed; (b) the endurance of Device B over 1012 cycles probed with the respective pulse pattern shown in (a). Device-B was driven with ~100 ns pulses over the period of about 2 days; (c) stability of on and off currents measured on Device A. Twin devices (Device A and B) were fabricated on the same chip, in which one device was put in on-state, with the other one in off-state. Both devices were measured simultaneously with constant application of read voltage (+2V for Device A, +0.2V for Device B) at 350K.

Figure 28:
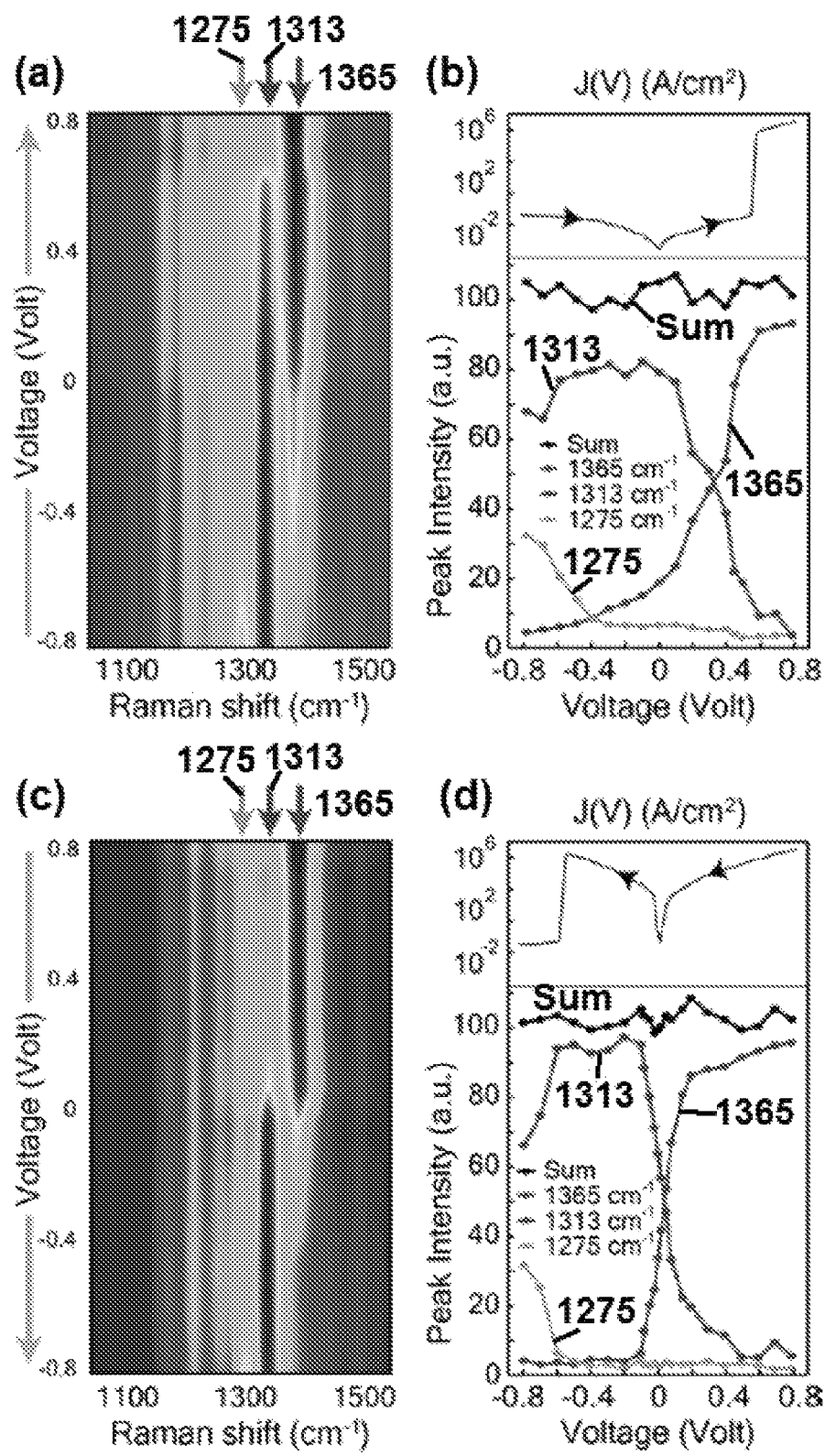

FIG. 28 Depicts the correlation between Raman peaks and film conductance of Device B: (a) pseudo color plot of voltage-resolved Raman spectra measured for Device B for forward voltage sweep (voltage sweep from −0.8V to +0.8V); (b) the top panel shows the J(V) response for forward voltage sweep, while the bottom panel shows the extracted values of intensity of the Raman peaks at 1365 $cm^{-1}$, 1313 $cm^{-1}$ and 1275 $cm^{-1}$ for individual applied biases during forward voltage sweep; (c) pseudo color plot of voltage-resolved Raman spectra measured for Device B during reverse voltage sweep (voltage sweep from +0.8V to −0.8V); and (d) the top panel shows the J(V) response of Device B for reverse voltage sweep, while the bottom panel shows the extracted values of intensity of the Raman peaks at 1365 $cm^{-1}$, 1313 $cm^{-1}$ and 1275 $cm^{-1}$ for individual applied biases during reverse voltage sweep.

Figure 29:
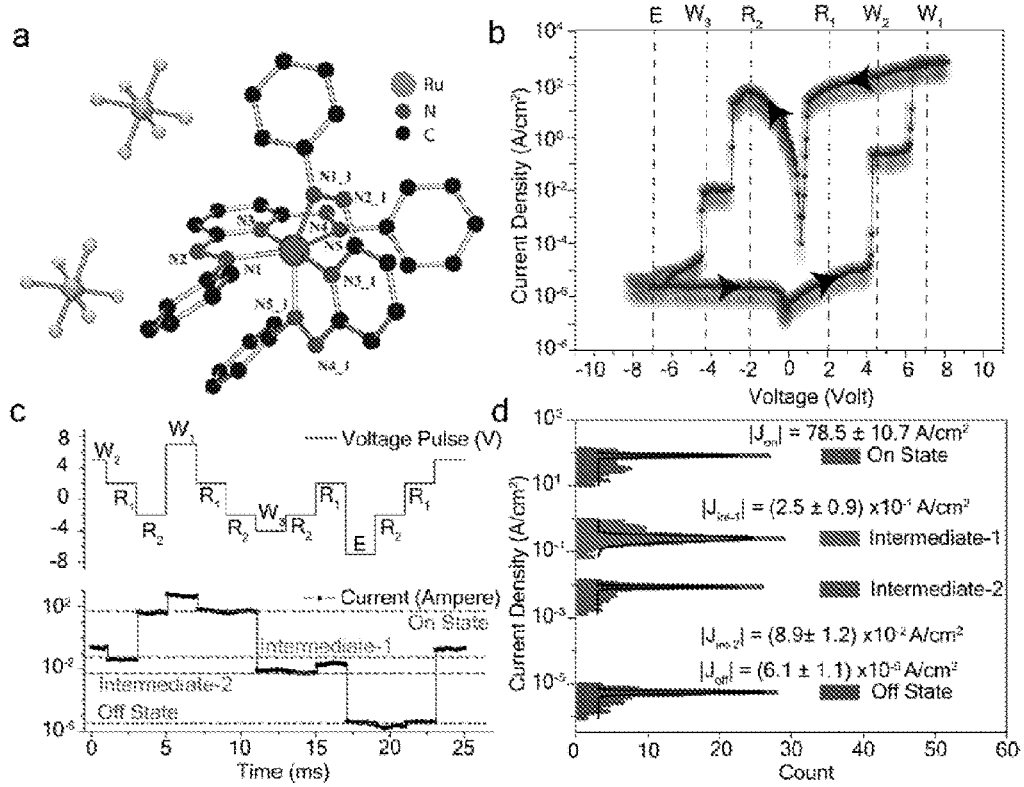

FIG. 29 Depicts the demonstration of multistate memory, along with the initial measurements and characterization: (a) molecular view of the compound $[Ru(L^2)_2](PF_6)_2$ (hydrogen atoms are omitted for clarity) with four azo groups in two pincer-type ligands, $L^2$ ($L^2$=2,6-bis(phenylazo)pyridine) chelating the Ru(II) center. Each asymmetric unit contains 0.5 Ru metal, one N,N,N tridentate ligand($L^2$) and one $PF_6$ counter anion. In the cif file, the Ru atom is located on a special position (with symmetry multiplicity=2); (b) J(V) curve with three distinct conducting states in each polarity. The shaded region contains the current traces for 295 devices of different top electrode (TE) sizes as indicated in Table 4; (c) the device current response to a Write-Read-Erase-Read voltage pulse cycle; and (d) histograms showing the statistical spreads of J in each conductance states for the devices which are significantly narrower than the current difference between the states. The distribution of on and off states are measured at +2V. The histograms for the intermediate states are presented at +5V (for intermediate state-1) and −3.5V (for intermediate state-2). Note: These initial measurements contained artefacts that were subsequently rectified and the corrected values are presented in FIG. 35.

Figure 30:
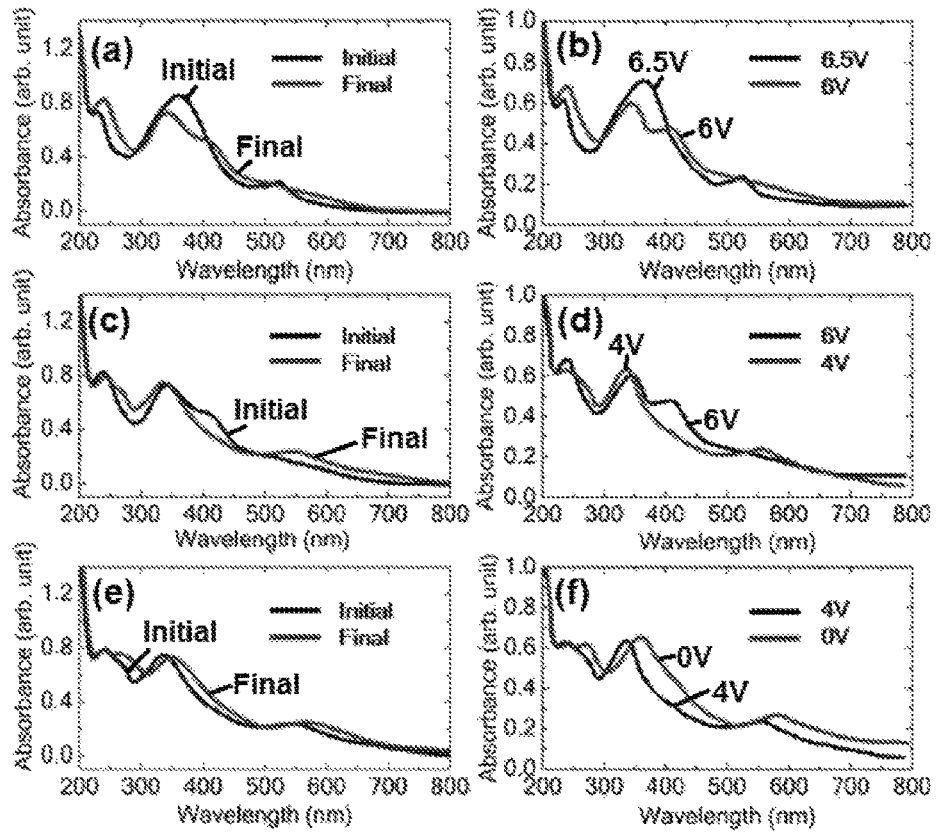

FIG. 30 Depicts the evidence of redox events in the $[Ru(L^2)_2]^{2+}$ film: (a), (c), and (e) show the spectroelectrochemistry (UV-Vis spectroscopy coupled to coulometry) data for the first three reduction events; and (b), (d), and (f) show the initial UV-Vis spectra of the film measured at different values of applied voltage as indicated in the respective figures. The UV-Vis spectra shown in this figure was later found to be imperfect, possibly due to the presence of artefacts. Artefact-free film spectra for the different states are presented in FIG. 36 below.

Figure 31:
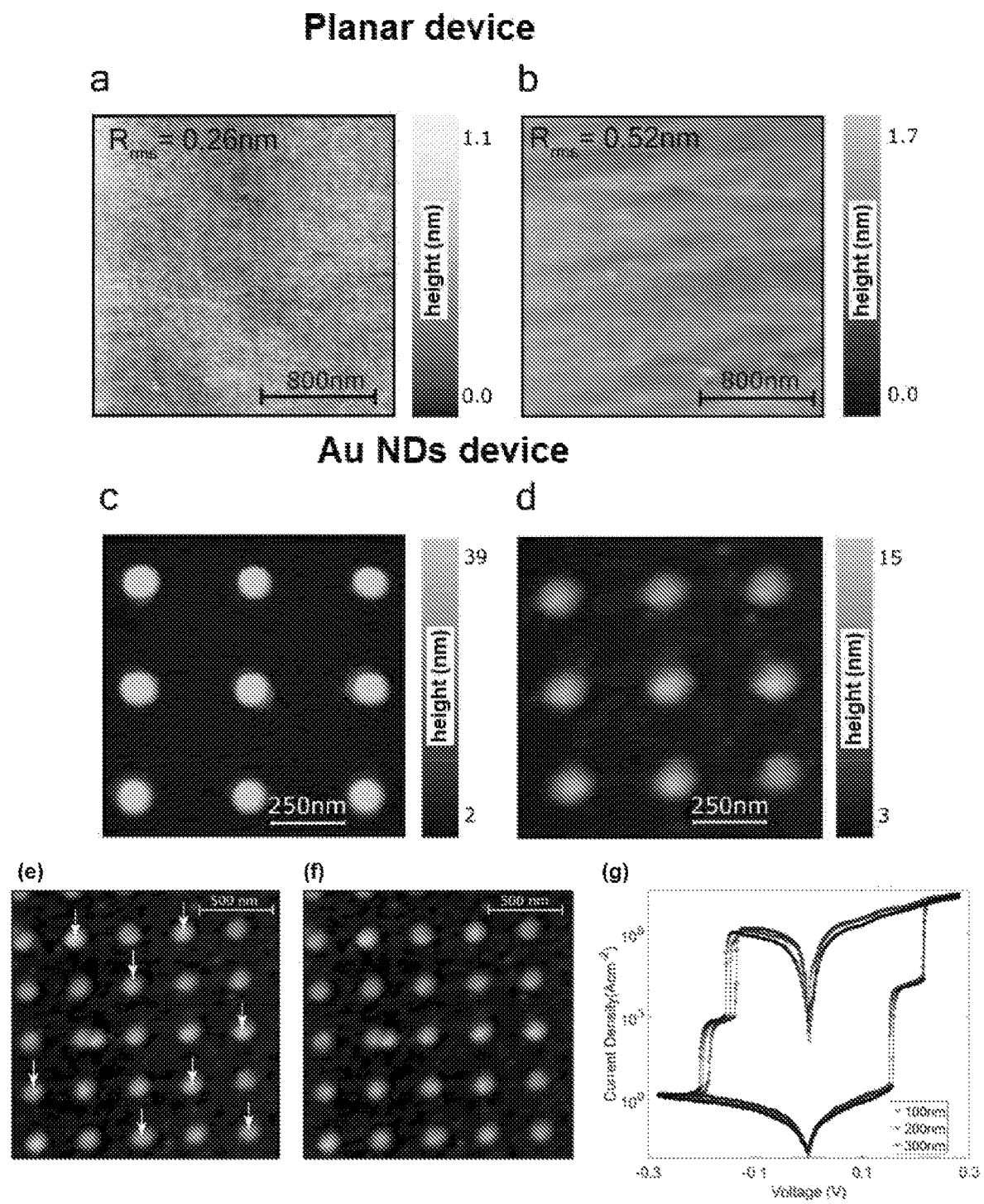

FIG. 31 Depicts the AFM topography of: (a) indium tin oxide (ITO) film epitaxially grown on yttria stabilized zirconia (YSZ) substrate; (b) spin coated film of $[Ru(L^2)_2](PF_6)_2$ on the ITO; (c) lithographically patterned gold nanodiscs on ITO (used as bottom electrodes for the Au NDs device), with nanodiscs diameter of about 100 nm; (d) spin-coated film of $[Ru(L^2)_2](PF_6)_2$ on the nanodiscs; (e) film of $[Ru(L^2)_2](PF_6)_2$ before c-AFM-measurements. Arrows indicate the points where measurements were being performed; (f) film of $[Ru(L^2)_2](PF_6)_2$ after c-AFM-measurements; and (g) charge density profile J(V)s measured with different nanodiscs diameters.

Figure 32:
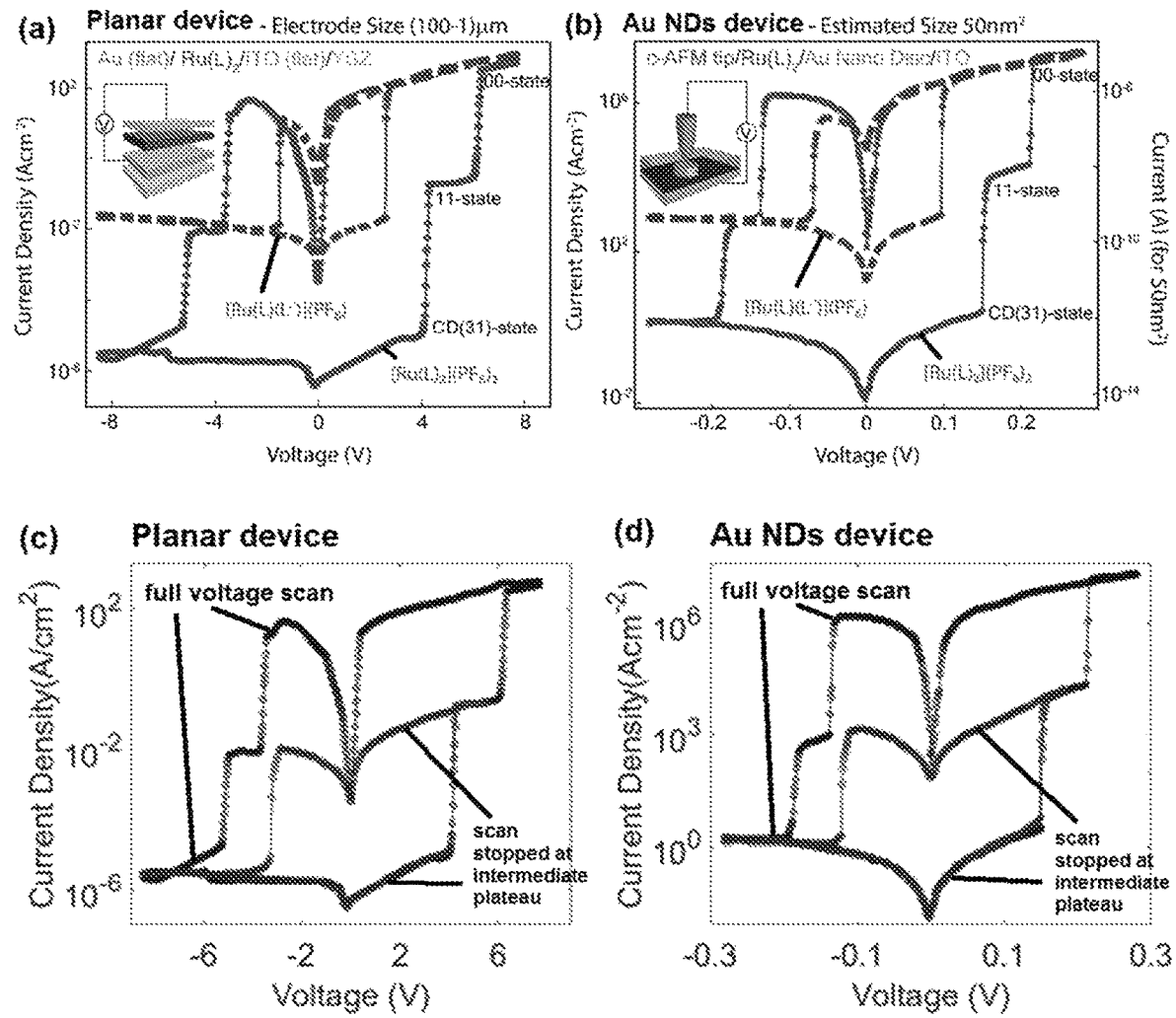

FIG. 32 Depicts the current density profile J(V) of: (a and b) planar and Au NDs devices of $[Ru\{(L^2)^{(\cdot-)}\}(L^2)]PF_6$ and $[Ru(L^2)_2](PF_6)_2$; and (c and d) planar and Au NDs devices of $[Ru(L^2)_2](PF_6)_2$ with full voltage scan and scan stopped at the intermediate plateau.

Figure 33:
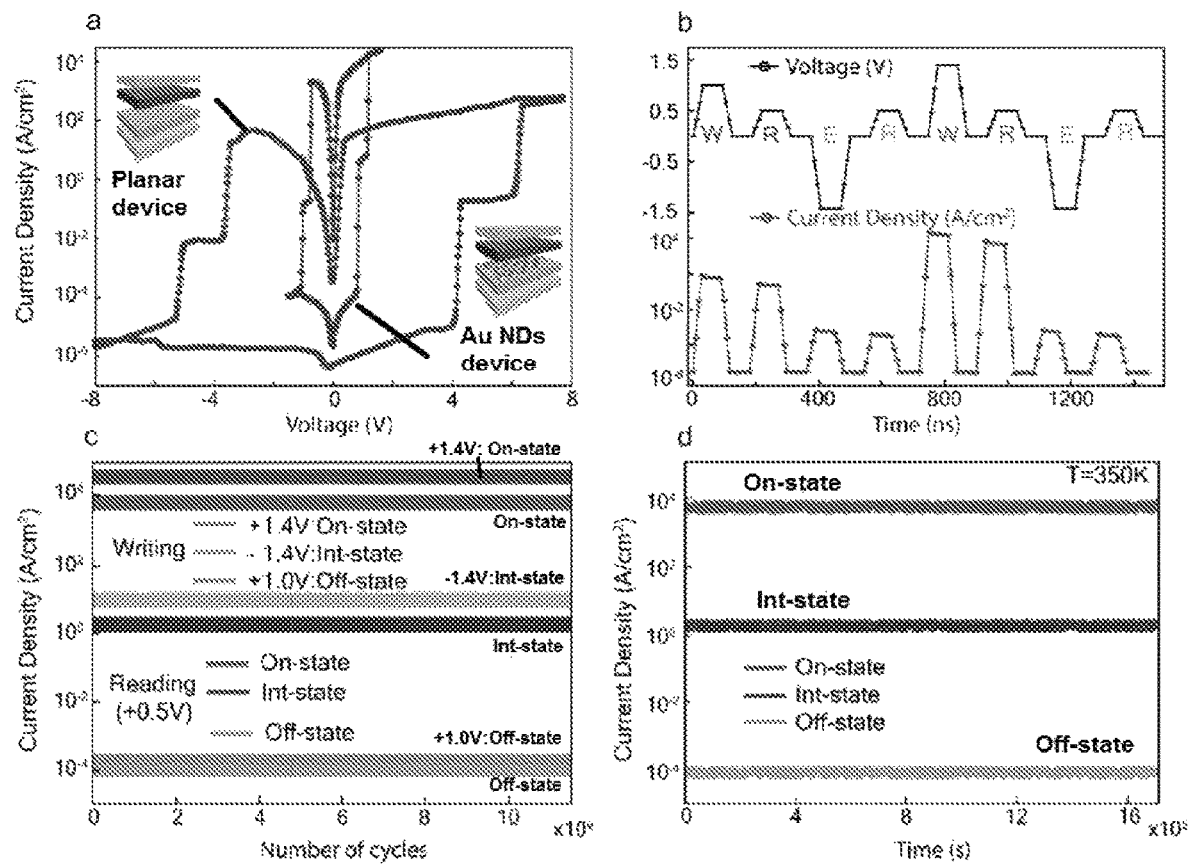

FIG. 33 Depicts the device performance of the Au NDs device of $[Ru(L^2)_2](PF_6)_2$: (a) a comparison between the J(V) of the planar and the Au NDs devices. The device configurations are shown in the inset; (b) response of the Au NDs device to pulses with 30 ns rise time; (c) endurance of the Au NDs device over ~$10^{10}$ cycles (without any degradation) with pulses as shown in (b); and (d) stability of individual conductance states of three separate devices with the same dimensions and set into three different conductance states: on-, intermediate, and off-state. All devices were measured simultaneously with constant application of read voltage V=500 mV at 350 K.

Figure 34:
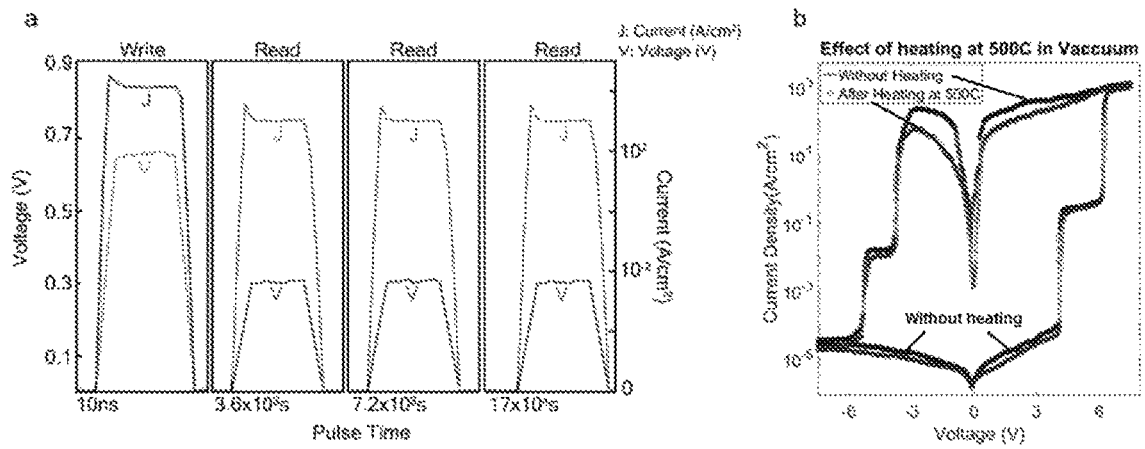

FIG. 34 Depicts the robustness of the conductance states of the devices of $[Ru(L^2)_2](PF_6)_2$: (a) pulse test carried out on the Au NDs device to prove retention at 0 V. After writing, reading operations were performed after 1 hour, 2 hours and 2 days; and (b) J(V)s before and after heating (at 500° C.) which shows no degradation in the performance of the planar device.

Figure 35:
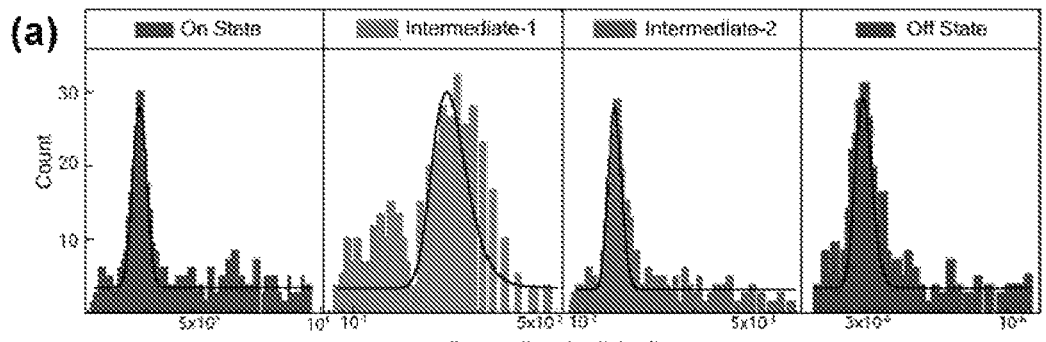
Figure 35:
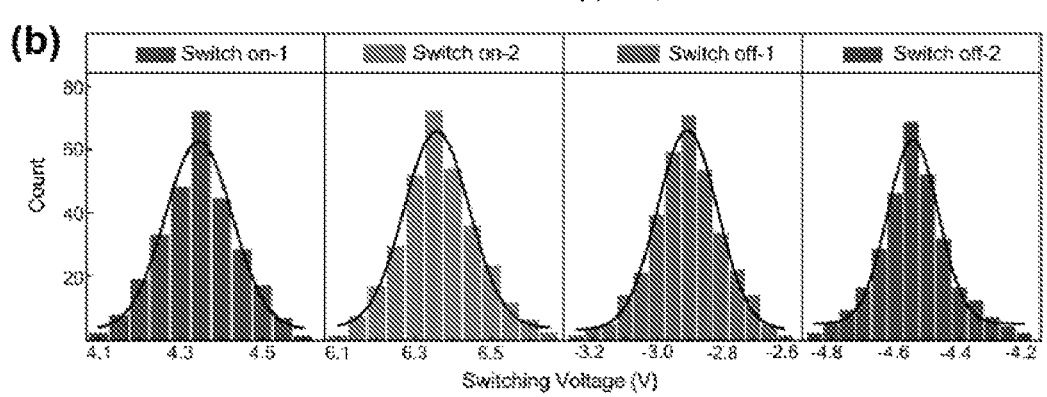
Figure 35:
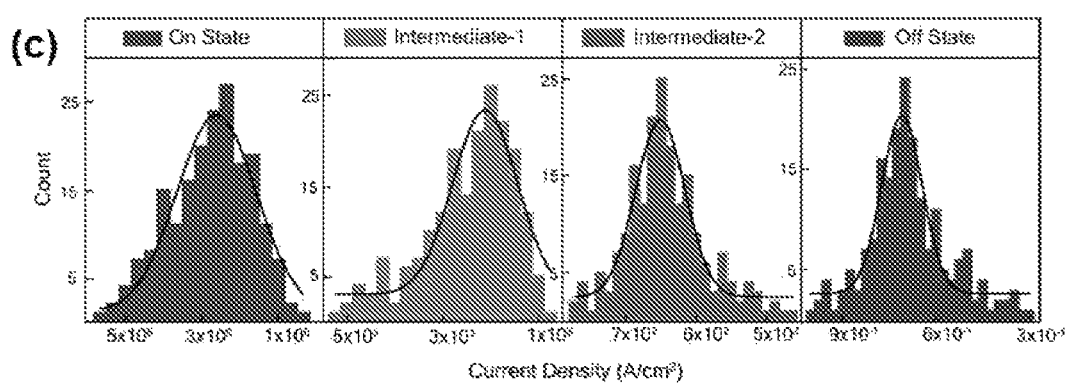
Figure 35:
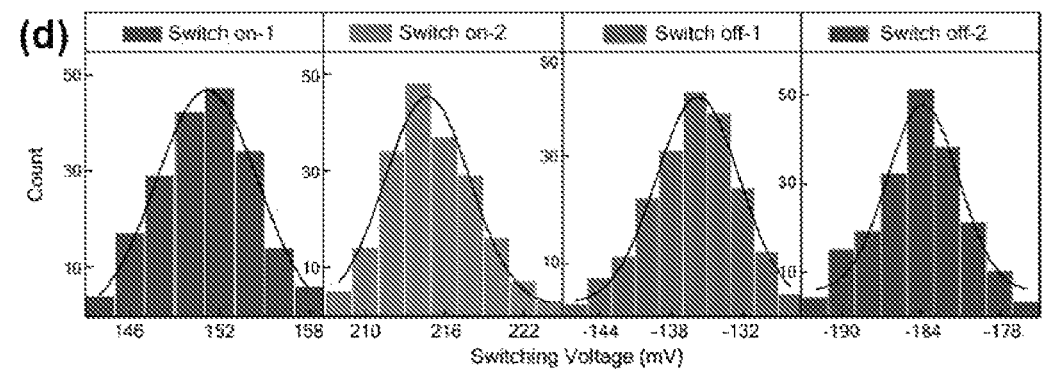

FIG. 35 Depicts the device statistics of the planar and Au NDs devices of $[Ru(L^2)_2](PF_6)_2$: (a and b) current distribution of the conductance states, and distribution of switching voltages, respectively, for the planar devices; and (c and d) current distribution of the conductance states, and distribution of switching voltages, respectively, for the Au NDs devices.

Figure 36:
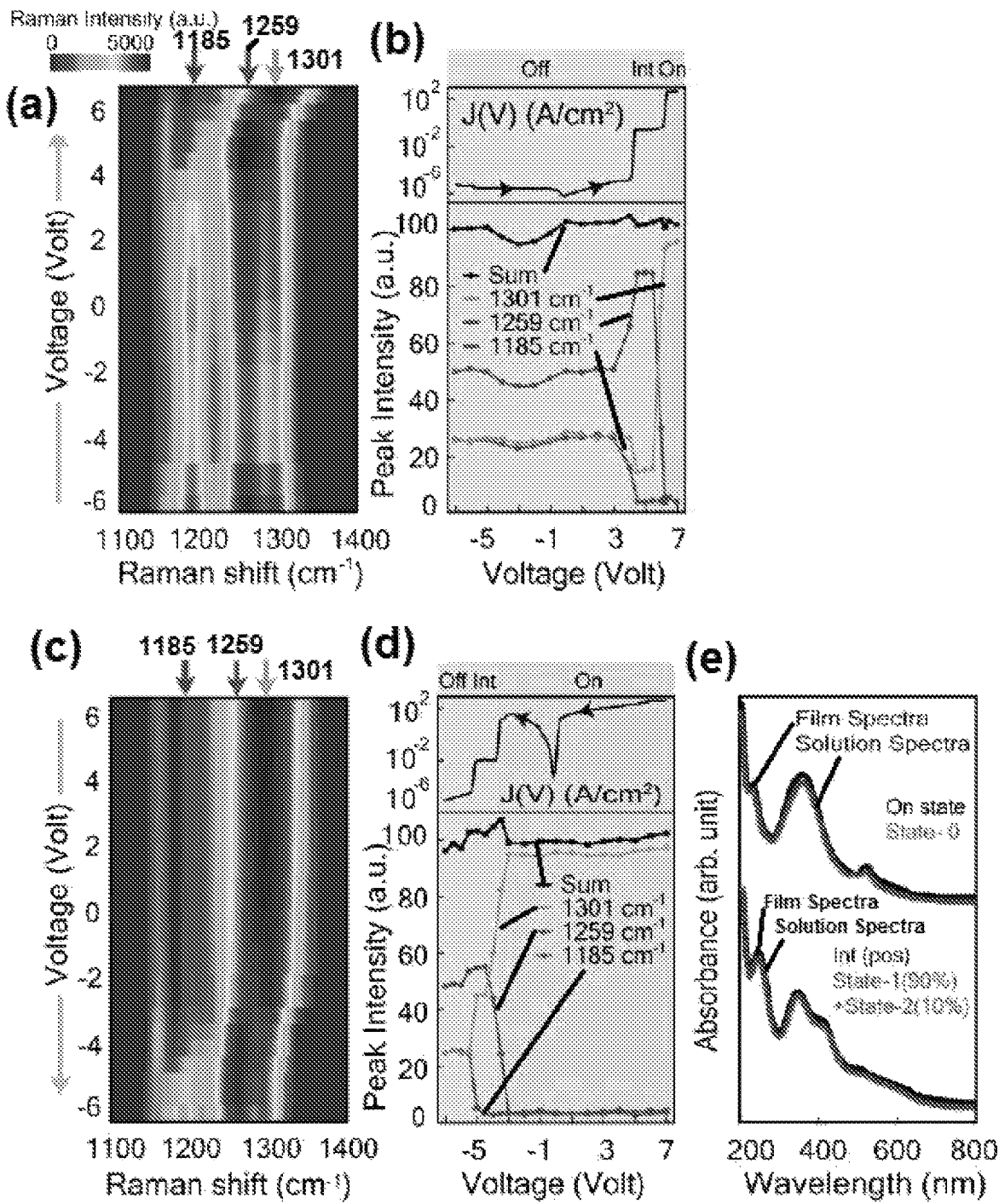

FIG. 36 Depicts the in situ Raman and UV-Vis spectroscopy of the ternary planar device of $[Ru(L^2)_2](PF_6)_2$: (a and c) pseudo colour plots of voltage-resolved Raman spectra for forward and backward sweep, respectively (-7V→+7.5V and vice versa); (b and d) the top panel shows the J(V) response and the bottom panel shows the intensity of $E_0$ (1301 cm$^{-1}$), $E_1$ (1259 cm$^{-1}$) and $E_2$ (1185 cm$^{-1}$) modes for forward and backward sweep, respectively (-7V→+7.5V and vice versa); and (e) UV-Vis spectra of the film and the solution of $[Ru(L^2)_2](PF_6)_2$ at different states. Notations used: state-0=unreduced molecule; state-1=1-electron reduced state; and state-2=2-electron reduced state of the molecule.

Figure 37:
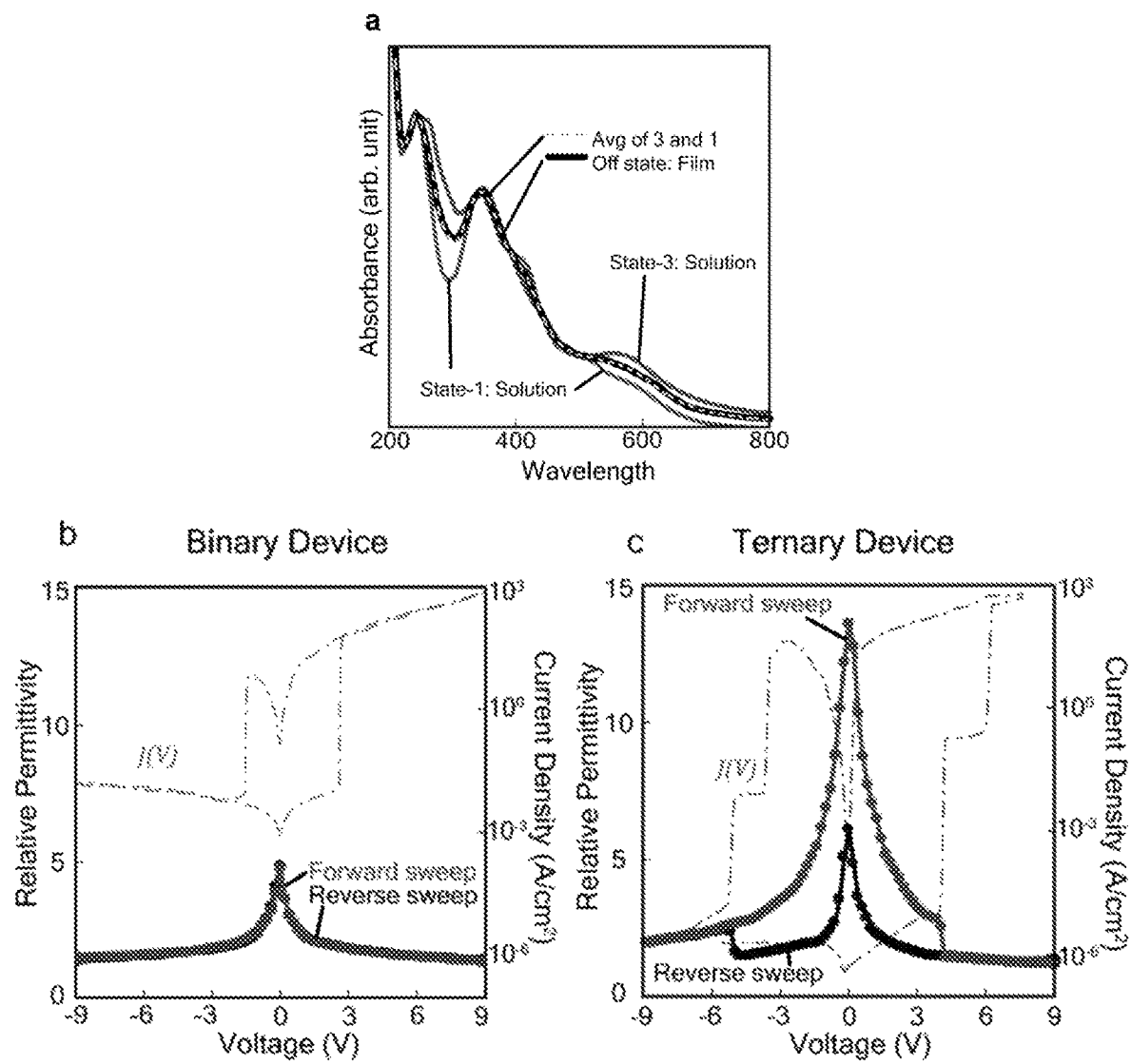

FIG. 37 Depicts evidence suggesting that charge disproportionation occurred in the ternary planar device of $[Ru(L^2)_2](PF_6)_2$: (a) comparison of UV-Vis off-state spectrum of the ternary device with solution-state spectra (spectroelectrochemistry). State-3 refers to the 3-electron reduced state of the molecule; and (b and c) relative permittivity and current density of the film in the binary and ternary devices respectively.

Figure 38:
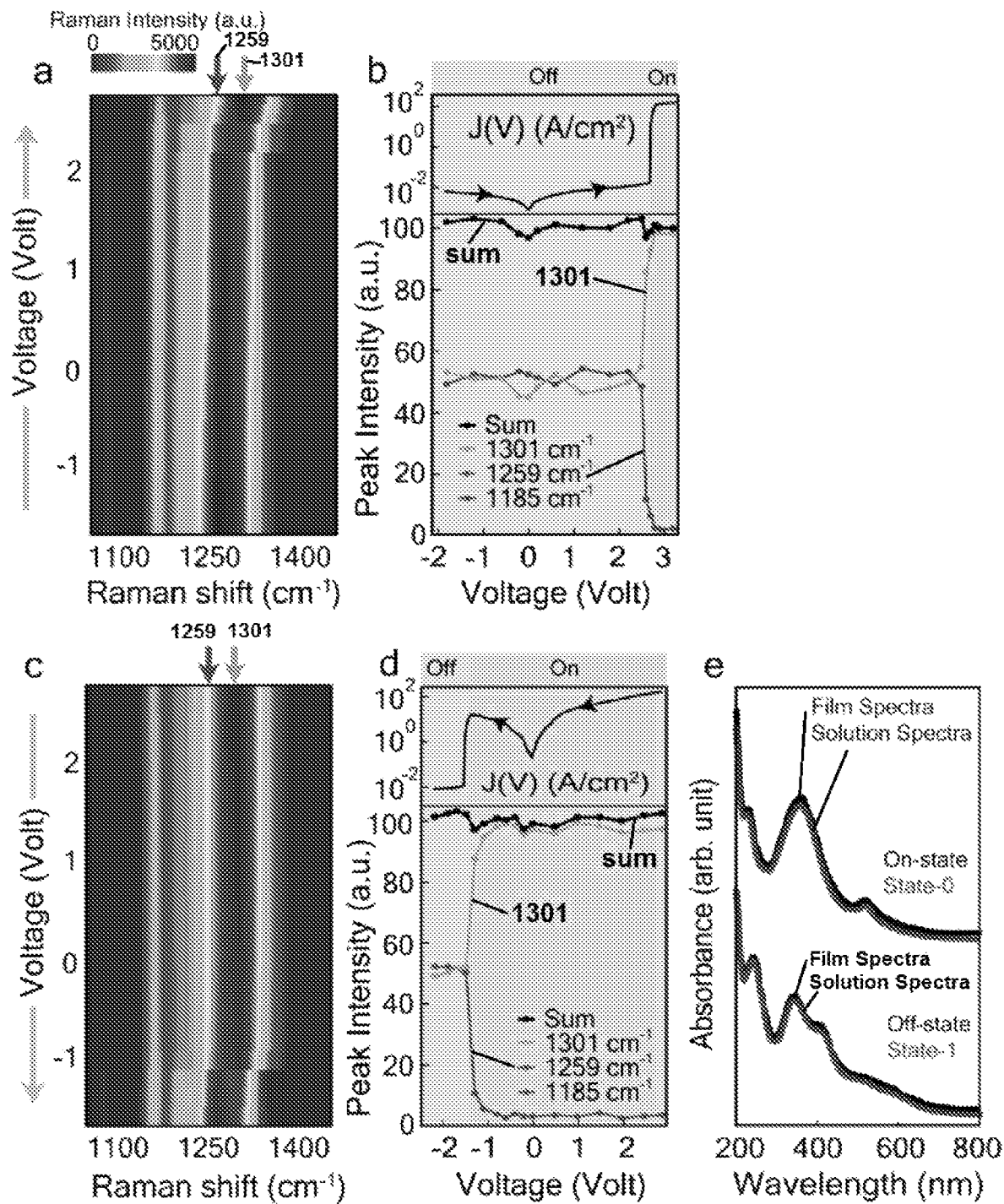

FIG. 38 Depicts the in situ Raman and UV-Vis spectroscopy of the binary planar device of $[Ru\{(L^2)^{(\cdot-)}\}(L^2)]PF_6$: (a and c) pseudo colour plots of voltage-resolved Raman spectra for forward and backward sweep, respectively (-1.8V→+2.9V and vice versa); (b and d) the top panel shows the J(V) response and the bottom panel shows the intensity of $E_0$ (1301 cm$^{-1}$) and $E_1$ (1259 cm$^{-1}$) modes for forward and backward sweep, respectively (-1.8V→+2.9V and vice versa); and (e) UV-Vis spectra of the film and the solution of $[Ru\{(L^2)^{(\cdot-)}\}(L^2)]PF_6$ at different states. Notations used: state-0=unreduced molecule; state-1=1-electron reduced state; and state-2=2-electron reduced state of the molecule.

DESCRIPTION

It has been surprisingly found that certain metallo-organic complexes are particularly useful in the formation of resistive memory devices. Said devices are generically described herein as a compound of formula (I):

wherein:
M represents Ru, Fe, Co, Rh, Ir, Ni, Os, Cr, Cu, Mn;
A represents an anionic group having a charge y, where y represents from 1 to 4;
m represents from 1 to 4;
n represents from 2 to 6;
z represents from 1 to 4; and
L is a ligand selected from the ligand of formula (II) or one or more of the group consisting of ligands of formula (III) to (VII):

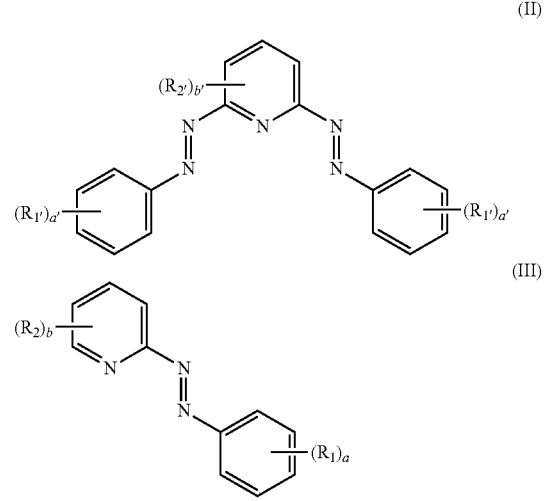

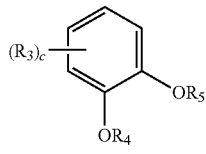
(IV)

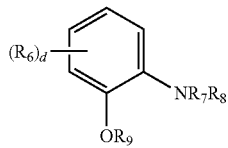
(V)

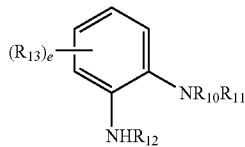
(VI)

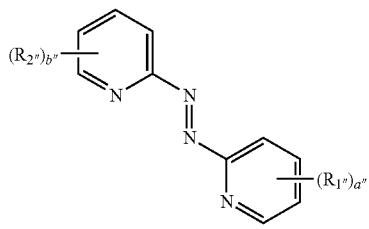
(VII)

where:
when L is the ligand (II), n is 2 and when L is a one or more of the group selected from (III) to (VII), n is 3;
a and a' each independently represent from 0 to 5;
a", b" and b to e each independently represent from 0 to 4;
b' represents from 0 to 3;
$R_1$ to $R_3$, $R_{1'}$, $R_{2'}$, $R_{1''}$, $R_{2''}$, $R_6$ and $R_{13}$ each independently represent, at each occurrence thereof, cycloalkyl, heterocycloalkyl, aryl, heteroaryl, aralkyl, $NR_{14}R_{15}$, $C(O)NR_{16}R_{17}$, $NR_{18}C(O)R_{19}$, $C(O)OR_{20}$, $OR_{21}$, $C(O)OH$, $OH$, halo, $NO_2$, $CN$, alkyl, alkenyl, alkynyl (which latter three groups are unsubstituted or substituted by one or more substituents selected from OH, SH, $C(O)OR_{22}$, or $NR_{23}R_{24}$), or, when present, any two instances of $R_1$ to $R_3$, $R_{1'}$, $R_{2'}$, $R_6$ and $R_{13}$ together with the carbon atoms to which they are attached from a 5-12 membered cycloalkyl ring system, a 5-14 membered heterocycloalkyl ring system, a 6-10 membered aryl ring or a 5-14 membered heteroaryl ring system; and $R_4$, $R_5$ and $R_7$ to $R_{12}$ each independently represent, at each occurrence thereof, H, alkyl, alkenyl, alkynyl, cycloalkyl, heterocycloalkyl, aryl, heteroaryl, aralkyl, or $C(O)NR_{25}R_{26}$;

$R_{14}$ to $R_{26}$ each independently represent alkyl, alkenyl, alkynyl, cycloalkyl, aryl, heteroaryl, or aralkyl, provided that when M is Ir, Cr or Rh, L does not represent a ligand of formula (III).

The term "halo", when used herein, includes references to fluoro, chloro, bromo and iodo.

Unless otherwise stated, the term "aryl" when used herein includes $C_{6-14}$ (such as $C_{6-10}$) aryl groups. Such groups may be monocyclic, bicyclic or tricyclic and have between 6 and 14 ring carbon atoms, in which at least one ring is aromatic. The point of attachment of aryl groups may be via any atom of the ring system. However, when aryl groups are bicyclic or tricyclic, they are linked to the rest of the molecule via an aromatic ring. $C_{6-14}$ aryl groups include phenyl, naphthyl and the like, such as 1,2,3,4-tetrahydronaphthyl, indanyl, indenyl and fluorenyl. Embodiments of the invention that may be mentioned include those in which aryl is phenyl.

Unless otherwise stated, the term "alkyl" refers to an unbranched or branched, cyclic, saturated or unsaturated (so forming, for example, an alkenyl or alkynyl) hydrocarbyl radical, which may be substituted or unsubstituted (with, for example, one or more halo atoms). Where the term "alkyl" refers to an acyclic group, it is preferably $C_{1-10}$ alkyl and, more preferably, $C_{1-6}$ alkyl (such as ethyl, propyl, (e.g. n-propyl or isopropyl), butyl (e.g. branched or unbranched butyl), pentyl or, more preferably, methyl). Where the term "alkyl" is a cyclic group (which may be where the group "cycloalkyl" is specified), it is preferably $C_{3-12}$ cycloalkyl and, more preferably, $C_{5-10}$ (e.g. $C_{5-7}$) cycloalkyl.

The term "heteroaryl" when used herein refers to an aromatic group containing one or more heteroatom(s) (e.g. one to four heteroatoms) preferably selected from N, O and S (so forming, for example, a mono-, bi-, or tricyclic heteroaromatic group). Heteroaryl groups include those which have between 5 and 14 (e.g. 10) members and may be monocyclic, bicyclic or tricyclic, provided that at least one of the rings is aromatic. However, when heteroaryl groups are bicyclic or tricyclic, they are linked to the rest of the molecule via an aromatic ring. Heterocyclic groups that may be mentioned include benzothiadiazolyl (including 2,1,3-benzothiadiazolyl), isothiochromanyl and, more preferably, acridinyl, benzimidazolyl, benzodioxanyl, benzodioxepinyl, benzodioxolyl (including 1,3-benzodioxolyl), benzofuranyl, benzofurazanyl, benzothiazolyl, benzoxadiazolyl (including 2,1,3-benzoxadiazolyl), benzoxazinyl (including 3,4-dihydro-2H-1,4-benzoxazinyl), benzoxazolyl, benzomorpholinyl, benzoselenadiazolyl (including 2,1,3-benzoselenadiazolyl), benzothienyl, carbazolyl, chromanyl, cinnolinyl, furanyl, imidazolyl, imidazo[1,2-a]pyridyl, indazolyl, indolinyl, indolyl, isobenzofuranyl, isochromanyl, isoindolinyl, isoindolyl, isoquinolinyl, isothiazolyl, isoxazolyl, naphthyridinyl (including 1,6-naphthyridinyl or, preferably, 1,5-naphthyridinyl and 1,8-naphthyridinyl), oxadiazolyl (including 1,2,3-oxadiazolyl, 1,2,4-oxadiazolyl and 1,3,4-oxadiazolyl), oxazolyl, phenazinyl, phenothiazinyl, phthalazinyl, pteridinyl, purinyl, pyranyl, pyrazinyl, pyrazolyl, pyridazinyl, pyridyl, pyrimidinyl, pyrrolyl, quinazolinyl, quinolinyl, quinolizinyl, quinoxalinyl, tetrahydroisoquinolinyl (including 1,2,3,4-tetrahydroisoquinolinyl and 5,6,7,8-tetrahydroisoquinolinyl), tetrahydroquinolinyl (including 1,2,3,4-tetrahydroquinolinyl and 5,6,7,8-tetrahydroquinolinyl), tetrazolyl, thiadiazolyl (including 1,2,3-thiadiazolyl, 1,2,4-thiadiazolyl and 1,3,4-thiadiazolyl), thiazolyl, thiochromanyl, thiophenetyl, thienyl, triazolyl (including 1,2,3-triazolyl, 1,2,4-triazolyl and 1,3,4-triazolyl) and the like. Substituents on heteroaryl groups may, where appropriate, be located on any atom in the ring system including a heteroatom. The point of attachment of heteroaryl groups may be via any atom in the ring system including (where appropriate) a heteroatom (such as a nitrogen atom), or an atom on any fused carbocyclic ring that may be present as part of the ring system. Heteroaryl groups may also be in the N- or S-oxidised form. Particularly preferred heteroaryl groups include pyridyl, pyrrolyl, quinolinyl, furanyl, thienyl, oxadiazolyl, thiadiazolyl, thiazolyl, oxazolyl, pyrazolyl, triazolyl, tetrazolyl, isoxazolyl, isothiazolyl, imidazolyl, pyrimidinyl, indolyl, pyrazinyl, indazolyl, pyrimidinyl, thiophenetyl, thiophenyl, pyranyl, carbazolyl, acridinyl, quinolinyl, benzoimidazolyl, benzthiazolyl, purinyl, cinnolinyl and pterdinyl. Particularly preferred heteroaryl groups include monocylic heteroaryl groups. The term "heterocycloalkyl" is interpreted accordingly.

Embodiments of formula (I) that may be mentioned herein include those in which:

(a) $R_1$ to $R_3$, $R_{1'}$, $R_{2'}$, $R_{1'''}$, $R_{2'''}$, $R_6$ and $R_{13}$ may each independently represent, at each occurrence thereof, cycloalkyl, heterocycloalkyl, aryl, heteroaryl, aralkyl, $NR_{14}R_{15}$, $C(O)NR_{16}R_{17}$, $NR_{18}C(O)R_{19}$, $C(O)OR_{20}$, $OR_{21}$, $C(O)OH$, OH, halo, $NO_2$, CN, alkyl, alkenyl, alkynyl (which latter three groups are unsubstituted or substituted by one or more substituents selected from OH, SH, $C(O)OR_{22}$, or $NR_{23}R_{24}$), or, when present, any two instances of $R_1$ to $R_3$, $R_{1'}$, $R_{2'}$, $R_{1'''}$, $R_{2'''}$, $R_6$ and $R_{13}$ together with the carbon atoms to which they are attached from a 5-7 membered cycloalkyl ring system, a 5-6 membered heterocycloalkyl ring system, a 6 membered aryl ring or a 5-6 membered heteroaryl ring system. More particularly $R_1$, $R_2$, $R_{1'}$, and $R_{2'}$ may each independently represent, at each occurrence thereof, alkyl, cycloalkyl, aryl, heteroaryl, $NR_{14}R_{15}$, $OR_{21}$, $C(O)OH$, OH, halo, $NO_2$, or CN, optionally wherein $R_1$, $R_2$, $R_{1'}$, and $R_{2'}$ each independently represent, at each occurrence thereof, alkyl, halo, $NO_2$, or CN (e.g. alkyl or halo);

(b) $R_4$, $R_5$ and $R_7$ to $R_{12}$ each independently represent, at each occurrence thereof, H or alkyl;

(c) $R_{14}$ to $R_{26}$ each independently represents alkyl;

(d) a and a' are 1, and b and b' are 0, optionally wherein $R_1$ and $R_{1'}$ are independently alkyl or halo.

It will be appreciated that any of (a) to (d) may be used to replace the values provided above for formula (I), whether singly or in any technically sensible combination.

The complexes of formula (I) disclosed herein may display a number of stable conductive states. In addition, it is possible to use the ligands and metals described herein to provide resistive memory devices with a desired number of conductive states for a particular task. For example, if a bi-stable device is required (i.e. two stable conduction states for each polarity), then a ligand of formula (III) may be suitable for use in the desired devices. On the other hand, where three stable conduction states for each polarity are required, then the use of ligand (II) may be suitable. As such, ligands can be chosen to meet the required properties of the desired device.

In particular embodiments of the invention, L is selected from a ligand of formula (II') or formula (III'):

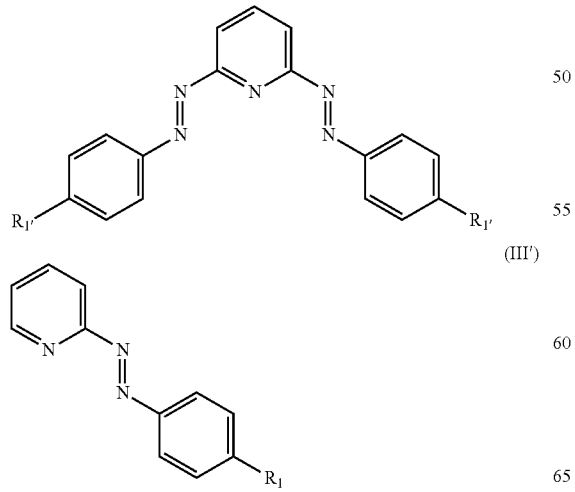

wherein $R_1$ and $R_{1'}$ are selected from H, alkyl or halo. For example, L may be selected from the group consisting of:

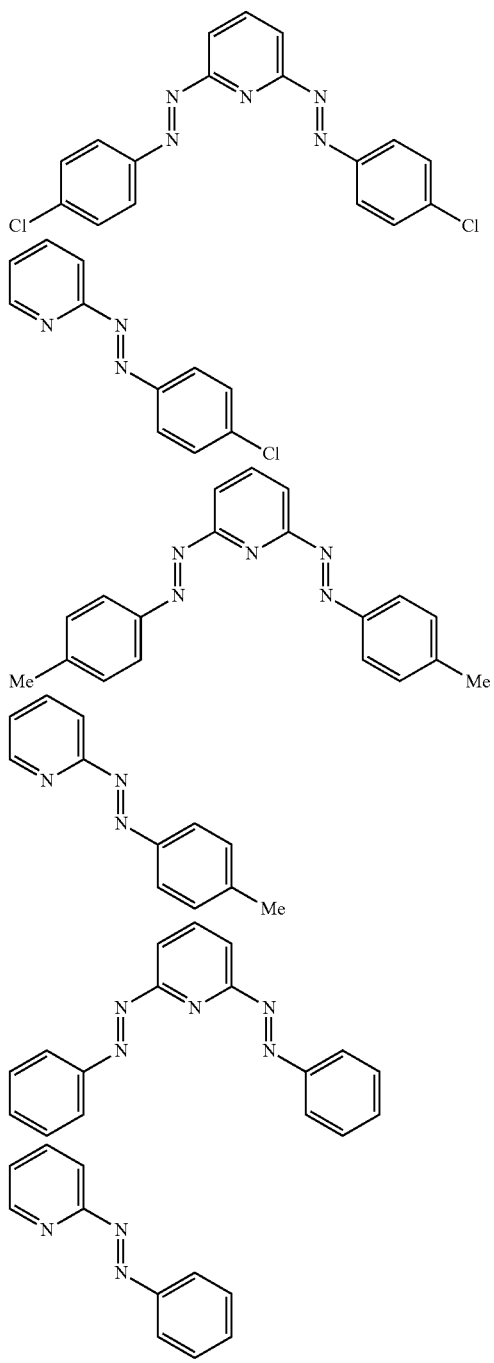

As will be appreciated, the anionic group $A^{y-}$ may be selected from any anionic group that can act as a suitable stoichiometric counterion for the metal-ligand cation (i.e. the number of anionic groups provided matches the cationic charge of the metal-ligand cation). Examples of suitable $A^{y-}$ groups include, but are not limited to $BF_4^-$, $ClO_4^-$, $PF_6^-$, $CF_3SO_3^-$, $BPh_4^-$, $Cl^-$, $Br^-$, and $F^-$. More particular anions that may be selected include as the $A^{y-}$ group are $BF_4^-$, $PF_6^-$ and $Cl^-$ (e.g. $PF_6^-$).

It is noted that the selected counterion is important in enabling the resulting devices to display hysteresis. Without wishing to be bound by theory, it is believed that the counterions can reside in several pockets around the metal-ligand cation and an applied electric field in the device can displace the anions from one pocket to another, travelling sub-nm distances. Given this, it is believed that when an electric field on the order of 100 MV/m is applied across a film of a compound of formula (I) in a device described herein below, the relative position of counterions with respect to the molecule is likely to change due to field-assisted reorientation. To move the counterions back to their original position, an electric field of opposite polarity would be required, resulting in J(V) hysteresis as displayed in the examples below. This suggests that one would expect to observe a steric effect of the counterions on the current hysteresis, which was verified by the preparation of devices using the counterions $BF_4^-$ (vdW-volume=187.7 $Å^3$), $PF_6^-$ (vdW-1 volume=69±0.3 $Å^3$) and $Cl^-$ (vdW-volume=22.4 $Å^3$) with the materials of Device A described in Example 4 below. Devices using $BPh_4^-$ as the counterion show a much less robust on-state when compared to $PF_6^-$, while $Cl^-$ devices show slightly increased 2 hysteresis (results not shown). A similar result was obtained when the same counterions were used with the materials of Device B in Example 4 below. As such, larger switching voltages are needed when bulkier counterions are used. Thus selection of the counterion may be used to affect the properties of the resulting device, which may be accomplished through routine trial and error based on the results provided herein.

As noted above, various metals may be used in the complex of formula (I). It is expected that the use of different metals will provide the same basic functionality as that of Ru (which is used in embodiments of the invention below). Particular metals that may be mentioned in particular embodiments include Ru, Fe, Co, Ni, and Os.

As noted hereinbefore, the compound of formula (I) is particularly useful for providing a resistive memory device with improved properties as compared to metal-organic devices and provides advantages over fully inorganic systems (e.g. metal-oxide systems). Thus there is provided a resistive memory device comprising:
  a substrate material having a surface; and
  a compound of formula (I) as described above coated onto at least a portion of the surface of the substrate material in the form of a film having a first surface and a second surface.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

"About," "approximately," or "substantially," as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "About," "approximately," or "substantially," may mean within one or more standard deviations, or within ±30%, 20%, 10%, 5% of the stated value.

Figure 1:
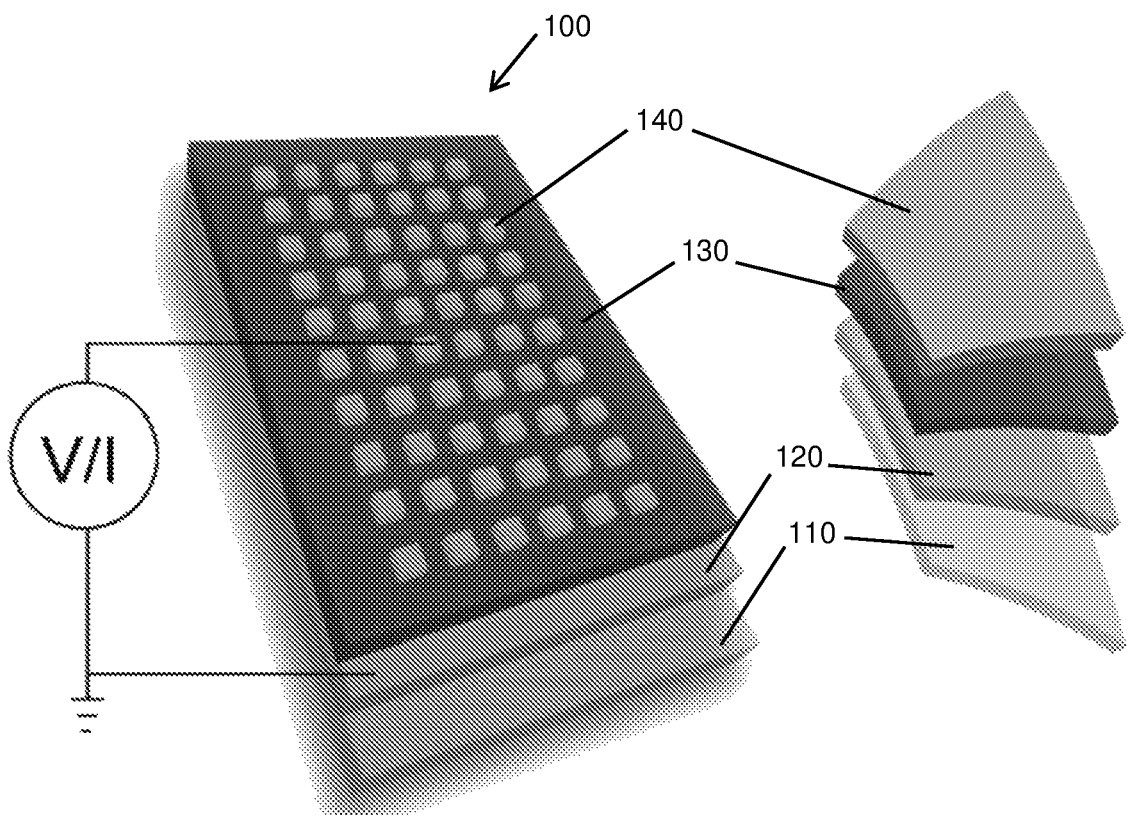
FIG. 1 Depicts a schematic and layout of the device (100) of the current invention with the molecular film sandwiched between two electrodes. The device preparation involves spin casting a solution of the precursor molecules to form an amorphous film (130) of ~10-100 nm thickness (RMS roughness ~1.03 nm) onto an indium-tin-oxide (ITO, grown by PLD)-coated (120) yttria stabilized zirconia (YSZ) substrate (110). Subsequently, a gold electrode (140) is evaporated using electron beam on top, employing a shadow mask. Alternatively, the top contact can be established by a conducting AFM tip enabling current distribution mapping. The ITO electrode is always electrically grounded.

In order for the device to fully function, the device will also include a pair of electrodes. Thus, a first electrode may be sandwiched between the surface of the substrate and the first surface of the film of the compound of formula (I), and a second electrode may be in direct contact with the second surface of the film of the compound of formula (I). The material for the electrodes is not particularly limited and any suitable material may be used. Examples of suitable materials for the first electrode include, but are not limited to gold and, more particularly, ITO (indium tin oxide). Examples of suitable materials for the second electrode include ITO and, more particularly, gold. Such a device 100 is depicted in FIG. 1, where a substrate 110 is covered by a bottom electrode 120 (e.g. ITO having a thickness of 100 nm), which is in turn covered by a molecular film 130 made from a compound of formula (I). The film may have a thickness of from 10 to 100 nm. On top of the film may be placed a top electrode 140 (e.g. ITO or AU, which may have a thickness of 100 nm.

The deposition of the electrodes may use any conventional technique that is known. The deposition of the molecular film may use any suitable technique. For example, the film may be laid using off-centered spin-coating onto the bottom or top electrode.

Figure 2:
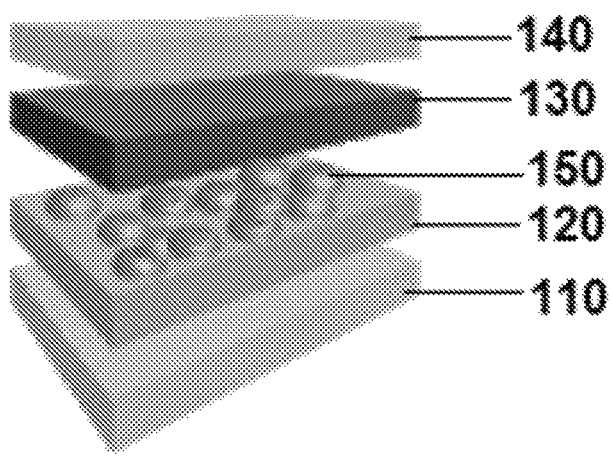
FIG. 2 Depicts a layout of an alternative embodiment of the device with the ITO electrode layer (120) covered with sputtered gold nanoparticles (150).

In certain embodiments, the inclusion of a layer of metal nanoparticles (e.g. gold, silver etc) at the interface between the first electrode and the first surface of the film formed from the material of formula (I). Such a device is shown in FIG. 2, where the additional nanoparticle layer 150 is depicted. As discussed below in the examples, it is believed that the inclusion of the metal nanoparticle layer may reduce the switching bias window, enabling the resulting device to be operated at a lower voltage than would otherwise be the case. As will be appreciated, the nanoparticles may be deposited onto either or both of the film and the first electrode by any suitable method or may be provided as a separate layer therebetween.

The molecular film deposited on the substrate/electrodes may have any suitable thickness. For example, the thickness of the film may be from 10 to 100 nm, such as from 30 to 80 nm, such as from 30 to 50 nm or from 50 to 70 nm. Unless otherwise stated herein, all end points of related ranges may be combined to form new ranges, which are also explicitly disclosed (e.g. in the above example the ranges 30 to 100 and 50 to 80 nm are also disclosed).

Any suitable material may be used as the substrate. Examples of suitable substrates include, but are not limited to suitable ceramic materials and the like (e.g. Yttria-stabilized zirconia (YSZ)).

The devices obtained by the currently claimed invention may have any suitable size. For example, the size of the devices may range from 1×1 µm to 100×100 µm and anything in between (e.g. 1×100 µm etc).

As will be noted, the current logic circuit and memory technology industry are looking for new devices with multiple states by which the storage density and computing power can be enhanced many-fold. The compounds disclosed herein can be easily turned into films and formed into suitable memory resistive devices, while also solving a number of issues normally associated with organic-metal devices, such as the ability to monitor the change in conductive states in situ, thereby allowing fine-tuning of the compounds/devices.

The devices described herein may also have the following advantages.
  1. After optimization of the device fabrication process for each device (e.g. epitaxial ITO, shadow masking, low T evaporation of top electrode for the devices in the examples) it is possible to achieved a high yield and a high level of reproducibility. To make this point clear, more than 600 working devices have been fabricated. Yield and reproducibility are well known problems for organic devices and often go unresolved, but this is not the case for the devices disclosed herein.

2. In terms of stability, the disclosed devices outperform any other reported organic device significantly even at an elevated temperature of 350 K and in severe conditions of constant read-out. So far, the reported stabilities are only limited by measurement duration. Whereas other molecular-film devices show retention in the range of a few hours, the devices disclosed herein have demonstrated retention times of 60 days. This brings an improvement of almost 2 orders.

3. While other (metal)organic devices are either not rewritable: Write Once Read Many times memory (e.g. see *Journal of the American Chemical Society* 137, 4654-4657 (2015), Hong, E. Y.-H., et al. *Journal of the American Chemical Society* (2016), Gu, Q. F. et al. *Adv Mater* 27, 5968-5973, doi:10.1002/adma.201502274 (2015), and *Adv Mater* 24, 6210-6215, doi:10.1002/adma.201202319 (2012)). (WORM), or shows endurance values <$10^3$ cycles, the devices disclosed herein have achieved an endurance of up to $10^{12}$ read-write cycles. This performance is comparable to the best values in oxide systems as reported by Lee et. al. (*Nature materials* 10, 625-630 (2011)).

4. The on/off value between any two states in the devices disclosed herein >$10^4$ which is almost 4 orders of magnitude higher than the spread in the on and off state current values (see examples below). This ensures a low bit error rate.

Figure 3:
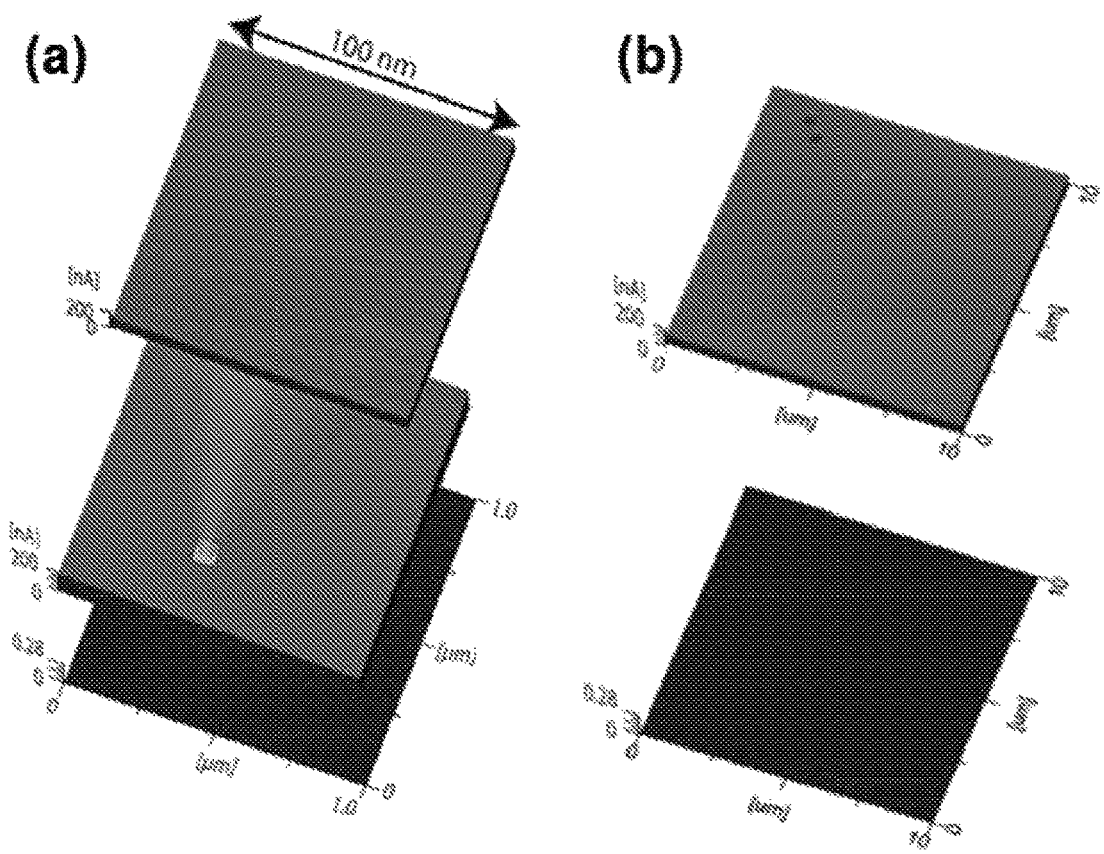
FIG. 3 Depicts (a) the surface current distribution in a 1 µm×1 µm scanned area (top: further zoomed to 100 nm×100 nm); and (b) the current distribution in a large surface area of 10 µm×10 µm.
Figure 4:
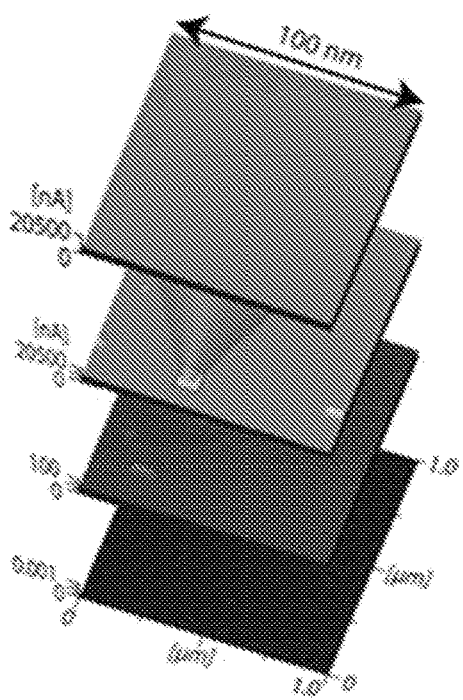
FIG. 4 depicts the c-AFM scan image of the [Ru($L^2$)$_2$](PF$_6$)$_2$ film in different conductance states. The variation in current measured in intermediate-1 state is ~5%, while for on-state, the variation is 6%.

5. With electrodes produced by shadow-masking, it was possible to scale down the devices to 1 μm². The uniformity of surface switching shown by the c-AFM scan FIG. 3a and FIG. 4 indicates that the devices are scalable up to tens of nm. The issue of scalability is typically challenging in organic devices. For example, in the report by Miao et.al. (Miao, S. et al. Molecular length adjustment for organic azo-based non-volatile ternary memory devices. *Journal of Materials Chemistry* 22, 16582-16589 (2012)) and in the review article by Lin et.al. (Lin, W. P., Liu, S. J., Gong, T., Zhao, Q. & Huang, W. Polymer-Based Resistive Memory Materials and Devices. *Advanced Materials* 26, 570-606 (2014)), the c-AFM mapping is significantly non-uniform, indicating problems in device uniformity when scaled down to sub-micron dimensions. Notably, in most reports the smallest viable electrodes are micron-sized.

6. The devices disclosed herein have been tested up to a 75 kHz pulse train, which is rare for organic devices. Most reports demonstrate endurance with pulses in the Hz regime.

The devices disclosed herein may be used in as logic circuit elements, memory devices (especially in flexible portable devices) and in neuromorphic computing applications.

EXAMPLES

General Methods

NMR, ESI-MS Spectroscopy and Elemental Analysis: NMR spectra were obtained using a Bruker Avance 500 MHz spectrometer. A Perkin-Elmer 240C elemental analyzer was used to collect microanalytical data (C, H, N). ESI mass spectra were recorded on a Micromass Q-TOF mass spectrometer (Model No. YA263).

Spectroscopic Characterization

The films were characterized with a number of spectral techniques to gain structural information, as well as data on the vibrational and electronic states of the film molecules.

Rutherford Backscattering Spectroscopy of the film (RBS): Rutherford backscattering spectroscopy was used to measure the ruthenium areal density. A silicon surface barrier detector (energy resolution of 15 keV was used in a 160 degree scattering angle geometry to collect the RBS spectra by probing with 2 MeV $He^+$ ions. Beryllium was chosen as the substrate to quantify the lighter elements in the molecule. The SIMNRA (Mayer, M. in *The fifteenth international conference on the application of accelerators in research and industry*. 541-544 (AIP Publishing)) software was used to fit the experimental data. The ruthenium areal density was found to be $3 \times 10^{14}$ atoms/cm² for a film thickness of 80 nm, resulting in a volumetric density of ruthenium (and hence the molecule) of $3.75 \times 10^{19}$ cm$^{-3}$. Notably, the molecular stoichiometry is not retained in the RBS data since elements of low atomic weight are likely to escape due to high energy ion radiation (Maye, L. C. F. a. J. W. Fundamentals of Surface and Thin Film Analysis (North-Holland, New York, 1986).). For this film, Ru is the heaviest element and since it is too heavy to be evaporated via irradiation, the ruthenium count is taken as a reliable measure of the molecular density (each molecule contains one Ru-atom so the Ru-count represents the molecular density).

J(V) measurements: The devices were characterised using a standard Keithley and Agilent Measurement Systems. The characterisations were performed in probe stations and a Physical Property Measurement System (PPMS, Quantum Design). The measurement performed in air and in vacuum shows almost similar characteristics eliminating any possibility of effect of moisture in the device response.

ITO/film/ITO devices displayed very similar J(V) values to ITO/film/Au devices. Notably, even in the ITO/film/ITO configuration, the bottom electrode-film interface was different from the film-top electrode interface owing to the preparation methods of the two electrodes. The fact that the work function of the top electrode does not change the J(V) excludes a Schottky barrier.

Devices without a bonding pad for the top electrode were measured with a micro-manipulated probe station where the contact between the spring-loaded probes and the electrode is controlled by an automated sensor ensuring minimum mechanical damage to the devices.

Figure 5:
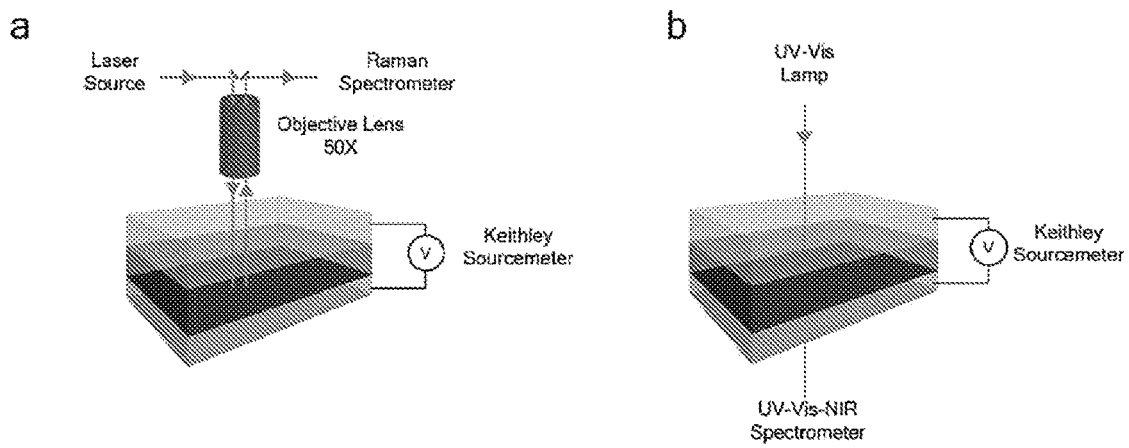
FIG. 5 Depicts the schematic of the in situ spectroscopy carried out on the thin film devices: (a) schematic presentation of in situ Raman; and (b) UV-Vis spectroscopy.

In-situ Raman Spectroscopy: A JY Horiba LabRAM Evolution Raman spectrometer with an air cooled CCD detector was used for all measurements. A Lexel SHG 95 Argon Ion laser was used for the excitation. Excitation wavelengths of 514.5 nm, 488 nm and 633 nm were used to identify the Raman modes. However, for all voltage-resolved measurements we used the 514.5 nm laser excitation. The measurements were performed in reflection geometry. Since we needed to probe the signal from the film, we used transparent ITO as the top electrode while the rest of the device geometry was the same as described in FIG. 5a. As shown in FIG. 5a, the measurement set up includes a confocal microscope to focus the laser at a desired spot of ~1 μm². We used a 514.5 nm continuous laser with 20 μW power incident on the sample. The voltage was applied on the sample using a Keithley-2400 source meter. The voltage loop was programmed to stay for 300 s at each voltage point during which we measured the Raman spectrum. In between each pair of measurements, the Si-peak at 520 cm$^{-1}$ was calibrated in order to avoid any measurement artefacts. The spectra were measured with an average integration time of 15 s.

For low temperature measurements an Advanced Research Systems Inc. compressed helium-based closed cycle refrigerator was used, coupled to the above spectrometer.

In-situ UV-Visible-NIR Spectroscopy: We used a Shimadzu (Japan) Solidspec-3700 spectrophotometer for this in-situ measurement. The device structure was ITO/film/ITO/YSZ. We measured the spectra in transmission mode where the sample was mounted between the lamp and the detector as shown in FIG. 5b. The voltage was applied using a similar instrumentation and interface as described above for Raman spectroscopy. Each voltage point was held for 500 s when the UV-Vis spectra were recorded and between each pair of UV-Vis we corrected background to eliminate artifacts.

Computational Methods: Density functional theory (DFT) calculations were performed using the hybrid B3LYP (Becke, A. D. Density-functional exchange-energy approximation with correct asymptotic behavior. *Physical review A* 38, 3098 (1988)) exchange-correlation functional and def2svp (Weigend, F. & Ahlrichs, R. Balanced basis sets of split valence, triple zeta valence and quadruple zeta valence quality for H to Rn: design and assessment of accuracy. *Physical Chemistry Chemical Physics* 7, 3297-3305 (2005)) basis set with unrestricted Kohn-Sham wave functions as implemented in Gaussian 09 package (Frisch, M. J. et al. Gaussian 09, revision A. 1. Gaussian Inc., Wallingford, Conn. (2009)).

Calculated vibrational frequencies were scaled by 0.96, a scaling factor for the B3LYP functional with this basis set as calculated by the Computational Chemistry Comparison and Benchmark Database. Ab initio calculations of vibrational frequencies need to be scaled to match experimental frequencies to accommodate for two factors, the fact that the electronic structure calculation is approximate (no full configuration interaction, no relativity, etc.) and because the potential energy surface is assumed to be harmonic. Since the calculated frequencies stem from the second derivative of the potential energy surface, treating the PES 1 as harmonic rather than a Morse potential results in energy level spacing which are further apart than in reality.

Atomic Force Microscopy (including c-AFM) measurement: A JEOL JSPM 5200 AFM set up was used for all measurements. A CSC17/Ti-Pt tip (tip radius of curvature <30 nm, tip height: 20-25 μm, tip cone angle <30°, resonant 1 frequency ~12 kHz, Force constant ~0.15 N/m) was used for conducting-AFM characterisation. The c-AFM measurements were performed in contact mode in vacuum (at a pressure of 10$^{-5}$ mbar). The cantilever probe was approached to the sample with a set point voltage, +2 V. J(V) measurements were performed in contact mode and the resultant current was measured using a pre-amplifier which can detect currents up to 5 μA with a 10 fA detection sensitivity. After each set of measurements, the first measurement was repeated to ensure retention of tip quality.

Estimation of contact area between the tip and the sample:

The area of contact between an AFM tip and a sample can be estimated from several models among which Johnson, Kendall and Roberts (JKR) and the Derjaguin-Muller-Toporov (DMT) model can be taken as the respective upper and lower limits as indicated in the literature.

JKR Model

According to JKR model, the relationship between the radius of contact (a) and the load force (F) is given by the Hertz equation, $$a = \sqrt[3]{\frac{R\left(F_l + 3\pi RW_{12} + \sqrt{6\pi RW_{12}F_l + (3\pi RW_{12})^2}\right)}{E_{eff}}} \quad (1)$$

In order to calculate the radius of contact a, we need to estimate
1. The load force—$F_l$
2. Work of adhesion $W_2$ between the tip and the surface
3. The effective elastic modulus between the probe tip and the sample—$E_{eff}$
4. Radius of the probe tip—R (<35 nm from tip data sheet)

1. Load Force—$F_l$

We estimate the load force from the set point value (+2V) used during our measurement:

$$F_l = kS\delta \quad (2)$$

where k is the spring constant of the cantilever (=0.18 N/m), S is the deflection sensitivity of the 5 cantilever and 5 is the cantilever deflection (=2V).

Figure 6:
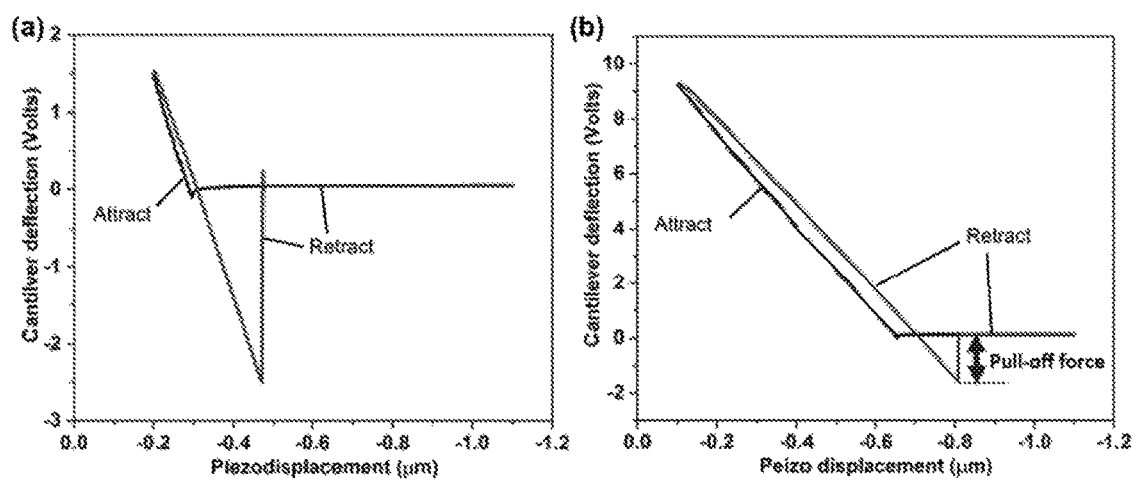
FIG. 6 Depicts the experimental force-distance curves obtained on (a) the hard substrate (SrTiO$_3$ (STO)); and (b) the film of Device A.

The deflection sensitivity (S=62.5 nm/V) is extracted from the slope of the linear portion of the attract part of the force curve obtained on a hard substrate viz. SrTiO$_3$ (STO) as shown in FIG. 6a.

2. Work of adhesion $W_{12}$

JKR model for pull-off force is expressed as $$F_{pull-off} = c\pi RW_{12} \quad (3)$$

Where c is 1.5 for JKR model, R is the radius of the probe tip and $W_{12}$ is the work of adhesion $F_{pull-off}$ is estimated using Eqn. 2 with same values of k and S used to estimate the load force (F) 15 value. The δ=1.5V is estimated from the F-d curve measured on the film surface of Device A (FIG. 6b).This property is expected to be the similar to the film of Device B as well.

By substituting the values of c, R and $F_{pull-off}$ in Eqn. 3, $W_{12}$=0.1023 N/m 3. The Effective Elastic Modulus Between the Probe Tip and the Sample—$E_{eff}$ $E_{eff}$ is calculated from the effective elastic modulus between two contacting bodies as shown in Eqn. 4.

$$\frac{1}{E_{eff}} = \frac{3}{4}\left(\frac{1-\vartheta_{tip}^2}{E_{tip}} + \frac{1-\vartheta_{sample}^2}{E_{sample}}\right) \quad (4)$$

$\vartheta_{tip}$, $\vartheta_{sample}$, $E_{tip}$ and $E_{sample}$ are the Poisson's ratios and Young's moduli of the probe tip and sample, respectively. Substituting the values of Poisson's ratio and Young's modulus of the SiN tip ($E_{tip}$=166 GPa, $\vartheta_{tip}$=0.23) and sample ($E_{sample}$=25 GPa, $\vartheta_{sample}$=0.4), we obtain, $E_{eff}$=34.039 GPa. We substituted these values in JKR model as shown in Eqn. 1 to get a=4.41 nm. Therefore, the contact area $\pi a^2$=60 nm$^2$ DMT Model The expression for pull-off force as in Eqn. 3 is valid for the DMT model as well. The DMT model is an alternative model for contact mechanics and the contact profile is similar to the Hertzian contact but it takes in to account additional attractive interactions outside the contact. The area of contact by DMT model is given by, $$a = \sqrt[3]{\frac{R(F_l + 2\pi R W_{12})}{E_{eff}}} \quad (5)$$

By substituting the values in Eqn. 5, we get a=3.32 nm and contact area=34.66 nm$^2$ Although DMT predicts a lower value for the contact area, as a conservative choice we assume an area of ~60 nm$^2$.

We would like to highlight that as claimed in several reports[6] the electrical area of contact is estimated to be 10% of the physical contact. However, still to be on the conservative side, we have used the area of 60 nm$^2$ for the estimation of the current densities.

Precautions and Control Experiments

Figure 7:
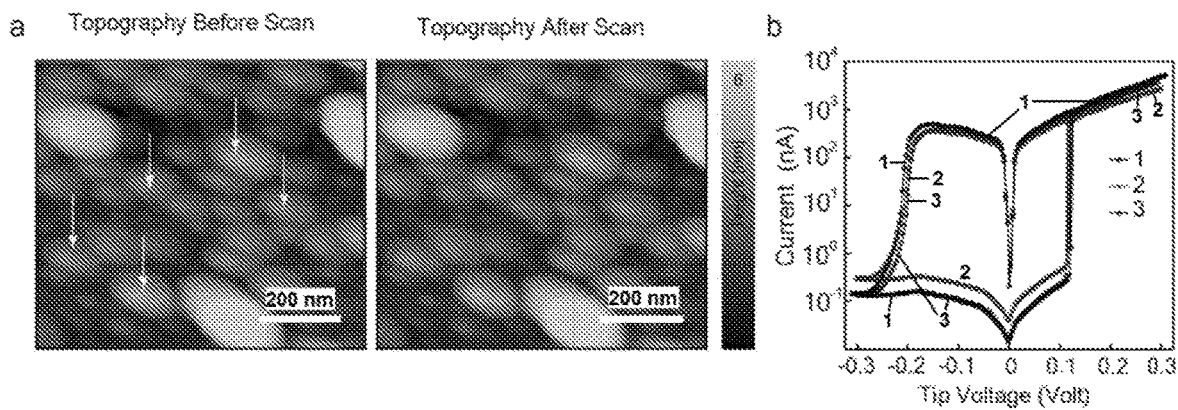
FIG. 7 Depicts the c-AFM measurement of the film (in film/NP/ITO/YSZ structure, i.e. device-B): (a) AFM images of the topography before and after I(V) measurement at several points (indicated by the white arrow); and (b) three I(V)curves representing three different measurements at the same location. After the first measurement, the tip was retracted and then approached for measurement 2. The same process was repeated for measurement 3.

Notably, as further precautions,
a. We measured the film topography before and after the I(V) measurements as presented in FIG. 7a. We do not observe any blurring or artifacts due to tip damage.
b. We measured the I(V) several times on the same locations between measurements we retracted and then approached the tip. Three such I(V) plots are presented in FIG. 7b where after 1 we retracted and approached the tip again to measure 2, and using same process after 2, we measured 3.

Energy Calculation in a c-AFM device: We calculated the switching energy using $E_s = I_s V_s t_s$ where $I_s$=on state current at switching voltage, $V_s$=switching voltage and $t_s$=switching time (we have taken 30 ns which is the fastest we could demonstrate). For a 60 nm$^2$ device, $I_s$=5×10$^{-7}$ A, $V_s$=0.1V, $t_s$=30 ns. Hence $E_s$=(5×10$^{-7}$×0.1×30×10$^{-9}$)=1.5×10$^{-15}$ J=1.5 fJ.

Device Yield Calculation

The device-yield reported here represents the number of successful devices obtained amongst those measured. However, the devices measured underwent a pre-screening process:

It is well-known that in spin coating process, the film near the substrate edge becomes non uniform. This is particularly true for substrates of 1 cm×1 cm. Hence, it is a common practice to exclude those parts during device fabrication (Franssila, S. Introduction to microfabrication. (John Wiley & Sons, 2010)). As such, devices within about a 200-micron perimeter of the edges of the film were excluded.

For the devices obtained in the resulting central zone, an optical screening was conducted and the following devices were excluded:

(a) where the top Au-electrode partially peeled off
(b) where the shape of Au-electrode was not well defined and deviated from dimensions of the shadow mask.

The above pre-screening steps excluded about 5% of the devices. Thus, only those devices that passed the above steps were analyzed further.

Among the measured devices, the most common failure mode observed was that some devices were found to be shorted between top and bottom electrodes (approx. 80% of failure among measured devices); and the remaining devices did not show hysteretic IV characteristics and therefore no memory response (approx. 20% of failures).

Preparation of Ligands 2-(Phenylazo)pyridine ($L^1$) and 2,6-bis(phenylazo)pyridine ($L^2$) were synthesized as reported in Campbell, N., Henderson, A. W. & Taylor, D. *Journal of the Chemical Society* (Resumed), 1281-1285 (1953) and Ghosh, P.; Samanta, S.; Roy, S. K.; Demeshko, S.; Meyer, F.; Goswami, S. *Inorg. Chem.*, 53, 4678-4686 (2014).

General Preparation 1

Preparation of Devices

Indium tin oxide (ITO) grown on annealed yttria-stabilized zirconia (YSZ) was used as the bottom electrode for all the devices. Freshly grown ITO electrodes were used for device preparation, which ensures a much better surface coverage and reproducibility. Treatment of the electrode with oxygen plasma just before film preparation was also found to be favourable to device performance.

When included, gold nanoparticles (NPs) on the bottom electrode were obtained by annealing ultrathin Au-film sputtered on ITO substrate following the well-established methods (e.g. see Lin J. C., et al., *Advanced Materials* 2016, 28(4): 764-770). The solution of precursor molecules (i.e. the complexes of Examples 1 and 2) in acetonitrile were deposited on ITO by off-centered spin coating (OCSC) (Yuan, Y. et al. *Nature communications* 5, 3005 (2014)). The solution concentration and substrate position in the spin coater with respect to the center and the rotor speed can both be varied to get various film thicknesses. After deposition, the samples were stored in a vacuum chamber with a pressure of ~10$^{-8}$ Torr for 12 hours. Subsequently, the Au/ITO electrode was deposited using shadow masks of various sizes. Au top electrodes were fabricated using electron beam evaporation. ITO top electrodes were deposited by the pulsed laser deposition (PLD) technique.

For devices for in situ characterization, amorphous ITO was used as the top electrode. A gold pad was used at the corner of the ITO for making contacts on the top electrode via the standard wire bonding method.

Example 1

Synthesis of mer-[Ru($L^1$)$_3$](PF$_6$)$_2$

The precursor complex [Ru($L^1$)$_2$(OH2)$_2$](ClO$_4$)$_2$.H$_2$O was synthesized as previously reported (Goswami, S.; Chakravarty, A. R.; Chakravorty, *Inorg. Chem.* 22, 602-609 (1983)).

In a round bottom flask equipped with a condenser, 100 mg (0.55 mmol) of $L^1$, dissolved in 5 mL methanol, was added to a methanolic solution (20 mL) of 360 mg (0.50 mmol) [Ru($L^1$)$_2$(OH$_2$)$_2$](ClO$_4$)$_2$.H20. The mixture was then refluxed for 3 h. The blue-violet solution gradually turned orange and the resultant solution was then evaporated to dryness and washed thoroughly with hexane. The product thus obtained was dissolved in 5 mL of methanol and to it a saturated aqueous solution of $NH_4PF_6$ (1 mL) was added. The mixture was kept in a refrigerator for 1 h and the brown precipitate was collected by filtration and washed thoroughly with water. The product was finally crystallized by slow diffusion of its acetonitrile solution into toluene. Yield: 385 mg (82%).

The calculated elemental analysis percentages for $C_{33}H_{27}F_{12}N_9P_2Ru$ were C, 42.14; H, 2.89; N, 13.40 while the experimentally measured numbers were C, 42.28; H, 2.93; N, 13.32.

Example 2

Synthesis of $[Ru(L^2)_2](PF_6)_2$

The complex $[Ru(L^2)_2](PF_6)_2$ was synthesized from $Ru(L^2)(CH_3CN)Cl_2$ via a three-step synthetic protocol.

In the first step an intermediate complex, $[Ru(L^2)Cl_2(CH_3CN)]$ was synthesized from the reaction between hydrated $RuCl_3$ and $L^2$. Its crystallization from $CH_3CN$ produced a dark crystalline compound. Substitution of 2Cl$^-$ and $CH_3CN$ by $L^2$ produced the monocationic complex, $[Ru\{(L^2)^{(\cdot-)}\}(L^2)]PF_6$ $\{(L^2)^{(\cdot-)}$=one electron reduced form of $L^2\}$. Chemical oxidation of $[Ru\{(L^2)^{(\cdot-)}\}(L^2)]PF_6$ by $Br_2$ in the presence of $NH_4PF_6$ produced the desired compound, $[Ru(L^2)_2](PF_6)_2$. The molecular structures of the Ru-complexes isolated in two redox states: di-cationic $[Ru(L^2)_2](PF_6)_2$ with two counter-anions and mono-cationic $[RuL^{2(\cdot-)}L^2]PF_6$ with one anion were deposited with the Cambridge Crystallographic Data Centre (CCDC deposition codes 1839995 and 1840074). Synthetic details of each step are elaborated below.

(i) Synthesis of $[Ru(L^2)Cl_2(CH_3CN)]$: In a round bottom flask equipped with a condenser, a mixture of 170 mg (0.59 mmol) of $L^2$ and 150 mg (0.57 mmol) $RuCl_3 \sim 3H_2O$ in 20 mL ethanol was refluxed for 3 h. During this time the color of the reaction mixture slowly changed from red to green. The crude mass, obtained by the evaporation of the above solution, was washed thoroughly with hexane to remove unreacted $L^2$. Finally, the product was crystallized by the slow evaporation of its acetonitrile solution. Yield: 215 mg (75%).

ESI-MS (m/z): 459.85 amu $[C_{17}H_{14}Cl_2N_5Ru]^+$ (z=1) i.e. ([RuLCl$_2$(CH$_3$CN)]−(CH$_3$CN)+H)$^+$. The calculated elemental analysis percentages for $C_{19}H_{17}Cl_2N_6Ru$ were C, 45.61; H, 3.22; N, 16.80, while the experimentally measured numbers were C, 45.78; H, 3.34; N, 16.71. $^1$H NMR (400 MHz, CDCl$_3$) 8.59 (d, J=8Hz, 2H), 8.30 (d, J=8Hz, 4H), 8.08 (t, J=8Hz, 1H), 7.60 (t, J=7Hz, 2H), 7.52 (t, J=8Hz, 4H), 2.70 (s, 3H).

(ii) Synthesis of $[Ru\{(L^2)^{(\cdot-)}\}(L^2)]PF_6$ from $[Ru(L^2)Cl_2(CH_3CN)]$: A mixture of 100 mg (0.20 mmol) of $[Ru(L^2)Cl_2(CH_3CN)]$ and 87 mg (0.42 mmol) of $AgClO_4$ in 20 mL methanol was refluxed for 2 h. The color of the solution turned light brown and a white precipitate of AgCl appeared. The reaction mixture was then allowed to cool to room temperature and filtered through a G4 sintered-glass funnel to remove the precipitate. To the filtrate, 60 mg (0.21 mmol) of $L^2$ was added and the mixture was refluxed for 3 h. The resulting dark brown solution was subsequently concentrated to 5 mL. To the above solution, 1 mL of saturated aqueous solution of $NH_4PF_6$ was added. The mixture was then kept in a refrigerator for 1 h. The resulting precipitate was filtered and washed thoroughly with water to remove excess $NH_4PF_6$ and dried in vacuum. The crude product was then purified on a preparative silica gel TLC plate using 1:10 acetonitrile-dichloromethane mixture as the eluent; a dark brown band was collected. The collected solution was evaporated to dryness and the product, was crystallized by slow diffusion of its dichloromethane solution into hexane. Yield: 102 mg (62%).

ESI-MS (m/z): 676.40 amu $[C_{34}H_{26}N_{10}Ru]^+$ (z=1) i.e. ([RuL$^{(-)}$L]PF$_6$—PF$_6$)$^+$. The calculated elemental analysis percentages for $C_{34}H_{26}F_6N_{10}PRu$ were C, 49.76; H, 3.19; N, 17.07 while the experimentally measured numbers were C, 49.69; H, 3.16; N, 16.94. This compound is paramagnetic with $\mu_{eff}$=1.81 BM, it displayed a nearly isotropic EPR signal at g=1.965 (298K).

(iii) Synthesis of $[Ru(L^2)_2](PF_6)_2$ from $[Ru\{(L^2)^{(\cdot-)}\}(L^2)]PF_6$: To a stirring acetonitrile solution of 100 mg (0.12 mmol) of the complex $[Ru\{(L^2)^{(-)}\}(L^2)]PF_6$, excess $Br_2$ (0.25 mL in 5 mL of acetonitrile) was added drop-wise over a period of 5 min. The mixture was then allowed to stir for 30 min in a fume hood. It was then evaporated and the resultant mass was washed thoroughly with hexane. The product, thus obtained, was dissolved in 5 mL of methanol and to it a saturated aqueous solution of $NH_4PF_6$ (1 mL) was added. The mixture was then kept in a refrigerator for 1 h, during which dark crystalline precipitate deposited. The precipitate was collected by filtration and washed thoroughly with water. The product was finally crystallized by slow diffusion of its acetonitrile solution into toluene. Yield: 95 mg (83%).

ESI-MS (m/z): 338.18 amu $[C_{34}H_{26}N_{10}Ru]^{2+}$ (z=2) i.e. ([Ru(L$^2$)$_2$](PF$_6$)$_2$−2(PF$_6$))$^{2+}$. The calculated elemental analysis percentages for $C_{34}H_{26}F_{12}N_{10}P_2Ru$ were C, 42.29; H, 2.71; N, 14.51 while the experimentally measured numbers were C, 42.48; H, 2.74; N, 14.39, on an initial batch of materials. The experimentally measured numbers on a subsequent batch of materials made using the protocol above were C, 42.37; H, 2.69; N, 14.54. $^1$H NMR (CD$_3$CN, 500 MHz): 8.97 (d, J=8Hz, 1H), 8.60 (t, J=8Hz, 1H), 7.97 (d, J=8Hz, 1 H), 7.85 (d, J=8 Hz, 2H), 7.78-7.71 (m, 3H), 7.45 (t, J=8Hz, 1 H), 7.27 (t, J=8Hz, 2H), 7.13 (d, J=8 Hz, 2H).

Example 3

Electrochemical Characterization of the Compounds of Example 1 and 2

Cyclic voltammetric experiments of the two Ru complexes, mer-$[Ru(L^1)_3](PF_6)_2$ and $[Ru(L^2)_2](PF_6)_2$ (2 mM) of Examples 1 and 2, respectively were carried out in a three-electrode cell where the working electrode was glassy carbon (area=3.14 mm$^2$), the counter electrode was Pt-wire (area=220.69 mm$^2$) and the reference electrode was Ag/AgNO$_3$ (all reported potentials were referenced to the Ag/AgNO$_3$ electrode). The electrodes were all dipped acetonitrile containing 0.1 M [Et$_4$N]PF$_6$, with the counter electrode separated from the main solution by a vycor™ glass frit. The electrochemical measurements were performed using a PC-controlled PAR model 273A electrochemistry system. The CV cell assembly was set up inside a glove box that has an O$_2$ and moisture level of <1 ppm. The voltammetric data are provided in Table 1. The complexes displayed multiple waves as shown FIG. 8 and FIG. 9.

TABLE 1

| Compound | Cyclic Voltammetry $E_{1/2}$, V * |
|---|---|
| mer-[Ru(L$^1$)$_3$](PF$_6$)$_2$ | −0.35, −0.66, −1.14, −1.42, −1.78, −2.09** |
| [Ru(L$^2$)$_2$](PF$_6$)$_2$ | Optimized results: −0.40, −1.00, −1.53, −2.03** |
| | Initial results: −0.42, −1.025, −1.55, −1.76** |

* $E_{1/2} = 0.5(E_{pa} + E_{pc})$, where $E_{pa}$ and $E_{pc}$ are anodic and cathodic peak potentials, respectively, under a scan rate of 50 mV s$^{-1}$.
**Quasi-reversible

Example 4

Preparation and Analysis of Devices A and B Using the Complex of Example 1

Using General Procedure 1, devices with a planar ITO bottom electrode were manufactured having an area of from 1×1 μm (film thickness from 56-67 nm), 10×10 μm (film thickness from 54-69 nm), 20×20 μm (film thickness from 54-64 nm), 40×40 μm (film thickness from 53-64 nm), 60×60 μm (film thickness from 55-69 nm), 80×80 μm (film thickness from 56-62 nm) and 100×100 μm (film thickness from 58-67 nm) and are referred to herein as "Device A".

Using General procedure 1, devices with Au-nanoparticle sputtered ITO bottom electrodes were manufactured having sizes of 1×1 μm(film thickness from 34-42 nm), 2×2 μm (film thickness from 37-46 nm) and 3×3 μm (film thickness from 41-47 nm) and are herein referred to as "Device B".

The devices were characterised using a Keithley source meter. The characterisations were performed in probe stations and a Physical property Measurement System (PPMS, Quantum Design). For devices to be used for in situ characterisation, we used amorphous ITO as the top electrode, deposited by the Pulsed Laser Deposition (PLD) technique. A gold pad was used at the corner of ITO for making contacts on the top electrode via the standard wire bonding method.

Device A Characterisation

Device Yield Calculation

A total of 350 Device A devices underwent electrical transport measurements, of which 91.7% were successful. Details of the device yield calculation mention are provided hereinabove.

AFM Image

Figure 10:
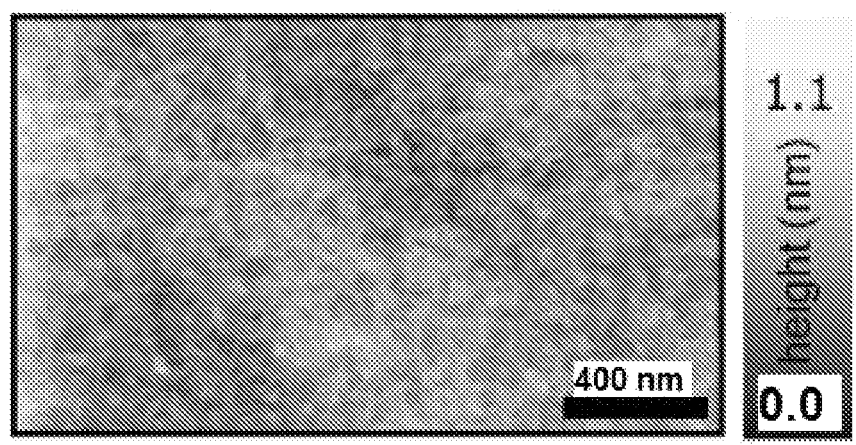
FIG. 10 Depicts the AFM image of the topography of a planar ITO bottom electrode of Device A.

An atomic force microscopy (AFM) image for Device A is shown in FIG. 10.

On-off Switching of Device A

Figure 11:
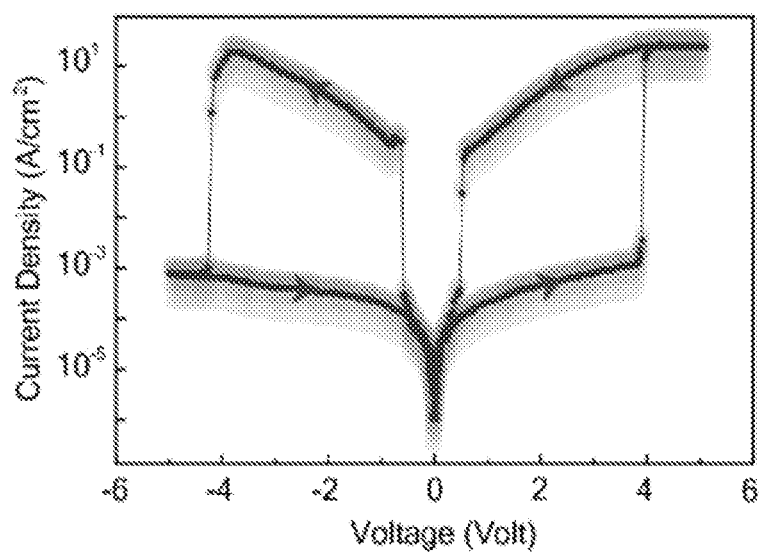
FIG. 11 Depicts the current-voltage characteristics, J(V), for 321 devices (Device A) with planar electrodes. The clouds contain the J values of all devices while the solid lines indicate the mean values of J at each point. There is a low-current plateau near 0 V, but the devices still remain in the on-state. The plateau near 0V appears to enable a selector-free operation, similar to complementary resistive switching devices.
Figure 12:
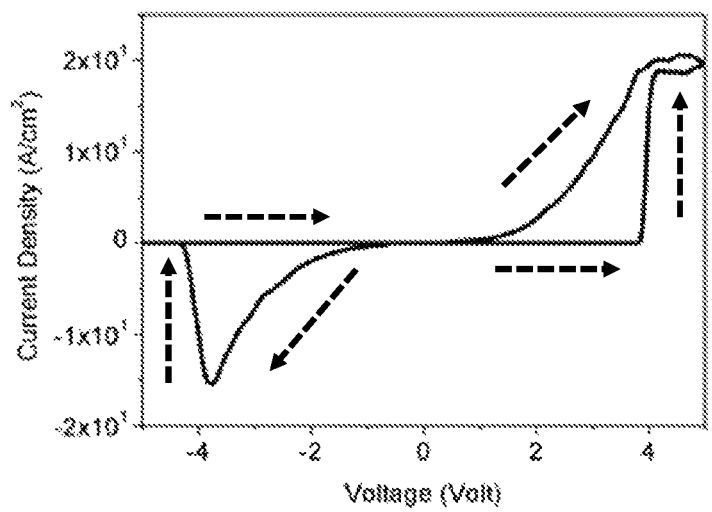
FIG. 12 Depicts the current density-voltage characteristics J(V) of [Ru($L^1$)$_3$](PF$_6$)$_2$ with a linear current scale.

FIG. 11 shows all J(V) data for the 321 devices tested (for a linear J(V) plot refer to FIG. 12). Table 2 lists the various geometries of 321 devices included in FIG. 11.

Figure 13:
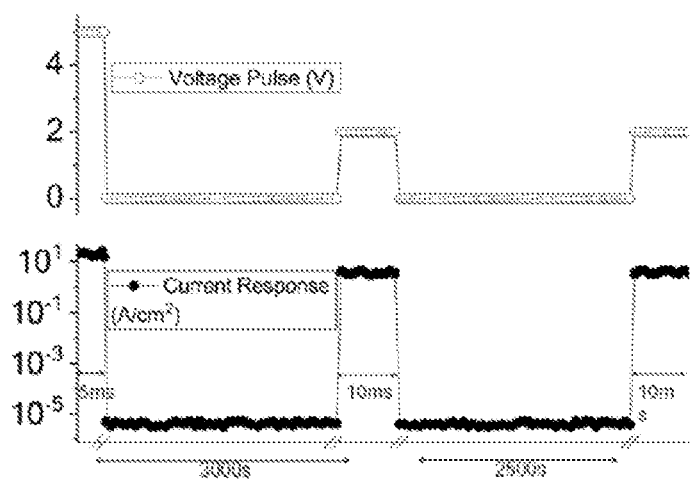
FIG. 13 Depicts the retention test and non-volatility of Device A. After turning on Device A, the voltage was withdrawn for an hour, after which the on-state was retained. This shows that the device was able to retain its on state at voltages near 0 V, despite the existence of a non-conducting plateau in this region.

As shown in FIG. 11, beginning at zero-bias, device-A starts in the off-state until reaching 3.95±0.21V where the conductance suddenly increases by four orders of magnitude. When exceeding the switching voltage, the device remains in the on-state which is, in fact, retained while reversing the voltage sweep until it is switched off at (−4.14±0.19)V. The off-state is then maintained until the maximal negative bias and during the return to 0V after which the cycle repeats. Notably this memory device operates on very low current values 1 (e.g. (6±1)×10$^{-4}$ A/cm$^2$ at +2V), which is ideal for crossbar integration. During reverse voltage sweep, near 0V, a non-conducting plateau (from about 0.7V to about −1V) is observed but notably in this regime the device is not turned off, as illustrated in FIG. 13. In addition, the plateau near 0V appears to enable a selector-free operation, similar to complementary resistive switching devices.

These devices, though robust and reproducible, suffer from high switching voltage values compared to the ITRS specifications for ReRAM devices. Additionally, the low current density values constrain their scaling to smaller dimensions. This led to the development of Device-B, discussed below.

TABLE 2

| | | | | | Device - A | | |
|---|---|---|---|---|---|---|---|
| Size [μm] | # devices | Molecular film thickness [nm] | Switch-on voltage [V] | Switch-off voltage [V] | On-state current density @ $V_{read}$ = 2 V [A/cm$^2$] | Off-state current density @ $V_{read}$ = 2 V [A/cm$^2$] | On-off ratio @ 2 V |
| 100 × 100 | 122 | 58-67 | 3.95 ± 0.21 | −4.14 ± 0.19 | 3.9 ± 1.2 | (6 ± 1) × 10$^{-4}$ | (8.8 ± 1) × 10$^4$ |
| 80 × 80 | 47 | 56-62 | | | | | |
| 60 × 60 | 38 | 55-69 | | | | | |
| 40 × 40 | 29 | 53-64 | | | | | |
| 20 × 20 | 31 | 54-64 | | | | | |
| 10 × 10 | 26 | 64-69 | | | | | |
| 1 × 1 | 28 | 56-67 | | | | | |

Device Statistics

Figure 14:
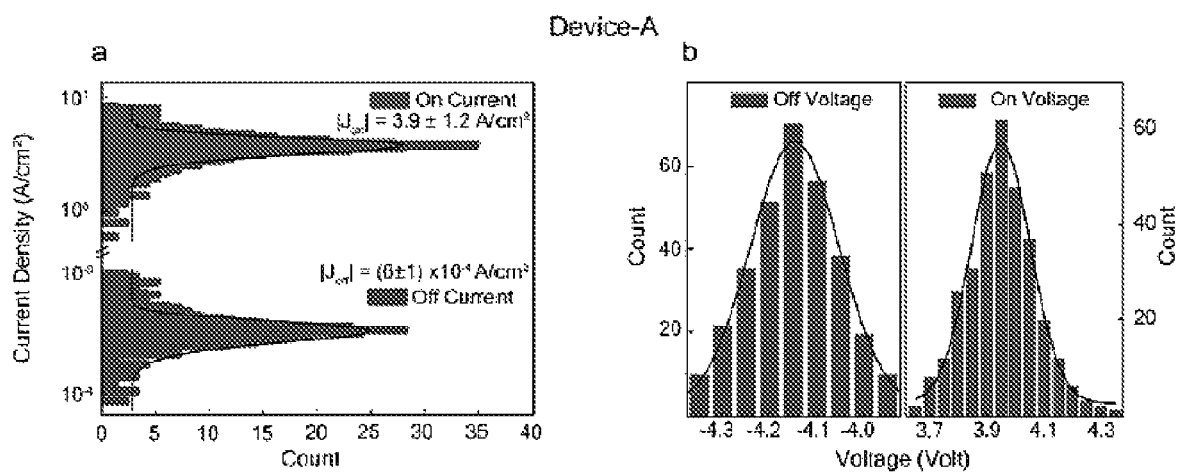
FIG. 14 Depicts the device statistics of Device A: (a) histogram of the current measured at +2 V in on and off states for 321 samples of Device A; and (b) distribution of on and off voltages of Device A. The black lines are Gaussian fits to the histograms.

With respect to device-to-device reproducibility, we analyzed the distribution of currents and switching voltages obtained by measuring 321 samples of device-A. FIG. 14a shows the statistical distribution of current densities (on and off) for device-A and FIG. 14b shows the histogram of switch-on and off voltage for the same device.

Figure 15:
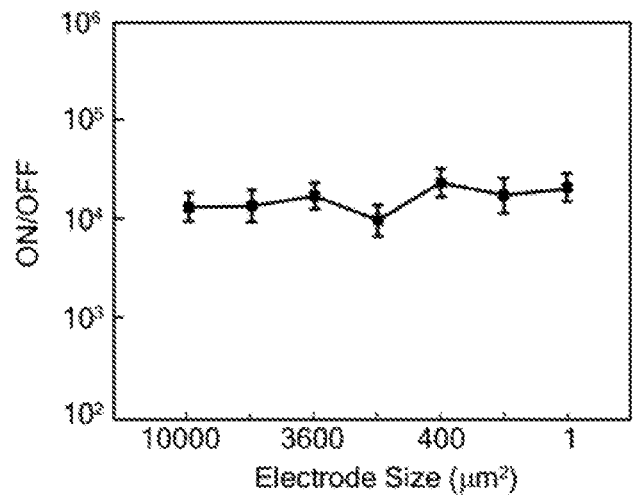
FIG. 15 Depicts the on/off ratio of Device A with different top electrode dimensions. The error bars indicate the standard deviations.

The (ΔJ(2σ)/Jmean) values for on and off states are about 31% and 16% for device-A (see FIG. 15 for on/off ratio of devices of various sizes).

Endurance, Stability and Uniformity of Device A

Figure 16:
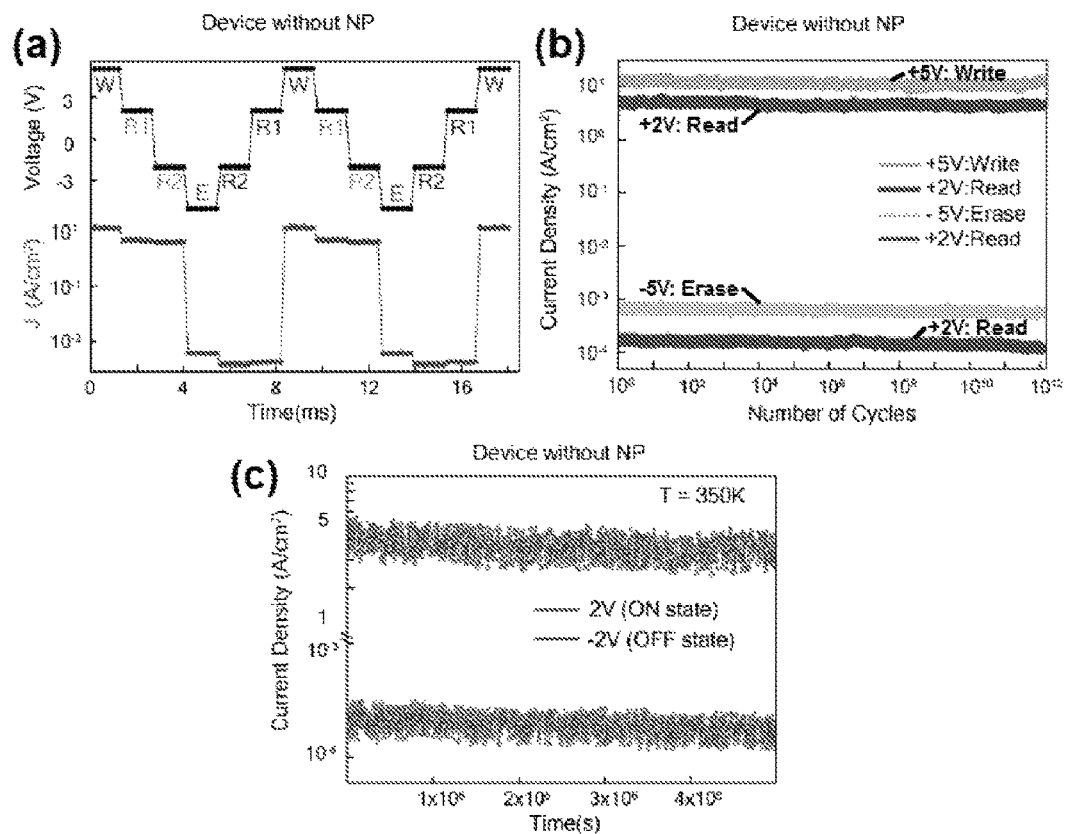
FIG. 16 Depicts the device performance of Device A: (a) read-write pulse sequence for Device A. The writing voltage for the on-state was chosen to be 10% above the switching voltage, the reset to off-state voltage to be 10% below the switching-off voltage, and the read voltage to be at 20% of the switching on (or off) voltage. $V_{write-on}$=5V, $V_{reset-off}$=−

The read-write sequences for device-A is shown in FIG. 16a.

The endurance of the device is demonstrated in FIG. 16b, which shows no visible degradation even after 10$^{12}$ write-read-erase-read pulse cycles, measured continuously over 230 days with voltage pulses of frequency 50 kHz. This endurance is exceptional compared to typical read-write cycles of $10^5$-$10^6$ in commercial flash memories and match the performance of the best endurance data reported so far in a RRAM device.

To estimate stability, two devices of type-A were placed into on and off states at time zero and current was sampled at 350K which is the typical semiconductor-device test temperature. During measurement, the read-out voltage (indicated in FIG. 16c) was sustained. Device-A was measured for 2 months without degradation. It is clear that these devices exceed by far any report on (metal) organic devices in terms of every performance parameter, rendering them competitive with metal-oxide devices.

FIG. 15 shows an on/off ratio on the order of $5 \times 10^4$ and a narrow spread in on- and off-state currents (~0.01% of on/off ratio). These values are consistent for devices ranging from $10^4$ μm$^2$ to 50 nm$^2$ (the surface area of contact in typical conducting atomic force microscopy (cAFM)) indicating very low bit error rate (BER) along with scalability. This highly consistent size-independent device performance indicates uniform electrical conductance across the film.

To confirm the uniformity of film conductance, we recorded spatial distribution maps of conductance with a c-AFM tip (see methods for tip details and FIGS. 3a and b for current distribution) with ~50 nm$^2$ areal resolution. We observed less than 2% spatial current variation within a scanned area of 525 μm$^2$ sampled over 5 different locations which rules out formation of filaments or other artefacts.

Raman and US-Vis-NIR Spectroscopy Analysis of Device A

Figure 8:
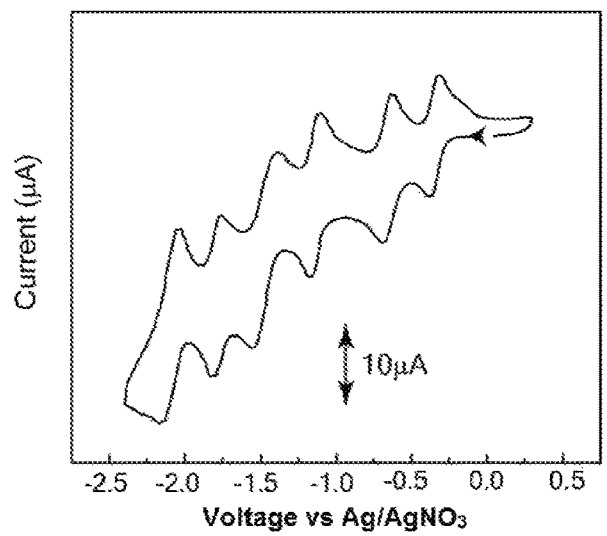
FIG. 8 Depicts the cyclic voltammetry (CV) of [Ru($L^1$)$_3$](PF$_6$)$_2$ (2 mM) with Ag/AgNO$_3$ reference electrode in anhydrous acetonitrile solvent with 0.1 M [Et$_4$N]PF$_6$. The formal potential for the six redox events were −0.35, −0.66, −1.14, −1.42, −1.78, −2.09 V vs Ag/AgNO$_3$.
Figure 9:
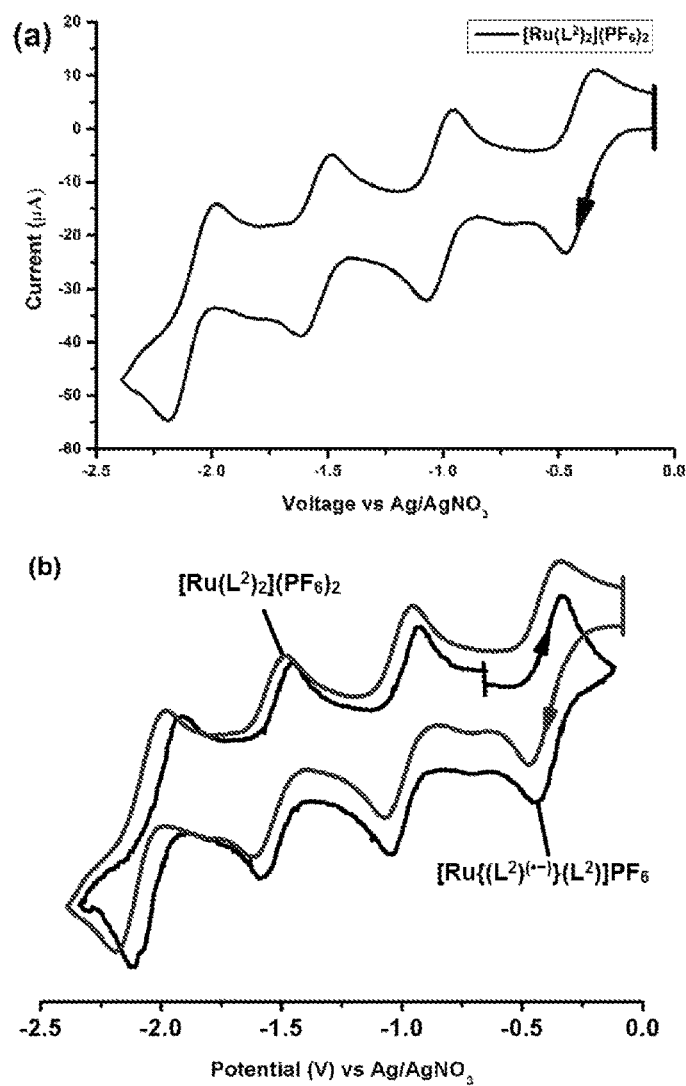
FIG. 9 Depicts (a) the cyclic voltammogram of the complex [Ru($L^2$)$_2$](PF$_6$)$_2$ in CH$_3$CN/0.1 M [Et$_4$N]PF$_6$ at a scan rate of 50 mV/s; and (b) comparison of the solution-phase cyclic voltammogram of [Ru($L^2$)$_2$](PF$_6$)$_2$ with [Ru{($L^2$)($\cdot-$)}($L^2$)]PF$_6$.

To relate these transport phenomena to the geometric and electronic structure of the molecules, in operando Raman and UV-Vis-NIR spectroscopy for the thin film devices was performed (device configuration is ITO/film/ITO, details above in the Methods section). Further, we employed spectroelectrochemistry to record UV-Vis-NIR absorption spectra while simultaneously measuring cyclic voltammograms (CVs) of the molecules in 0.1M electrolyte solution. FIG. 8 shows the CV with 6 well-resolved reduction peaks.

The UV-Vis-NIR spectroelectrochemistry of the constituent [Ru(L$^1$)$_3$]$^{2+}$ complexes in solution, during the first four redox events are shown in FIG. 17a. FIG. 17b shows UV-Vis absorption spectra measured for thin film devices at different bias voltages (indicated in the figure). Evidently, spectral transitions during reduction events in solution show a very close match to the spectra of thin film devices for specific voltage ranges. These observations imply that the applied bias voltage triggers ligand redox process within the film molecules.

This inference is further corroborated by Raman spectra of the film, measured as a function of applied voltage. FIG. 17c shows the Raman spectra of the same device measured at the same voltage values as UV-Vis spectroscopy (FIG. 17b). Notably, the applied voltage induces prominent changes in only three Raman modes at 1275 cm$^{-1}$, 1313 cm$^{-1}$, and 1363 cm$^{-1}$ (see FIG. 17c).

DFT calculations indicate that these modes correspond to the azo (N=N) stretching mode for different redox states. The Raman peak at 1363 cm$^{-1}$ (E1) corresponds to the neutral azo-group. After single electron reduction it produces an azo-anion and the corresponding Raman peak shifts to 1313 cm$^{-1}$ (E2). The peak at 1275 cm$^{-1}$ (E3) corresponds to a doubly reduced hydrazido di-anion. The spectral weight of each peak is 1 a measure of the amount of a particular ligand redox state in the molecular thin film (details in Methods). Since the total number of molecules does not change, the summation of spectral weights of the three peaks is expected to be constant to first order.

FIG. 18a shows pseudo-colour map of voltage-resolved Raman spectra for forward voltage sweep (−4.2V to +4.2V, off state) while FIG. 18c shows the same for the reverse voltage sweep (+4.2V to −4.2V, on state). The spectral weight of the 3 peaks of our interest (E1, E2 and E3) and their sum is plotted for forward and backward voltage sweep in FIG. 18b and d respectively. Evidently, the sum is constant within the uncertainty, confirming our interpretation. The Raman maps for forward and reverse bias regimes are clearly different (FIG. 18a-d), reflecting the hysteresis observed in electrical conduction measurements (FIG. 14a). We identify a clear correlation between the molecular redox states and film conductance. When the device is in the on-state, almost all molecular ligands are in the same redox state (90%±6%). The on-state at positive bias is dominated only by the E1 mode, i.e. all ligands neutral. The on-state at negative bias is dominated only by E2 indicating all ligands reduced by one electron. This observation is consistent with the trend in UV-Vis-NIR spectra during reverse voltage sweep where virtually no changes are observed between +4V to 1V and −1.2V to −3.8V. In contrast, the electrical off-state is characterized by a mixture of various redox states present in the film.

While this ligand redox state model explains the conductance jumps, it does not account for the memory effect or hysteresis and this is where the counter ions play a vital role.

DFT calculations show that different positions of counterions (PF$_6^{--}$) can significantly affect the molecular energy levels (~300meV), as well as the dipole moment (18.8 to 22.4 D). When an electric field on the order of 1 GV/m is applied across the film, the relative position of counter ions with respect to the molecule will change due to field-assisted migration. To move the counter ions back to their original position, an electric field of opposite polarity would be required. Hence, the redox state transitions might not follow a reversible path in forward and reverse voltage sweep and instead exhibit hysteresis. To verify the effect of counter ions on the current response we prepared additional devices with counter ions of various van der Waals (vdW)-volumes since migration rates decrease with increasing vdW radii30. While BPh$_4^-$ (vdW-volume=187.7 Å$^3$) devices show a much less robust on-state with 26% hysteresis area compared to the PF$_6^-$ (vdW13 volume=69±0.3 Å$^3$) devices, those with Cl$^-$ (vdW-volume=22.4 Å3) show 3% increased area (FIG. 19). Hence a complete explanation of this resistive memory phenomenon involves ligand redox state changes as well as counter ion migration.

RBS Spectra

An RBS spectrum of the [Ru(L$^1$)$_3$](PF$_6$)$_2$ film in device A is provided in FIG. 20, which confirms the elemental composition of the film.

Device B Characterisation

Device B where Au nanoparticles (NPs) are sputtered at the ITO-organic layer interface. NPs are used for interface engineering to reduce the charge injection barrier (and/or the potential drop at the interface) via several mechanisms including local electric field enhancement, provision of mid-gap states, charge trapping and domain de-pinning (e.g. ferroelectrics).

AFM Image

The atomic force microscopy (AFM) image of the type-B device is shown in FIG. 21.

On-Off Switching of Device B

FIG. 22 shows the typical current density-voltage characteristics, J(V), for device-B. We measured 50 samples for device-B. All the measured data are contained in the cloud shown in FIG. 22 and the device details are listed in Table 3.

To address the issues noted above for Device-A, we use a modified device structure (device-B) with nanoparticles (NPs) sputtered at the ITO/film interface. The presence of NPs in device-B improves the following two device characteristics substantially: the switching bias window reduces by 90% enabling switching on and off at (519±30)mV and (−547±37)mV respectively, and the current densities increase 4 orders of magnitude compared to device-A. To demonstrate scalability of device-B, we created a nano-scale test-device using a conductive-AFM (c-AFM) tip as the top electrode and a NP on ITO as bottom electrode, as described above. The contact area to the c-AFM-tip is estimated to be ~60 nm². The I(V) (and J(V)) characteristics of this device are shown in FIG. 23b where we achieve a switching voltage of 100 mV along with the on- and off-state current of (0.8±0.1)μA, and (0.6±0.1)nA, respectively (implying on and off state device resistance of 62 kΩ and 83 MΩ for a ~60 nm² device area), at reading voltage of 50 mV. This switching voltage together with the read voltage and current values exceed the ITRS-2015 specifications for current sensing which makes this device a promising candidate for high density memory applications via integration with CMOS with further scope for scaling down.

20% and 50%. All these values of current spread are much smaller compared to the current-density on/off ratio of ~$10^4$, eliminating the possibility of any overlap between the current readings in the on and off states. The variation ($\Delta V$ ($2\sigma$)/$V_{mean}$) in the switch-on and off voltage all of these devices is <10% which is much smaller compared to other device reports with much smaller sample sizes. This data demonstrates a great control over device-to-device as well as cycle-to-cycle consistency even in nano-dimensions which has been a major concern previously.

Device Performance

The read-write sequences for device-B is shown in FIG. 27a. Device-B was operated at a write-voltage as low as 650 mV and a readout-voltage of 300 mV, and the on-state current density becomes as high as $10^4$ A/cm². Based on the measured resistance (R) and capacitance (C), an RC time constant ($\tau_{RC}$)=1.37 ps was estimated for this device. FIG. 27a also shows that device-B has a switching speed of about 30 ns, which was limited by our measurement system. Notably, even with a 30 ns switching time, the estimated switching energy per bit comes down to ~1.5 fJ (for this calculation, see General methods: Energy Calculation in a c-AFM device) for a 60 nm² device area, which is comparable TaOx based RRAM devices which are in the process of commercialization.

The endurance (cycles) of device-B is demonstrated in FIG. 27b. No visible degradation was observed for this device even after about $10^{12}$ write-read-erase-read pulse cycles. This endurance is exceptional compared to typical read-write cycles of $10^5$-$10^6$ in commercial flash memories. Device-B was driven with 100 ns pulses over 2 days. These data match the performance of the best endurance data reported so far in a RRAM device.

TABLE 3

| | | | | | On-state current density @ $V_{read}$ = 0.3 V [A/cm2] | Off-state current density @ $V_{read}$ = 0.3 V [A/cm²] | |
|---|---|---|---|---|---|---|---|
| Size [μm] | # devices | Molecular film thickness [nm] | Switch-on voltage [V] | Switch-off voltage [V] | | | On-off ratio @ 2 V |
| 3 × 3 | 34 | 41-47 | 0.52 ± 0.03 | −0.55 ± 0.04 | (11 ± 4) × 10² | (1 ± 0.6) × 10⁻² | (1.2 ± 5) × 10⁵ |
| 2 × 2 | 20 | 37-46 | | | | | |
| 1 × 1 | 6 | 34-42 | | | | | |

Device Statistics

With respect to device-to-device reproducibility, we analyzed the distribution of currents and switching voltages obtained by measuring 50 samples of device-B (10 measurements per sample) and 50 measurements on 5 distinct locations with the c-AFM top electrode on the nanoparticles. FIG. 24a shows the statistical distribution of current densities (on and off) for device-B and FIG. 24b shows the histogram of switch-on and off voltage for the same device. 50 measurements on 5 distinct locations with the c-AFM top electrode on the NPs were also obtained, which is discussed here as the c-AFM device. The statistical distribution for said device is shown in FIGS. 25a and b.

The ($\Delta J(2\sigma)$/Jmean) values for on and off states are about around 46% and 50% for device B (see FIG. 26 for on/off ratio of devices of various sizes). Even when scaled down to ~60 nm² these values for the c-AFM device come out to be To estimate stability, two devices of type-B was placed into on and off states at time zero and current was sampled at 350K which is the test temperature for typical semiconductor-devices. During measurement, the read-out voltage (indicated in FIG. 27c) was sustained. Device-B was measured for 1 month without degradation. It is clear that this device exceeds by far any report on (metal) organic devices in terms of every performance parameter, rendering them competitive with metal-oxide devices.

Raman and US-Vis-NIR Spectroscopy Analysis of Device B

FIG. 28a-d shows the results of the pseudo-colour experiment for device-B. Practically identical results were obtained for Device B and so the discussion is not repeated here. Thus, the molecular changes in both devices are essentially identical, but for the voltage windows in which they occur. Therefore, the presence of the nanoparticles (NPs) does not change the operation mechanisms of the devices, but merely reduces the charge injection barriers.

Example 5

Initial Studies Involving the Preparation and Analysis of the Multistate Device Prepared Using the [Ru(L$^2$)$_2$](PF$_6$)$_2$ Complex of Example 2

In these initial studies, the multistate device was made using the same method used in Example 4, but using the complex of Example 2 instead of Example 1. Both the planar and the gold nanoparticles devices were manufactured, but only the planar devices are discussed in this example.

Based on our understanding of the crucial role of the oxidation states of the azo (N=N) functional groups with respect to the observed conductance states, we made devices of the same geometry but with complexes having four azo groups rather than three. We replaced the three bidendate ligands of [Ru(L$^1$)$_3$] with two pincer-type ligands (L$^2$=2,6-bis(phenylazo)pyridine), each with two conjugated azo groups, to obtain [Ru(L$^2$)$_2$]$^{2+}$. The number of N=N bonds increases from three for [Ru(L$^1$)$_3$]$^{2+}$ to four for ([Ru(L$^2$)$_2$]$^{2+}$ (see FIG. 29a). The rationale is that for resistive memories based on [Ru(L$^1$)$_3$]$^{2+}$, only two conductance states were accessible: with all of the ligands in the same redox state—either all reduced or neutral (conducting), otherwise, mixed (non-conducting). In contrast, for the [Ru(L$^2$)$_2$]$^{2+}$ molecule, two, three, or all four of the azo groups can be in the same electronic state. Hence one would potentially expect an increase in the number of conductance plateaus.

From the initial studies, FIG. 29b shows the J(V) for 295 measured devices (of the sizes mentioned in Table 4) confirming that there are indeed three distinct conductance states for each polarity. All three states can be written to and read from with a voltage pulse series (FIG. 29c). Voltage-resolved UV-Vis spectroscopy of the film and its correspondence to spectroelectrochemistry confirm that conductance is determined by the redox state of the ligands (see FIG. 30). The spread in these individual states is less than 0.5% of the value of the conductance jump between them for all the measured devices (see FIG. 29d), ensuring consistency and robustness while scalability is supported by surface current uniformity shown in FIG. 4.

TABLE 4

| Size [µm$^2$] | # Devices | Thickness range [nm] |
|---|---|---|
| 100 × 100 | 117 | ~60 |
| 80 × 80 | 39 | ~60 |
| 60 × 60 | 34 | ~60 |
| 40 × 40 | 29 | ~60 |
| 20 × 20 | 31 | ~60 |
| 10 × 10 | 22 | ~60 |
| 1 × 1 | 23 | ~60 |

Device Yield Calculation

A total of 350 multistate devices underwent electrical transport measurements, of which 84.2% were successful. Details of the device yield calculation mention are provided hereinabove.

Example 6

Optimized Studies Involving the Preparation, Characterizations and Performance of Devices Prepared Using the [Ru(L$^2$)$_2$](PF$_6$)$_2$ Complex of Example 2

In further optimized studies of the device of Example 5, planar and gold nanodiscs (Au NDs) [Ru(L$^2$)$_2$](PF$_6$)$_2$ devices were prepared as equivalents to Devices A and B in Example 4, respectively. The devices were made using similar methods to those described in Example 4, but using the [Ru(L$^2$)$_2$](PF$_6$)$_2$ complex of Example 2.

For the Au NDs device, gold nanodiscs were lithographically patterned on ITO, followed by spin coating of the film of ruthenium complexes. A c-AFM tip was used as a top electrode in this configuration. The ITO electrode was grounded during the measurement and the bias was applied on the tip, with the measurements performed in contact mode.

Characterization and Performance of Planar Device of [Ru(L$^2$)$_2$](PF$_6$)$_2$ Film Characterization The topography of the thin films of [Ru(L$^2$)$_2$](PF$_6$)$_2$ on the substrate of the planar devices were characterized by AFM and are shown in FIG. 31a-b. The thickness of the [Ru(L$^2$)$_2$](PF$_6$)$_2$ films is 58±4nm.

Device Characterization

FIG. 32a shows the measured current density profiles J(V) for the planar device of the [Ru(L$^2$)$_2$](PF$_6$)$_2$ complex, in comparison to that of the [Ru{(L$^2$)$^{(•-)}$}(L$^2$)]PF$_6$. In both geometries, the devices fabricated using the mono-cationic complex [Ru{(L$^2$)$^{(•-)}$}(L$^2$)]PF$_6$ have two conductance plateaus (binary memory), but devices with di-cationic complex [Ru(L$^2$)$_2$](PF$_6$)$_2$ display three plateau, exhibiting ternary memory. Therefore, the devices of [Ru(L$^2$)$_2$](PF$_6$)$_2$ can be referred to as ternary devices in this example.

In addition, the current density profile J(V) for the planar devices of [Ru(L$^2$)$_2$](PF$_6$)$_2$, in FIG. 32c, shows that the voltage scan can be stopped within the intermediate plateau, demonstrating that the intermediate state is robust, can be maintained and is readable.

Device Performance

Despite being reproducible and thermally stable (up to 500 °C. in vacuum, see FIG. 34b), the high switching voltages and low current densities in the planar devices impede their scalability as well as speed. Therefore, voltages switching and current densities were optimized using the Au NDs devices (see section "device performance" of Au NDs device).

Device Statistics

A total of 295 different planar devices of [Ru(L$^2$)$_2$](PF$_6$)$_2$ was prepared in 20 different batches of preparation (FIGS. 35a, b and Table 5). The results established a remarkable reproducibility and consistency in the device.

TABLE 5

| Size (μm × μm) | # devices | Film thickness (nm) | Switch-on voltage (V) | Switch-off voltage (V) | Current density (A/cm$^2$) $V_{read}$ = 2 V | | | | Ratio |
|---|---|---|---|---|---|---|---|---|---|
| | | | | | On | Int1* | Int2* | Off | |
| 100 × 100 | 117 | 58 ± 4 | Sw 1: 4.3 ± 0.2 | Sw 1: −3.5 ± 0.2 | (6.6 ± 0.5) × 10$^1$ | (7.8 ± 1.2) × 10$^{-2}$ | (8.8 ± 0.7) × 10$^{-3}$ | (2.9 ± 0.5) × 10$^{-6}$ | On/Int ~10$^3$ |
| 80 × 80 | 39 | | | | | | | | |
| 60 × 60 | 34 | | Sw 2: 6.2 ± 0.2 | Sw 2: −5.1 ± 0.2 | | | | | Int1/Int2 ~10 |
| 40 × 40 | 29 | | | | | | | | |
| 20 × 20 | 31 | | | | | | | | Int2/Off ~10$^3$ |
| 10 × 10 | 22 | | | | | | | | |
| 1 × 1 | 23 | | | | | | | | |

*Int-1 and -2 represent the positive and negative intermediate states respectively.

In Situ Raman and UV-Vis Spectroscopy

To correlate film conductance to molecular electronic states, in situ Raman and UV-Vis spectroscopy were carried out on planar devices of [Ru(L$^2$)$_2$](PF$_6$)$_2$. It was observed that the results and mechanisms are similar in the planar and Au NDs devices. Major changes in voltage resolved Raman spectra were observed only during switching events in the modes at 1301 cm$^{-1}$ (E$_0$), 1259 cm$^{-1}$ (E$_1$), and at 1185 cm$^{-1}$ (E$_2$) for the ternary device in the lowest conductance state. These modes (E$_0$, E$_1$ and E$_2$) were assigned to azo —N=N— stretching modes in different redox states.

The assignment of the Raman spectra to molecular redox-states is supported by comparison of voltage dependent UV-Vis and spectroelectrochemistry (FIG. 36e). Excellent correspondence between the film and solution state spectra indicates a homogeneous redox state across the film.

In the highest conductance state, only one dominant mode E$_0$ was observed (FIGS. 36b and d) indicating that all azo-groups are in the same uncharged redox-state, consistent with computed equal distribution of electron density across all four azo-groups. In the intermediate state of ternary planar device, near-equal contributions from E$_0$ and E$_1$ modes imply the existence of two charge-states of the azo-groups. This is consistent with the asymmetry observed in the computed LUMO and the two distinct azo-bond lengths (1.303 Å and 1.314 Å) in the crystal structure of the isolated singly-reduced species.

In contrast, at the lowest conductance (off) state of the ternary device, a third azo-mode E$_2$ results in co-existence of three distinct redox states of the azo moiety whereas DFT predict that only two distinct azo-redox states are possible for a single molecule in any given redox state. The off-state UV-Vis spectrum also does not overlap with spectroelectrochemistry of any single redox state and the highly unusual non-monotonic dependence of E$_0$-Raman mode on bias (FIG. 36b) cannot be explained by a simple electrostatic model.

Charge Disproportionation (CD) at the Lowest Conductance (Off) State

It was proposed that the lowest conductance (off) state is formed via charge disproportionation (CD) resulting in pairs of singly- and triply-reduced molecules instead of all being doubly-reduced. The UV-Vis spectrum of [Ru(L$^2$)$_2$](PF$_6$)$_2$ in the off-state comprises of the solution-spectra of the singly- and triply-reduced molecules in 1:1 intensity ratio (FIG. 37a).

In addition, the off-state Raman spectra of the planar device (as shown in FIGS. 36b and d) comprise of E$_0$ (25%), E$_1$ (50%) and E$_2$ (25%) modes, with peak intensities ratio which are consistent with the combination of paired Raman modes of E$_0$ and E$_1$ for singly-reduced molecules, and E$_1$ and E$_2$ modes for triply-reduced molecules.

Additionally, permittivity measurements were conducted, where the device capacitance was measured using a Keysight E4980A/AL Precision LCR Meter, with different applied DC bias voltage. For each value of DC-bias, an AC-voltage of 100 mV with frequencies ranging from 1 kHz to 1 MHz were used to measure the capacitance value of the film from which permittivity is calculated.

An abrupt doubling of dielectric constant during switch-off process in the ternary planar device was observed as shown in FIG. 37c, and its sustenance throughout the off-state provides two field-reconfigurable, distinct non-volatile values of dielectric constant, provide an unambiguous evidence of CD (A. Castro-Couceiro et al., J. Phys. Condens. Matter., 18, 3803 (2006); M. G. Masud, et al., J. Phys. D: Appl. Phys., 44, 255403 (2011); P. Sippel et al., Eur. Phys. J. B., 85, 235 (2012)). The bi-stability in the permittivity-voltage plot implies a pinched hysteresis loop in the Q(charge)-V plot. Hence, it can be inferred that this device is a 'memcapacitor', in parallel to a memristor. Realization of a memcapacitor appear to enable a lower energy storage-architecture and can also lead to the design of oscillators, relevant for designing artificial neurons.

Characterization and Performance of Au NDs device of [Ru(L$^2$)$_2$](PF$_6$)$_2$

Film Characterization

The topography of the thin films of [Ru(L$^2$)$_2$](PF$_6$)$_2$ on the substrate of the Au NDs devices were characterized by AFM and are shown in FIGS. 31c-d. The film thickness in the Au NDs devices is approximately the same (42±4 nm) as that of the planar device. In the Au NDs device, the film thickness refers to the thickness between the top of the nanodiscs to the film surface. FIG. 31e and f show the topography of the film before and after c-AFM measurements respectively, demonstrating that the measurements did not cause damage to the film. The c-AFM measurements on different diameters of the nanodiscs gave similar charge density profile as shown in FIG. 31g.

Device Characterization

FIG. 32b shows the measured current density profiles J(V) for the Au NDs device of the [Ru(L$^2$)$_2$](PF$_6$)$_2$ complex, in comparison to that of the [Ru{(L$^2$)$^{(\cdot-)}$}(L$^2$)]PF$_6$. Similar to that of the planar device, the Au NDs device fabricated using the mono-cationic complex [Ru{(L$^2$)$^{(\cdot-)}$}(L$^2$)]PF$_6$ have two conductance plateaus (binary memory), but the device with $[Ru(L^2)_2](PF_6)_2$ displays three plateaus, exhibiting ternary memory. Therefore, the devices of $[Ru(L^2)_2](PF_6)_2$ can be referred to as ternary devices in this example.

Similarly, the current density profile J(V) for the Au NDs devices of $[Ru(L^2)_2](PF_6)_2$ (in FIG. 32d) shows that the voltage scan can be stopped within the intermediate plateau, demonstrating that the intermediate state is robust and can be maintained and is readable.

Device Performance

As mentioned above, voltages switching and current densities were optimized using the Au NDs devices. Local field enhancement at the nano-structures reduced the interfacial charge injection barrier, which lowered the switching voltages down to 151 and 215 mV and increased the current density by about four orders as compared to the planar devices. This gave reading current values of 5 μA and 40 nA in the on and intermediate state respectively for the Au NDs devices (50 nm$^2$ area, FIG. 32b), which are well above the minimum industrial measurable limit of 100 pA/10 nA (see Table 7, ITRS Roadmap-2015 for RRAM).

The devices also endured 1010 pulses (four orders higher than flash memories, see Zhao, C. et al., *Materials*, 7, 5117-5145 (2014)) with 30 ns rise time (limited only by our measurement system, see FIG. 33c). Each conductance state was stable for ~23 days (see FIG. 33d), orders of magnitude longer than typical organic memory devices, with calculated switching energies ~200 aJ and ~30 fJ, four and two orders smaller than typical pJ values.

Further, pulse tests relating to the reading operations performed after 1 h, 2 h and 2 days after the writing operation showed retention of the current and voltage, therefore confirming the robustness of the conductance states (FIG. 34a).

In Situ Raman and UV-vis Spectroscopy

It was observed that the results and mechanisms for the Au NDs devices are similar to that of the planar devices (as discussed above).

Device Statistics

For the Au NDs device, multiple measurements were performed on 14 different nanodiscs in three different samples which were lithographically patterned in different batches (FIGS. 35b, c and Table 6). The results also demonstrated a high reproducibility and consistency in the device.

Example 7

Characterizations and Performance of Devices Prepared Using the $[Ru\{(L^2)^{(\cdot-)}\}(L^2)]PF_6$ Complex of Example 2

The mono-cationic complex $[Ru\{(L^2)^{(\cdot-)}\}(L^2)]PF_6$ of Example 2 was also used to fabricate the planar and gold nanodiscs (Au NDs) devices as described in Example 6.

Device Characterization (for Both Planar and Au NDs Devices)

FIG. 32a and b show the measured current density profiles J(V) for the respective planar and Au NDs devices of the $[Ru\{(L^2)^{(\cdot-)}\}(L^2)]PF_6$ complex, in comparison to that of the $[Ru(L^2)_2](PF_6)_2$. In both geometries, the devices fabricated using the mono-cationic complex $[Ru\{(L^2)^{(\cdot-)}\}(L^2)]PF_6$ have two conductance plateaus (binary memory), therefore, such devices can be referred to as binary devices in this example.

The permittivity measurements were carried out as described in Example 6 and the relative permittivity and the current density of the film in the binary device were as shown in FIG. 37b.

In Situ Raman and UV-vis Spectroscopy

In situ Raman and UV-Vis spectroscopy were also carried out on the planar devices of $[Ru\{(L^2)^{(\cdot-)}\}(L^2)]PF_6$. Spectral signatures in the on- and off-states in the binary planar device of $[Ru\{(L^2)^{(\cdot-)}\}(L^2)]PF_6$ are very similar to the on- and intermediate-states in the ternary planar device of $[Ru(L^2)_2](PF_6)_2$ (FIG. 38, in comparison with FIG. 36). Major changes in the voltage resolved Raman spectra were observed only during switching events in the modes at 1301 cm$^{-1}$ (E$_0$) and 1259 cm$^{-1}$ (E$_1$) in both devices. As described in Example 6, these modes (E$_0$ and E$_1$) were assigned to stretching of azo —N=N— groups in different redox states.

Similar to the ternary planar device of $[Ru(L^2)_2](PF_6)_2$ in Example 6, in the highest conductance state, only one dominant mode E$_0$ was observed (FIGS. 38b and d) indicating all azo-groups are in the same uncharged redox-state. In the off-state of the binary device, near-equal contributions from E$_0$ and E$_1$ modes imply existence of two charge-states of the azo-groups, consistent with asymmetry observed in the computed LUMO and two distinct azo-bond lengths (1.303 Å and 1.314 Å) in the crystal structure of the isolated singly-reduced species.

TABLE 6

| No. of measured points | Estimated Device area | Thickness (nm) | Switch-on voltage (mV) | Switch-off voltage (mV) | Current density (A/cm$^2$) V$_{read}$ = 75 mV | | | | Ratio |
| --- | --- | --- | --- | --- | --- | --- | --- | --- | --- |
| | | | | | On | Int1* | Int2* | Off | |
| 14 | 50 nm$^2$ | 42 ± 4 | 151 ± 6 | −135 ± 6 | (2.7 ± 1.2) × 10$^6$ | (3.1 ± 0.7) × 10$^3$ | (6.6 ± 0.8) × 10$^2$ | (7.1 ± 1.2) × 10$^{-1}$ | On/Int ~10$^3$ |
| | | | 215 ± 7 | −186 ± 5 | | | | | Int1/Int2 ~5 |
| | | | | | | | | | Int2/Off ~10$^3$ |

*Int-1 and -2 represent the positive and negative intermediate states respectively.

The assignment of Raman spectra to molecular redox-states is also supported by comparison of voltage dependent UV-Vis and spectroelectrochemistry (FIG. 38e). Excellent correspondence between film and solution state spectra indicates a homogeneous redox state across the film.

Example 8

Comparison of the Devices of the Current Invention With the Projected Values of the International Technology Roadmap for Semiconductors (ITRS, 2015)

The devices of the current invention were compared to the projected values by the International Technology Roadmap for Semiconductors (ITRS, 2015) for resistive random access memory (RRAM) devices. As shown in Table 7, the devices of current invention satisfy the parameters as set in the ITRS projections.

TABLE 7

| Parameter | ITRS Projection (adopted from Table ERD 4b, ITRS-2015) | Achieved Values for Device-B (i.e. the NP device) in example-2 | Achieved Values for the ternary Au NDs device of $[Ru(L^2)_2](PF_6)_2$ in Example 6 | Next best Organic Device |
|---|---|---|---|---|
| Read Current | >10 nA/100 pA (bipolar) | ~1 µA | 5 µA (on), 40 nA (intermediate), at 0.1 V | 200 fA at 400 nm$^2$ |
| W/E time | ~ns | <30 ns | ~30 ns | ms |
| Write Cycles | >10$^{10}$ | >10$^{12}$ | >10$^{10}$ | 10$^4$ |
| Write Voltage | <0.6 V | 0.15 V | 0.15 V, 0.22 V | 1.5 V |
| Read Voltage | <0.2 V | <0.05 V | <0.1 V | 0.1 V |
| Write energy | <1 pJ | 450 aJ (area 50 nm$^2$) Assuming 30 ns (switching time), 1 mA (switch-on current) | 30 aJ, 30 fJ (area 50 nm$^2$) | Not reported |

What is claimed is:

1. A compound of formula (I):

$$[M(L)_n]^{m+}(A^{y-})_z \quad (I)$$

wherein:

M represents Ru, Fe, Co, Rh, Ir, Ni, Os, Cr, Cu, Mn;

A represents an anionic group having a charge y, where y represents from 1 to 4; m represents from 1 to 4;

n represents from 2 to 6;

z represents from 1 to 4; and

L is a ligand selected from the ligand of formula (II) or one or more of the group consisting of ligands of formula (III) to (VII):

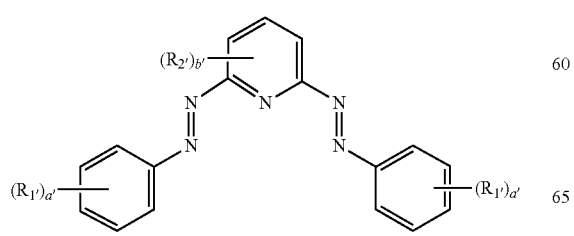
(II)

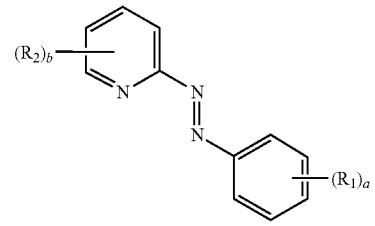
(III)

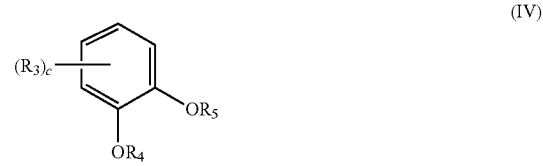
(IV)

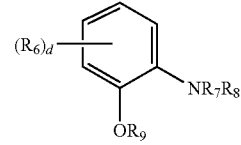
(V)

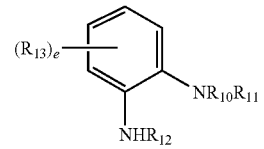
(VI)

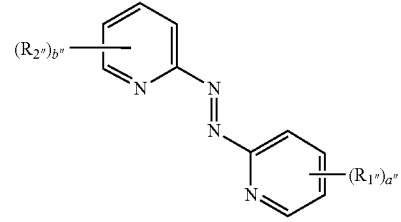
(VII)

where:
when L is the ligand (II), n is 2 and when L is a one or more of the group selected from (III) to (VII), n is 3;
a and a' each independently represent from 0 to 5;
a", b" and b to e each independently represent from 0 to 4;
b' represents from 0 to 3;

$R_1$ to $R_3$, $R_{1'}$, $R_{2'}$, $R_{1''}$, $R_{2''}$, $R_6$ and $R_{13}$ each independently represent, at each occurrence thereof, cycloalkyl, heterocycloalkyl, aryl, heteroaryl, aralkyl, $NR_{14}R_{15}$, $C(O)NR_{16}R_{17}$, $NR_{18}C(O)R_{19}$, $C(O)OR_{20}$, $OR_{21}$, $C(O)OH$, OH, halo, $NO_2$, CN, alkyl, alkenyl, alkynyl (which latter three groups are unsubstituted or substituted by one or more substituents selected from OH, SH, $C(O)OR_{22}$, or $NR_{23}R_{24}$), or, when present, any two instances of $R_1$ to $R_3$, $R_{1'}$, $R_{2'}$, $R_6$ and $R_{13}$ together with the carbon atoms to which they are attached from a 5-12 membered cycloalkyl ring system, a 5-14 membered heterocycloalkyl ring system, a 6-10 membered aryl ring or a 5-14 membered heteroaryl ring system; and $R_4$, $R_5$ and $R_7$ to $R_{12}$ each independently represent, at each occurrence thereof, H, alkyl, alkenyl, alkynyl, cycloalkyl, heterocycloalkyl, aryl, heteroaryl, aralkyl, or $C(O)NR_{25}R_{26}$;

$R_{14}$ to $R_{26}$ each independently represent alkyl, alkenyl, alkynyl, cycloalkyl, aryl, heteroaryl, or aralkyl, provided that when M is Ir, Cr or Rh, L does not represent a ligand of formula (III).

2. The compound of claim 1, wherein L is the ligand of formula (II) or the ligand of formula (III).

3. The compound of claim 2, wherein a and a' are 1, and b and b' are 0, optionally wherein $R_1$ and $R_{1'}$ are independently alkyl or halo.

4. The compound of claim 1, wherein $R_1$ to $R_3$, $R_{1'}$, $R_{2'}$, $R_{1''}$, $R_{2''}$, $R_6$ and $R_{13}$ each independently represent, at each occurrence thereof, cycloalkyl, heterocycloalkyl, aryl, heteroaryl, aralkyl, $NR_{14}R_{15}$, $C(O)NR_{16}R_{17}$, $NR_{18}C(O)R_{19}$, $C(O)OR_{20}$, $OR_{21}$, $C(O)OH$, OH, halo, $NO_2$, CN, alkyl, alkenyl, alkynyl (which latter three groups are unsubstituted or substituted by one or more substituents selected from OH, SH, $C(O)OR_{22}$, or $NR_{23}R_{24}$), or, when present, any two instances of $R_1$ to $R_3$, $R_{1'}$, $R_{2'}$, $R_6$ and $R_{13}$ together with the carbon atoms to which they are attached from a 5-7 membered cycloalkyl ring system, a 5-6 membered heterocycloalkyl ring system, a 6 membered aryl ring or a 5-6 membered heteroaryl ring system.

5. The compound of claim 4, wherein $R_1$, $R_2$, $R_{1'}$, and $R_{2'}$, each independently represent, at each occurrence thereof, alkyl, cycloalkyl, aryl, heteroaryl, $NR_{14}R_{15}$, $OR_{21}$, $C(O)OH$, OH, halo, $NO_2$, or CN, optionally wherein $R_1$, $R_2$, $R_{1'}$, and $R_{2'}$, each independently represent, at each occurrence thereof, alkyl, halo, $NO_2$, or CN (e.g. alkyl or halo).

6. The compound of claim 1, wherein:
$R_4$, $R_5$ and $R_7$ to $R_{12}$ each independently represent, at each occurrence thereof, H or alkyl; and/or
$R_{14}$ to $R_{26}$ each independently represent alkyl.

7. The compound of claim 1, wherein ($A^{y-}$) represents one or more anions selected from the group consisting of $BF_4^{-1}$, $ClO_4^-$, $PF_6^-$, $CF_3SO_3^-$, $BPh_4^-$, $Cl^-$, $Br^-$, and $F^-$.

8. The compound of claim 1, wherein L is selected from a ligand of formula (II') or formula (III'):

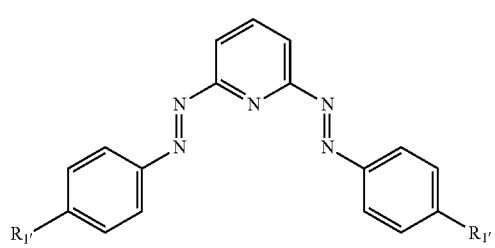

(II')

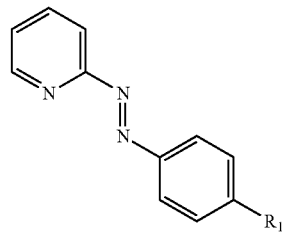

(III')

wherein $R_1$ and $R_{1'}$ are selected from H, alkyl or halo.

9. The compound of claim 1, wherein L is selected from the group consisting of:

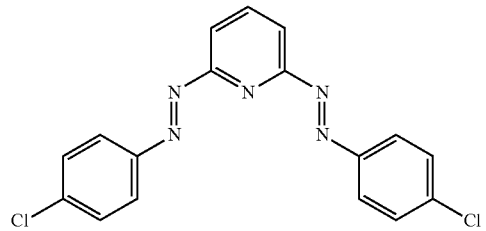

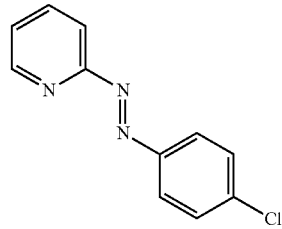

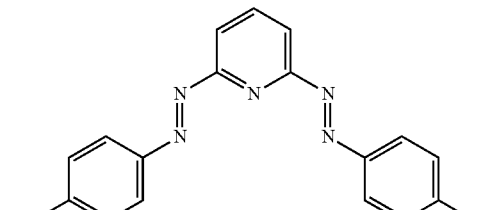

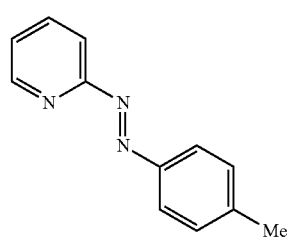

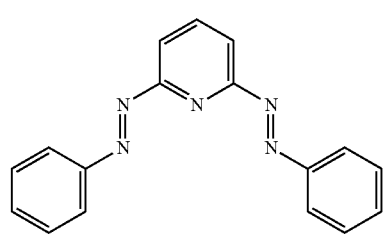

-continued

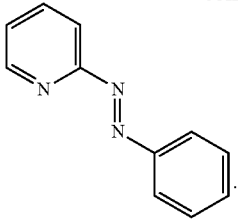

10. The compound of claim 1, wherein M represents Ru, Fe, Co, Ni, Os, optionally wherein M represents Ru; and/or $(A^{y-})$ represents $(BF_4^-)$ or $(PF_6^-)$ (e.g. $(PF_6^-)$).

11. A resistive memory device comprising:
    a substrate material having a surface; and
    a compound of formula (I) as described in claim 1 coated onto at least a portion of the surface of the substrate material in the form of a film having a first surface and a second surface.

12. The device of claim 11, wherein the substrate material is YSZ.

13. The device of claim 11, wherein the device further comprises a first and second electrode, where the first electrode is sandwiched between the surface of the substrate and the first surface of the film of the compound of formula (I), and the second electrode is in direct contact with the second surface of the film of the compound of formula (I).

14. The device of claim 13, wherein the first electrode is ITO and/or the second electrode is gold or ITO.

15. The device of claim 14, wherein gold nanoparticles are deposited onto one of the first electrode and the film of the compound of formula (I).

16. The device of claim 14, wherein gold nanoparticles are deposited onto both of the first electrode and the film of the compound of formula (I), or are deposited therebetween.

17. A method of manufacturing a resistive memory device, the method comprising:
    a step of spin coating a solution comprising a solvent and a compound of formula (I), as described in claim 1, onto a substrate material.

* * * * *